United States Patent
Matsunaga et al.

(10) Patent No.: US 7,382,649 B2
(45) Date of Patent: Jun. 3, 2008

(54) NONVOLATILE SEMICONDUCTOR MEMORY

(75) Inventors: Yasuhiko Matsunaga, Yokohama (JP); Fumitaka Arai, Yokohama (JP); Makoto Sakuma, Yokohama (JP); Tadashi Iguchi, Yokohama (JP); Hisashi Watanobe, Yokkaichi (JP); Hiroaki Tsunoda, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 17 days.

(21) Appl. No.: 11/148,336

(22) Filed: Jun. 9, 2005

(65) Prior Publication Data

US 2006/0018181 A1    Jan. 26, 2006

(30) Foreign Application Priority Data

Jun. 14, 2004   (JP) .............................. 2004-175876

(51) Int. Cl.
   *G11C 11/34* (2006.01)
(52) U.S. Cl. .............................. 365/185.05; 365/185.17
(58) Field of Classification Search .................. 365/51, 365/63, 164, 185.05, 185.17, 185.11
   See application file for complete search history.

(56) References Cited

U.S. PATENT DOCUMENTS

| | | | | |
|---|---|---|---|---|
| 4,760,554 A | * | 7/1988 | Schreck et al. | ......... 365/185.05 |
| 5,734,609 A | * | 3/1998 | Choi et al. | ............. 365/185.17 |
| 6,064,592 A | * | 5/2000 | Nakagawa et al. | .... 365/185.05 |
| 6,151,249 A | * | 11/2000 | Shirota et al. | ......... 365/185.17 |
| 6,295,227 B1 | * | 9/2001 | Sakui et al. | ............ 365/185.17 |
| 6,593,606 B1 | * | 7/2003 | Randolph et al. | ............ 257/208 |
| 6,885,052 B2 | | 4/2005 | Ahn et al. | .................. 257/296 |
| 7,177,191 B2 | * | 2/2007 | Fasoli et al. | ........... 365/185.17 |
| 2005/0167758 A1 | | 8/2005 | Ahn et al. | .................. 257/390 |
| 2006/0018181 A1 | | 1/2006 | Matsunaga et al. | |

FOREIGN PATENT DOCUMENTS

| JP | 3087712 | 7/2000 |
|---|---|---|
| JP | 2002-026293 | 1/2002 |

OTHER PUBLICATIONS

U.S. Appl. No. 11/550,636, filed Oct. 18, 2006, Arai et al.
U.S. Appl. No. 11/565,843, filed Dec. 1, 2006, Arai et al.

* cited by examiner

*Primary Examiner*—Richard T. Elms
*Assistant Examiner*—Alexander Sofocleous
(74) *Attorney, Agent, or Firm*—Oblon, Spivak, McClelland, Maier & Neustadt, P.C.

(57) ABSTRACT

A nonvolatile semiconductor memory includes memory cell units, each having memory cell transistors aligned in a column direction and capable of writing and erasing electronic data; and contacts on active areas, arranged on both sides of memory cell unit arrays in which the memory cell units are serially connected in the column direction, and the contacts on active areas are shared by the memory cell unit arrays; wherein, the respective memory cell unit arrays are located having a periodical shift length equal to and or more than the integral multiple length of the periodical length of the memory cell units aligned in the column direction so as to be staggered from each other as compared with neighboring memory cell unit arrays aligned in the row direction.

3 Claims, 40 Drawing Sheets

FIG. 34

| | SL1 | SG1-1 | WL1-1 | WL1-2 | WL1-3 | SG1-2 | BL1 | SG2-1 | WL2-1 | WL2-2 | WL2-3 | SG2-2 | BL2 | SG3-1 | WL3-1 | WL3-2 | WL3-3 | SG3-2 | SL2 |
|---|---|---|---|---|---|---|---|---|---|---|---|---|---|---|---|---|---|---|---|
| | | | | | | | | | UPPER MEMORY CELL UNITS | | | | | | | | | | |
| "1" WL1-1 | OPEN | OPEN | 0V | 0V | 0V | OPEN | OPEN | OPEN | 0V | 0V | 0V | OPEN | / | OPEN | 0V | 0V | 0V | OPEN | OPEN |

FIG. 35

| "0" | SL1 | SG1-1 | WL1-1 | WL1-2 | WL1-3 | SG1-2 | BL1 | SG2-1 | WL2-1 | WL2-2 | WL2-3 | SG2-2 | BL2 | SG3-1 | WL3-1 | WL3-2 | WL3-3 | SG3-2 | SL2 |
|---|---|---|---|---|---|---|---|---|---|---|---|---|---|---|---|---|---|---|---|
| WL1-1 | 0V | 0V | Vpgm | Vpass | Vpass | Vcc | 0V | 0V | 0V | 0V | 0V | 0V | | 0V | 0V | 0V | 0V | 0V | 0V |
| WL1-2 | 0V | 0V | Vpass | Vpgm | Vpass | Vcc | 0V | 0V | 0V | 0V | 0V | 0V | | 0V | 0V | 0V | 0V | 0V | 0V |
| WL1-3 | 0V | 0V | Vpass | Vpass | Vpgm | Vcc | 0V | 0V | 0V | 0V | 0V | 0V | | 0V | 0V | 0V | 0V | 0V | 0V |
| WL2-1 | 0V | 0V | 0V | 0V | 0V | 0V | 0V | Vcc | Vpgm | Vpass | Vpass | Vcc | | 0V | 0V | 0V | 0V | 0V | 0V |
| WL2-2 | 0V | 0V | 0V | 0V | 0V | 0V | 0V | Vcc | Vpass | Vpgm | Vpass | Vcc | | 0V | 0V | 0V | 0V | 0V | 0V |
| WL2-3 | 0V | 0V | 0V | 0V | 0V | 0V | 0V | Vcc | Vpass | Vpass | Vpgm | Vcc | | 0V | 0V | 0V | 0V | 0V | 0V |
| WL3-1 | 0V | 0V | 0V | 0V | 0V | 0V | 0V | Vcc | Vpass | Vpass | Vpass | Vcc | | Vcc | Vpgm | Vpass | Vpass | 0V | 0V |
| WL3-2 | 0V | 0V | 0V | 0V | 0V | 0V | 0V | Vcc | Vpass | Vpgm | Vpass | Vcc | | Vcc | Vpass | Vpgm | Vpass | 0V | 0V |
| WL3-3 | 0V | 0V | 0V | 0V | 0V | 0V | 0V | Vcc | Vpass | Vpass | Vpass | Vcc | | Vcc | Vpass | Vpass | Vpgm | 0V | 0V |

UPPER MEMORY CELL UNITS

FIG. 36

| "1" | SL1 | SG1-1 | WL1-1 | WL1-2 | WL1-3 | SG1-2 | BL1 | SG2-1 | WL2-1 | WL2-2 | WL2-3 | SG2-2 | BL2 | SG3-1 | WL3-1 | WL3-2 | WL3-3 | SG3-2 | SL2 |
|---|---|---|---|---|---|---|---|---|---|---|---|---|---|---|---|---|---|---|---|
| | | | | | | | | | | LOWER MEMORY CELL UNITS | | | | | | | | | |
| WL1-1 | 0V | 0V | Vpgm | Vpass | Vpass | Vcc | | 0V | 0V | 0V | 0V | 0V | 0V | 0V | 0V | 0V | 0V | 0V | 0V |
| WL1-2 | 0V | 0V | Vpass | Vpgm | Vpass | Vcc | | 0V | 0V | 0V | 0V | 0V | 0V | 0V | 0V | 0V | 0V | 0V | 0V |
| WL1-3 | 0V | 0V | Vpass | Vpass | Vpgm | Vcc | | 0V | 0V | 0V | 0V | 0V | 0V | 0V | 0V | 0V | 0V | 0V | 0V |
| WL2-1 | 0V | 0V | 0V | 0V | 0V | 0V | | Vcc | Vpgm | Vpass | Vpass | Vcc | Vcc | 0V | 0V | 0V | 0V | 0V | 0V |
| WL2-2 | 0V | 0V | 0V | 0V | 0V | 0V | | Vcc | Vpass | Vpgm | Vpass | Vcc | Vcc | 0V | 0V | 0V | 0V | 0V | 0V |
| WL2-3 | 0V | 0V | 0V | 0V | 0V | 0V | | Vcc | Vpass | Vpass | Vpgm | Vcc | Vcc | 0V | 0V | 0V | 0V | 0V | 0V |
| WL3-1 | 0V | 0V | 0V | 0V | 0V | 0V | | Vcc | Vpass | Vpass | Vpass | Vcc | Vcc | Vcc | Vpgm | Vpass | Vpass | 0V | 0V |
| WL3-2 | 0V | 0V | 0V | 0V | 0V | 0V | | Vcc | Vpass | Vpass | Vpass | Vcc | Vcc | Vcc | Vpass | Vpgm | Vpass | 0V | 0V |
| WL3-3 | 0V | 0V | 0V | 0V | 0V | 0V | | Vcc | Vpass | Vpass | Vpass | Vcc | Vcc | Vcc | Vpass | Vpass | Vpgm | 0V | 0V |

FIG. 37A "1"

| | SL1 | SG1-1 | WL1-1 | WL1-2 | WL1-3 | SG1-2 | BL1 | SG2-1 | WL2-1 | WL2-2 | WL2-3 | SG2-2 | BL2 | SG3-1 | WL3-1 | WL3-2 | WL3-3 | SG3-2 | SL2 |
|---|---|---|---|---|---|---|---|---|---|---|---|---|---|---|---|---|---|---|---|
| | 0V | Vcc | 0V | Vread | Vread | Vcc | Vbl | | | | | | | | | | | | |
| WL1-1 | | | | | | | | | | | | | | | | | | | |

UPPER MEMORY CELL UNITS

FIG. 37B "1"

| | SL1 | SG1-1 | WL1-1 | WL1-2 | WL1-3 | SG1-2 | BL1 | SG2-1 | WL2-1 | WL2-2 | WL2-3 | SG2-2 | BL2 | SG3-1 | WL3-1 | WL3-2 | WL3-3 | SG3-2 | SL2 |
|---|---|---|---|---|---|---|---|---|---|---|---|---|---|---|---|---|---|---|---|
| | 0V | 0V | 0V | 0V | 0V | 0V | Vbl | Vcc | Vread | 0V | Vread | 0V | | Vcc | Vread | Vread | 0V | Vcc | 0V |
| WL2-2 | | | | | | | | | | | | | | | | | | | |

UPPER MEMORY CELL UNITS

FIG. 37C "0"

| | SL1 | SG1-1 | WL1-1 | WL1-2 | WL1-3 | SG1-2 | BL1 | SG2-1 | WL2-1 | WL2-2 | WL2-3 | SG2-2 | BL2 | SG3-1 | WL3-1 | WL3-2 | WL3-3 | SG3-2 | SL2 |
|---|---|---|---|---|---|---|---|---|---|---|---|---|---|---|---|---|---|---|---|
| | 0V | Vcc | 0V | Vread | Vread | Vcc | Vbl | | | | | | | | | | | | |
| WL1-1 | | | | | | | | | | | | | | | | | | | |

UPPER MEMORY CELL UNITS

FIG. 37D "0"

| | SL1 | SG1-1 | WL1-1 | WL1-2 | WL1-3 | SG1-2 | BL1 | SG2-1 | WL2-1 | WL2-2 | WL2-3 | SG2-2 | BL2 | SG3-1 | WL3-1 | WL3-2 | WL3-3 | SG3-2 | SL2 |
|---|---|---|---|---|---|---|---|---|---|---|---|---|---|---|---|---|---|---|---|
| | 0V | 0V | 0V | 0V | 0V | 0V | Vbl | Vcc | Vread | 0V | Vread | 0V | | Vcc | Vread | Vread | 0V | Vcc | 0V |
| WL2-2 | | | | | | | | | | | | | | | | | | | |

UPPER MEMORY CELL UNITS

NONVOLATILE SEMICONDUCTOR MEMORY

CROSS-REFERRENCE TO RELATED APPLICATIONS AND INCORPORATION BY REFERENCE

This application is based upon and claims the benefit of priority from prior Japanese Patent Applications P2004-175876 filed on Jun. 14, 2004; the entire contents of which are incorporated by reference herein.

BACKGROUND OF THE INVENTION

1. Field of the Invention

The present invention relates to nonvolatile semiconductor memory characterized in the arrangement of contacts on active areas of the semiconductor memory.

2. Description of the Related Art

In order to implement a large capacity, low cost NAND flash EEPROM, miniaturization based on a scaling law is essential. However, since manufacturing conditions become more strict as miniaturization progresses, the current process technology for implementing miniaturized NAND flash EEPROM cannot keep up.

The structure of NAND flash EEPROM can be largely divided into cell arrays and peripheral circuits. Less strict design rules than those for memory cell transistors apply to the peripheral circuits for satisfying desired transistor performance and specifications such as current and withstand voltage. On the contrary, miniaturization is always being pursued to the limit of process technology because high transistor performance of each memory cell transistor is not in great demand, and a systematic layout is possible.

With a conventional NAND flash EEPROM, (1) active area/device isolation region pitch, (2) gate electrode pitch, (3) pitch of bit line contacts (CB) on active areas, and (4) bit line pitch may be set to a minimum pitch. Leading-edge, costly fabrication apparatuses and materials must be adopted in order to implement the above-discussed processing on a minimum pitch basis. Accordingly, the more minimum pitch locations exist, the more the cost increases, resulting in a loss of product competitiveness.

The process dealing particularly with (3), above, i.e., the pitch between bit line contacts (CB) on active areas is extremely difficult since the aspect ratio of contact holes during processing goes to a maximum. With the conventional NAND flash EEPROM, contacts on active areas are typically formed in a horizontal row along a word line length. Since the contact holes are formed to have forward-tapered shapes, the inter-contact distance at the top of the contact hole becomes extremely short when trying to achieve a half pitch at the bottom of the contact holes. These adjacent contacts may trigger short circuits between bit lines for various reasons. The first reason is described forthwith. Before embedding metallic material and/or conductive material such as polysilicon in the contact holes, it is common to perform wet (or dry) etching for the purpose of removing the natural oxidized film from the semiconductor substrate surface. Since this etching also simultaneously removes the interlayer films, which separate each contact, holes may be formed in the interlayer films due to a change in etching rate. Such operation may cause possible short circuits between bit lines. The second reason is that when a dielectric breakdown due to repeated voltage application generates an electrical leakage current as any remaining interlayer film is too thin.

If it is possible to have less stringent pitch requirements between bit line contacts (CB) on active areas, it is possible to reduce processing difficulty. As a result, for development of next-generation memory cell transistors, intensively investing financial and human resources in development of processes needed for the areas believed to not allow process margins in the (1) active area/device isolation region pitch and the (2) gate electrode pitch becomes possible. In addition, since leading edge technology processes needs not be introduced, costs may be reduced.

An example of a nonvolatile semiconductor memory has been described by referring to NAND flash EEPROM; however, the same consideration applies for a memory with another structure or operation method. For example, NOR, DINOR, AND, and AG-AND type devices, which has assist gates adjacent to the floating gates, are typical as other nonvolatile semiconductor memories (see for reference Y. Sasago, et. al, "10-MB/s Multi-Level Programming of Gb-Scale Flash Memory Enabled by New AG-AND Cell Technology", Technical Digests of International Electron Devices Meeting, 2002 IEEE, 21.6.1, p. 952-954).

With these structures, in order to connect memory transistors or select gate transistors to bit lines, there are active areas in which contacts are densely aligned. Therefore, the above problems are common to all such devices.

A conventional nonvolatile semiconductor memory, as shown in FIG. 40, includes device isolation regions 59; active areas 60; memory cell block regions 62, which include a plurality of memory cell units formed parallel in the active areas 60, as well as select gate lines SGU and SGL and word lines WL; bit line contacts 64 and source line contacts 65 arranged in the active areas 60; bit lines BL connected to the bit line contacts 64; and a source line 63 extending in a direction orthogonal to the bit lines BL and connected to the source line contacts 65. The bit lines contacts 64 in the active areas are formed in horizontal rows along the word line WL length, where with a conventional NAND flash EEPROM, the pitch thereof is equal to the pitch between the active areas 60. These adjacent contacts may trigger short circuits between bit lines for various reasons.

Technology for formation of contact holes for the bit line contacts 64 aligned in horizontal rows as shown in FIG. 40 demonstrates some improvement as lithography and etching technologies progress, however, the technology is approaching its limit. As the simplest solution, a method of staggering the positions of the bit line contacts is proposed. With this method, staggering the bit line contacts 64 allows sufficient distance therebetween. However, as is apparent from FIG. 41, there is a necessity for sufficient space between the memory cell block regions 62. However, increasing this area is a problem.

Here, given that $L_{STI}$ denotes the width of each of the device isolation regions 59, $L_{AA}$ denotes the width of each of the active areas 60, and $L_{CB}$ denotes the diameter of each of the bit line contacts 64, distance $L_1$ between the bit line contacts 64 can be represented by $$L_1 = L_{AA} + L_{STI} - L_{CB} \qquad (1)$$

As miniaturization progresses, distance $L_1$ between the bit line contacts 64 becomes shorter, and adjacent bit line contacts 64 can easily short circuit.

Accordingly with a nonvolatile semiconductor memory typified by a NAND EEPROM, there are problems where the distance between bit line contacts CB becomes narrower, and adjacent bit line contacts can easily short circuit.

SUMMARY OF THE INVENTION

An aspect of the present invention inheres in a nonvolatile semiconductor memory including: memory cell units, each having memory cell transistors aligned in a column direction and capable of writing and erasing electronic data; and contacts on active areas, arranged on both sides of memory cell unit arrays in which the memory cell units are serially connected in the column direction, and the contacts on active areas are shared by the memory cell unit arrays; wherein the respective memory cell unit arrays are located having a shift length equal to the integral multiple length of the memory cell units aligned in the column direction so as to be staggered from each other as compared with neighboring memory cell unit arrays aligned in the row direction.

Another aspect of the present invention inheres in a nonvolatile semiconductor memory including memory cell units, each having memory cell transistors aligned in a column direction and capable of writing and erasing electronic data; and contacts on active areas arranged on both sides of memory cell unit arrays in which the memory cell units are serially connected in the column direction, and the contacts on active areas are shared by the memory cell unit arrays; wherein, the contacts on the active areas of respective memory cell unit arrays are located having a shift length equal to the integral multiple length of the memory cell units aligned in the column direction so as to be staggered from each other as compared with contacts on the active areas of neighboring memory cell unit arrays aligned in the row direction.

Another aspect of the present invention inheres in a nonvolatile semiconductor memory including: a first memory cell unit and a second memory cell unit, each of which including an n number of memory cell transistors serially connected in a column direction and capable of writing and erasing electronic data, which are arranged on active areas and comprise a control gate and a floating gate, and a first select gate transistor on one end and a second select gate transistor on the other; a memory cell unit array comprising the first and the second memory cell unit serially connected in the column direction and contacts on the active areas, each of the contacts arranged on one end of the first memory cell unit; wherein, the second memory cell unit of the memory cell unit array is located and aligned in a row direction with another second memory cell unit of a neighboring memory cell unit array located in the row direction.

Another aspect of the present invention inheres in a nonvolatile semiconductor memory including: a first memory cell unit, a second memory cell unit, and a third memory cell unit, each of which including: an n number of memory cell transistors connected in a column direction and capable of writing and erasing electronic data, the memory cell units are arranged on active areas and comprise a control gate and a floating gate, and a first select gate transistor on one end and a second select gate transistor on the other; a first memory cell unit array, a second memory cell unit array, and a third memory cell unit array, each of which comprising: the first, the second, and the third memory cell unit serially connected in the column direction and contacts on the active areas, each of the contacts arranged on one end of the first memory cell unit; wherein the second memory cell unit of the first memory cell unit array is located and aligned in a row direction with the first memory cell unit of the second memory cell unit array located in the row direction, and the second memory cell unit of the second memory cell unit array is located and aligned in a row direction with the first memory cell unit of the third memory cell unit array located in the row direction.

BRIEF DESCRIPTION OF DRAWINGS

FIG. 34 shows exemplary operating voltages for an erase operation mode of the nonvolatile semiconductor memory according to the eighth embodiment of the present invention;

FIG. 35 shows exemplary operating voltages for '0' write-in operation mode of the nonvolatile semiconductor memory according to the eighth embodiment of the present invention;

FIG. 36 shows exemplary operating voltages for '1' write-in operation mode of the nonvolatile semiconductor memory according to the eighth embodiment of the present invention;

FIG. 37A shows exemplary operating voltages for '1' read-out operation mode of the nonvolatile semiconductor memory, according to the eighth embodiment of the present invention, when reading out a memory cell transistor on the left side of a bit line BL1;

FIG. 37B shows exemplary operating voltages for '1' read-out operation mode of the nonvolatile semiconductor memory, according to the eighth embodiment of the present invention, when reading out a memory cell transistor on the right side of the bit line BL1;

FIG. 37C shows exemplary operating voltages for '0' read-out operation mode of the nonvolatile semiconductor memory, according to the eighth embodiment of the present invention, when reading out a memory cell transistor on the left side of the bit line BL1;

FIG. 37D shows exemplary operating voltages for '0' read-out operation mode of the nonvolatile semiconductor memory, according to the eighth embodiment of the present invention, when reading out a memory cell transistor on the right side of the bit line BL1;

DETAILED DESCRIPTION OF THE INVENTION

Figure 1:
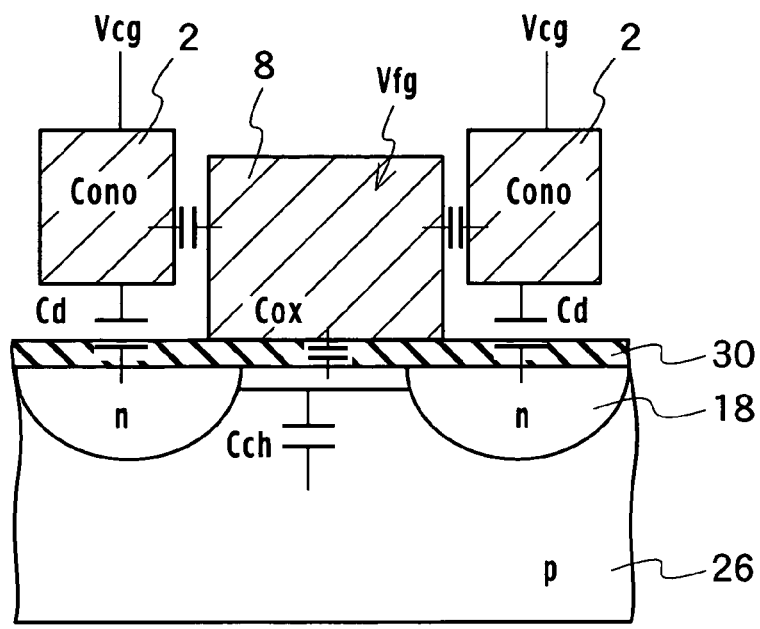
FIG. 1 is a schematic cross-sectional diagram of a basic sidewall control-type structure of a memory cell transistor applied to nonvolatile semiconductor memory according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of the circuit blocks, it will be appreciated that the various drawings are not drawn to scale from one figure to another nor inside a given figure, and in particular that the circuit diagrams are arbitrarily drawn for facilitating the reading of the drawings.

In the following descriptions, numerous specific details are set forth such as specific signal values, etc. to provide a thorough understanding of the present invention. However, it will be obvious to those skilled in the art that the present invention may be practiced without such specific details. In other instances, circuits well-known have been shown in block diagram form in order not to obscure the present invention in unnecessary detail.

Embodiments of the present invention are described forthwith while referencing the drawings. The same or similar symbols are applied to the same or similar parts throughout the appended drawings. In addition, the embodiments given forthwith illustrate devices and methods for embodying the technical idea of the present invention, and that technical idea of the present invention is not limited to the following. The technical idea of the present invention may be modified into various modifications within the scope of the appended claims.

According to the nonvolatile semiconductor memory of the present invention, space between bit line contacts CB may be provided by changing the arrangement of the bit line contacts from the conventional alignment, and tolerance of electrical short circuits between bit line contacts may be improved even when miniaturization has further increases.

Figure 9:
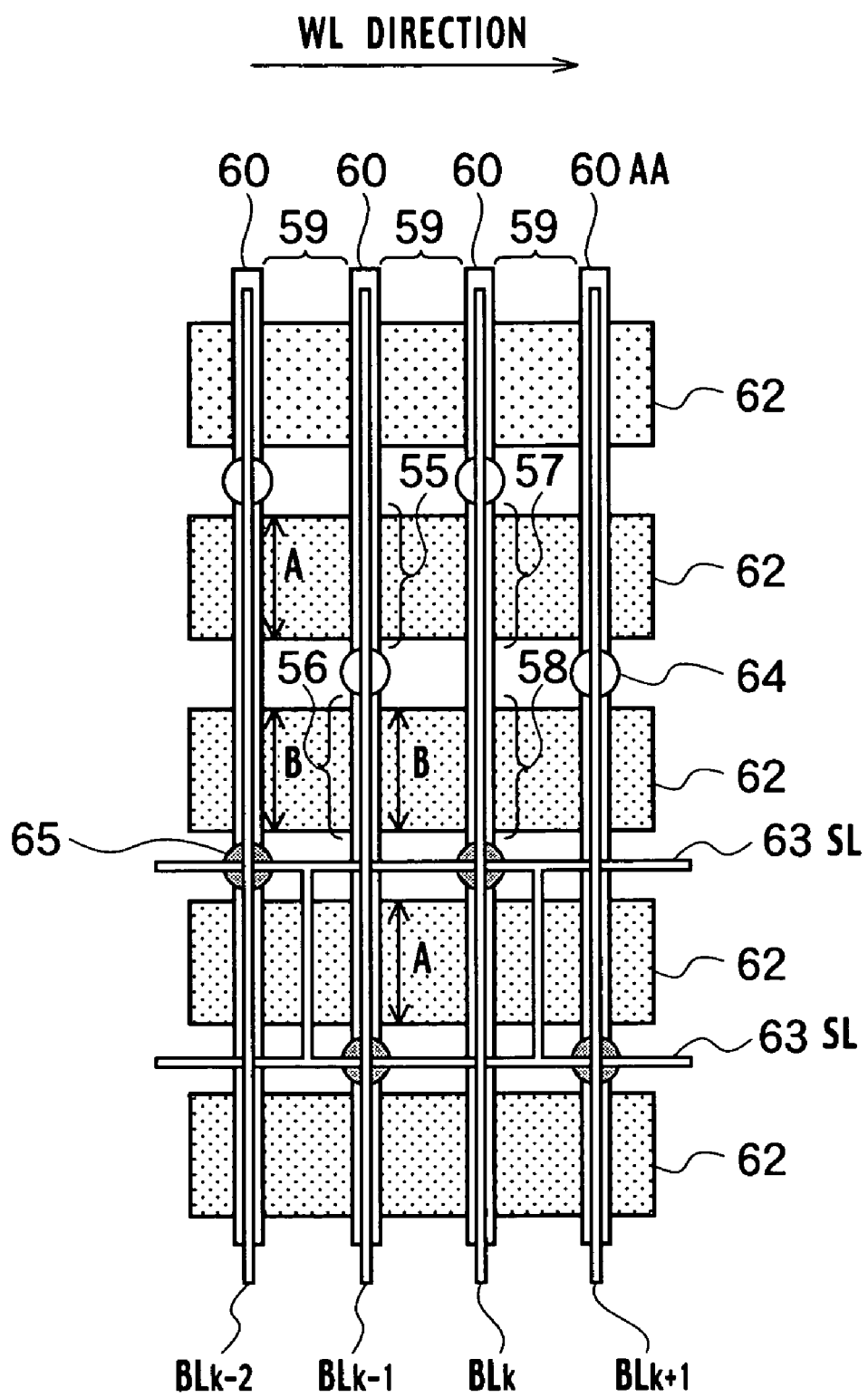
FIG. 9 is a schematic block diagram of an aerial pattern of the nonvolatile semiconductor memory according to the second embodiment of the present invention.

A typical structure of a nonvolatile semiconductor memory according to embodiments of the present invention as shown in FIG. 9, keeps the conventional arrangement of the word lines WL except that every other bit line contact CB and source line contact CS are thinned out and/or alternately arranged. Every other bit line contact column and source line contact column are also thinned out and/or alternately arranged, respectively, and the resulting thinned out bit line contact columns and source line contact columns are staggered at a single pitch of an active area 60/device isolation region 59 along the word line WL length. In other words, the bit line contacts CB and the source line contacts CS are arranged in a rhombic matrix shape. As a result, the contact pitch along the same word line WL length is twice that of the conventional structure in FIG. 40.

According to the nonvolatile semiconductor memory arranging method of the present invention, two NAND memory cell units 57 and 58, which are in series along the bit line $BL_k$ length, share the same bit line contact CB and source line contact CS.

The read-out, write-in and erasure methods basically conform to conventional methods. However, in order for the bit line contacts CB and the source line contacts CS to be shared, even when selecting and operating one of the two serially connected NAND memory cell units 57 or 58, the other memory cell unit must also be driven at the same time. As such, the nonvolatile semiconductor memory according to the embodiments of the present invention is capable of implementing a complementary driving method.

Since the contact pitch along the word line WL length may be doubled in this manner, processing difficulty as well as processing costs can be decreased.

Furthermore, contacts may be formed so that three NAND memory cell units along the bit line $BL_k$ length also share the same bit line contact CB and source line contact CS. In this case, the contact pitch along the word line WL length is three times the active area 60/device isolation region 59 pitch. The foregoing are characteristics of the nonvolatile semiconductor memory according to the embodiments of the present invention.

Embodiments of the present invention are described forthwith while referencing the drawings. The same or similar symbols are applied to the same or similar parts throughout the appended drawings. In addition, the embodiments given forthwith illustrate devices and methods for embodying the technical idea of the present invention, and that technical idea of the present invention is not limited to the following. The technical idea of the present invention may be modified into various modifications within the scope of the appended claims.

First Embodiment

The basic structure of a memory cell transistor of a nonvolatile semiconductor memory according to a first embodiment of the present invention is, as shown in FIG. 1, a sidewall control gate structure including diffusion layers 18 formed in a semiconductor substrate 26 to be a source region or a drain region, a tunneling insulator film 30 formed on the semiconductor substrate 26, a floating gate 8 formed on a channel region sandwiched between the diffusion layers 18 via the tunneling insulator film 30, a first and second control gates 2 formed adjacent to the two sidewalls of the floating gate 8 via an inter-gate insulator film 40 and facing the diffusion layers 18 that will be a source or a drain.

Figures 3A, 3B:
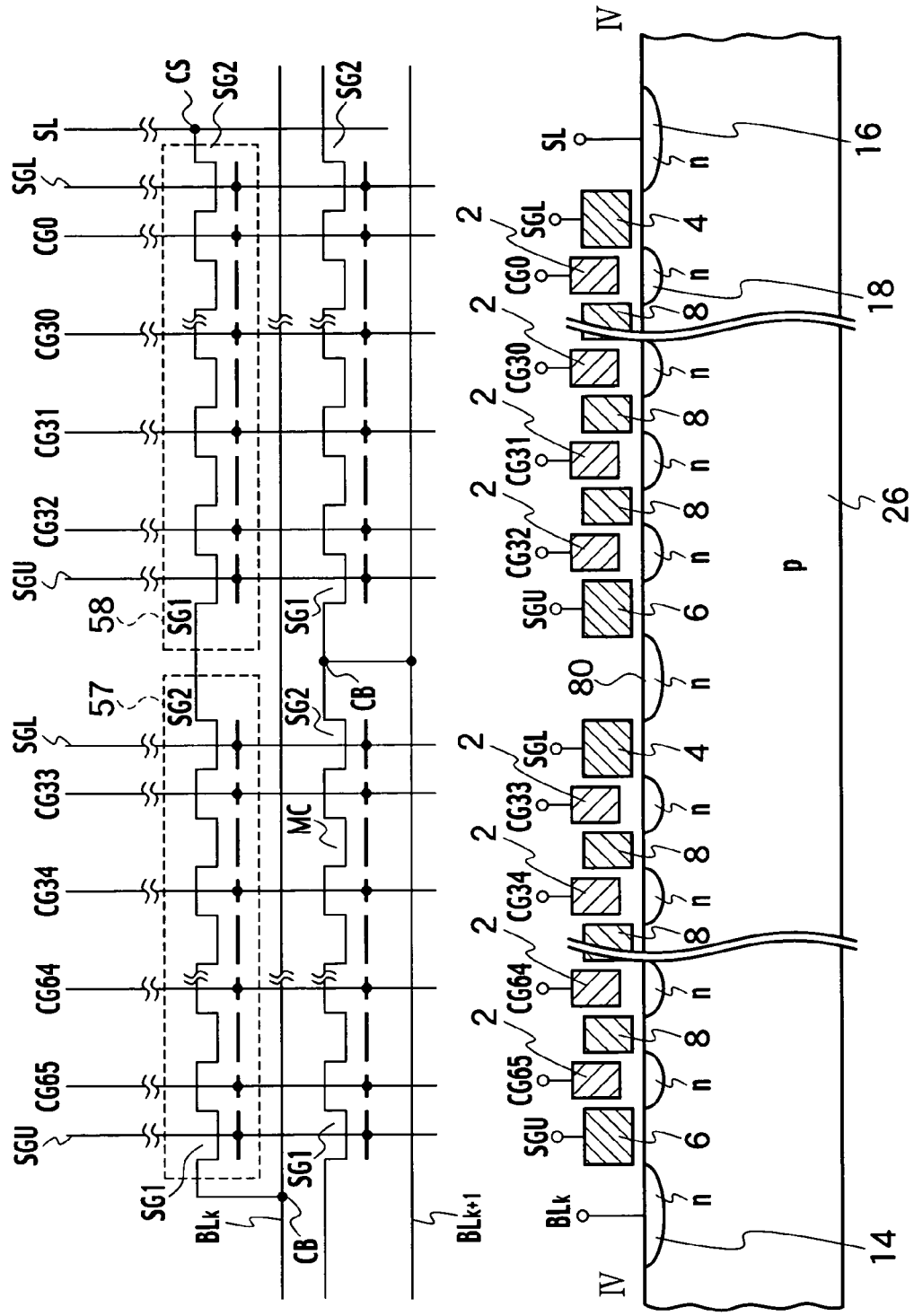
FIG. 3A is a schematic circuit diagram of the nonvolatile semiconductor memory according to the first embodiment of the present invention.
FIG. 3B is a schematic device cross-sectional diagram cut along the line IV-IV of the nonvolatile semiconductor memory according to the first embodiment of the present invention corresponding to FIG. 3A.

The nonvolatile semiconductor memory according to the embodiments of the present invention with the sidewall control gate structure as a basic structure has circuitry and a device cross-sectional structure as shown in FIGS. 3A and 3B. Memory cell transistors MC have a sidewall control gate structure where both sides of each floating gate (FG) 8 are sandwiched between control gates (CG) 2. Control gate lines CG0 through CG65 are connected to respective control gates 2, as shown in FIG. 3A. Such memory cells MC are serially connected so as to configure a NAND memory cell transistor column.

The structure of FIG. 3A includes two NAND memory cell units 57 and 58 serially connected along the bit line L length. The two NAND memory cell units 57 and 58 are serially connected between the bit line $BL_k$ and the source line SL via an inter-unit diffusion layer 80.

The NAND memory cell unit 57, which is made up of such NAND memory cell transistor column, includes a select gate transistor SG1 next to the bit line $BL_k$, and a select gate transistor SG2 next to the inter-unit diffusion layer 80. Select gate lines SGU and SGL are connected to the gates of the select gate transistors SG1 and SG2, respectively, in parallel with the control gate lines CG33 to CG65. Similarly, the NAND memory cell unit 58 includes a select gate transistor SG1 next to the inter-unit diffusion layer 80, and a select gate transistor SG2 next to the source line SL. The select gate lines SGU and SGL are connected to the gates of the select gate transistors SG1 and SG2, respectively, in parallel with the control gate lines CG0 to CG32.

Regarding the adjacent bit line $BL_{k+1}$, a bit line contact CB is arranged to make contact with the inter-unit diffusion layer 80 as shown in FIG. 3A. Two NAND memory cell units being serially connected is the same as described above. The arrangement of the bit line contacts CB may be considered as being staggered at the pitch of a single NAND cell unit.

As shown in FIG. 3B, the bit line $BL_k$ side of the NAND memory cell unit 57 is connected to a bit line contact region 14 via the select gate line SGU, which is connected to a select gate 6 of the bit line side select gate transistor SG1. The source line SL side of the NAND memory cell unit 57 is connected to the inter-unit diffusion layer 80 via the select gate line SGL, which is connected to a select gate 4 of the source line side select gate transistor SG2. Similarly, the bit line $BL_k$ side of the NAND memory cell unit 58 is connected to the inter-unit diffusion layer 80 via the select gate line SGU, which is connected to a select gate 6 of the bit line side select gate transistor SG1. The source line SL side of the NAND memory cell unit 58 is connected to a source line contact region 16 via the select gate line SGL, which is connected to a select gate 4 of the source line side select gate transistor SG2.

Further, a configuration including such source side select gate transistor SG1 and the bit line side select gate transistor SG2 as well as the memory cell transistor column is referred to as a 'memory cell unit'. The structure of each memory cell unit 57 and 58 in FIG. 3A can be referred to as a 'NAND memory cell unit' since each memory cell transistor column has serially connected NAND memory cell transistors. Accordingly, the circuitry of FIG. 3A includes two serially connected NAND memory cell units.

Figure 4A:
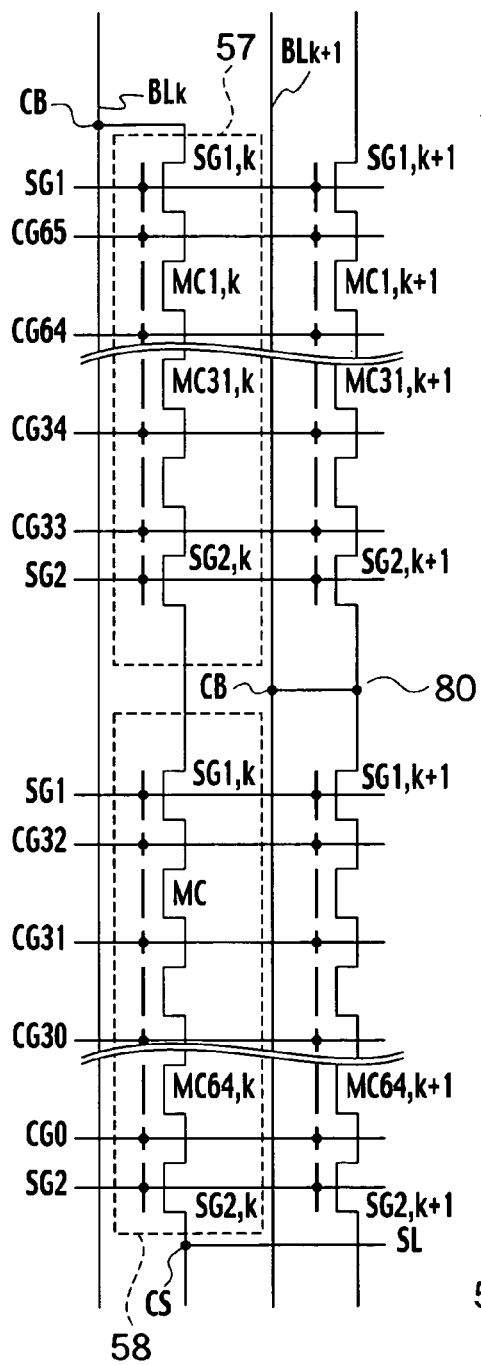
FIG. 4A is a schematic circuit diagram of the nonvolatile semiconductor memory according to the first embodiment of the present invention.
Figure 4B:
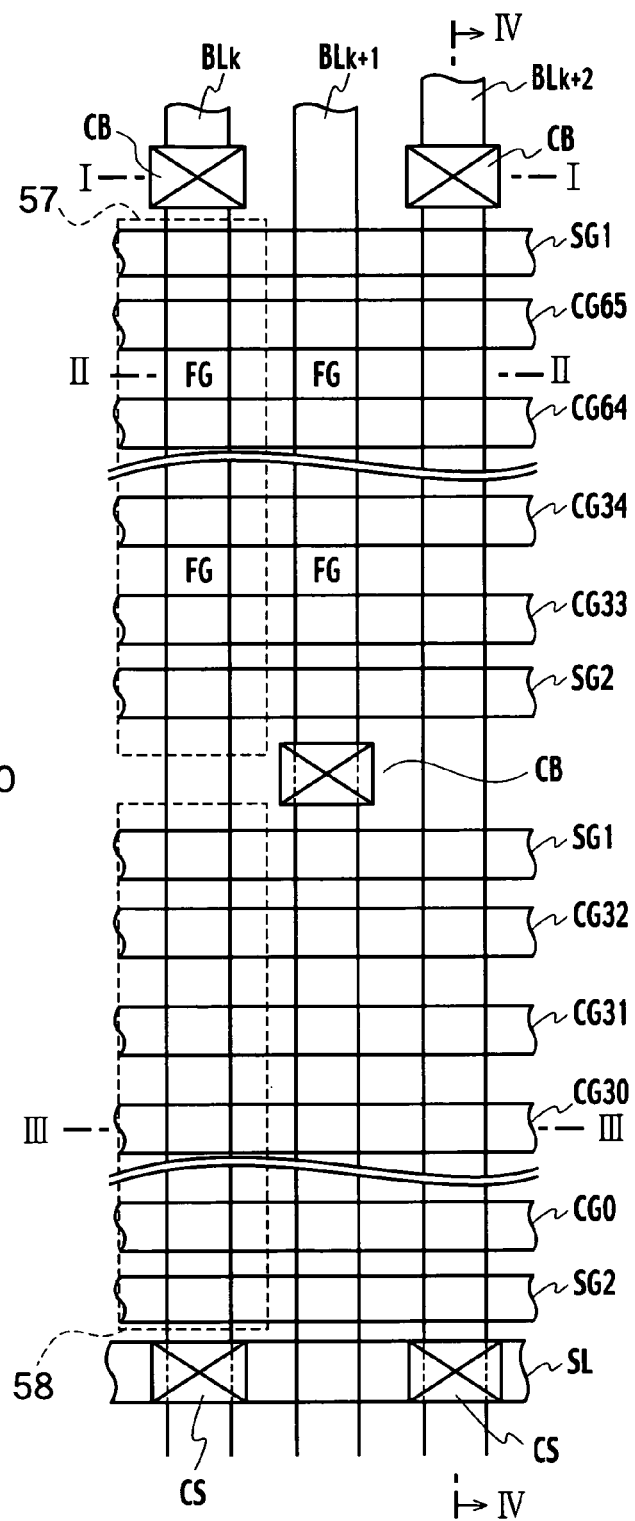
FIG. 4B is a schematic device aerial pattern diagram of the nonvolatile semiconductor memory according to the first embodiment of the present invention corresponding to FIG. 4A.

The structure in FIG. 3B corresponds to a schematic cross-sectional configuration of a single NAND memory cell unit in the circuitry of FIG. 3A, as well as a schematic cross-sectional configuration cut along the line IV-IV in the top plan view of a layout pattern of FIG. 4B hereafter described. N-type diffusion layers 18 formed in a p-well or silicon semiconductor substrate 26 are the source and the drain region of a memory cell transistor, and the floating gates 8 are formed and arranged on respective channel regions via the tunneling insulator film 30, each of the channel regions being sandwiched between corresponding source and drain regions 18.

With the above description, an example of a NAND memory cell unit column with a single bit line side select gate line SGU and a single source side select gate line SGL is provided. However, the present invention is not limited thereto. The number of bit line side select gate lines SGU may be two or more. The source side select gate line SGL is also not limited to one, but may be two or more.

Figure 5A:
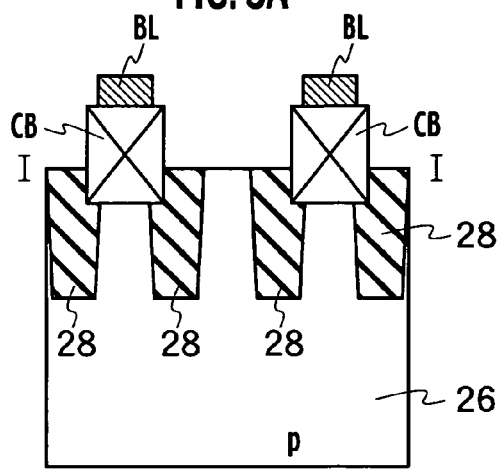
FIG. 5A is a schematic device cross-sectional diagram of the nonvolatile semiconductor memory according to the first embodiment of the present invention cut along the line I-I in FIG. 4B.
Figure 5B:
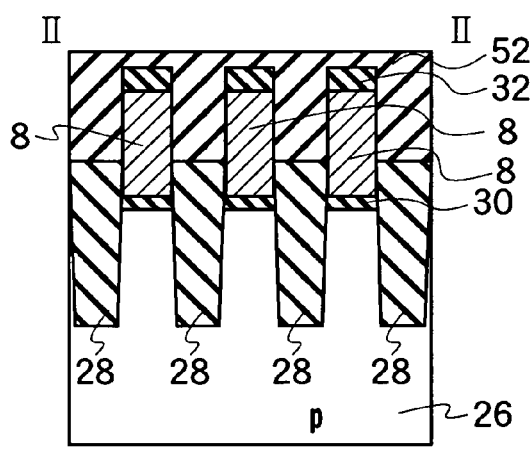
FIG. 5B is a schematic device cross-sectional diagram of the nonvolatile semiconductor memory according to the first embodiment of the present invention cut along the line II-II in FIG. 4B.
Figure 5C:
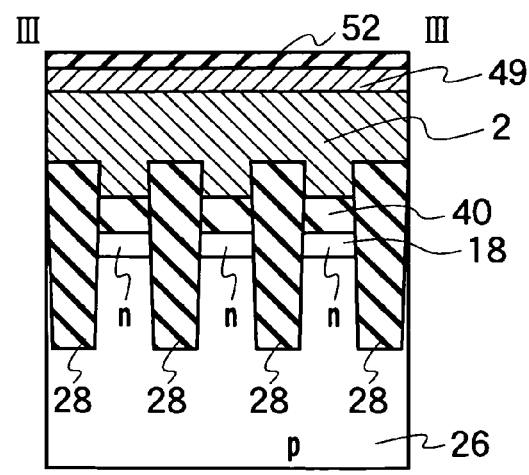
FIG. 5C is a schematic device cross-sectional diagram of the nonvolatile semiconductor memory according to the first embodiment of the present invention cut along the line III-III in FIG. 4B.

FIGS. 4A and 4B are a schematic circuit diagram and a top plan view of a schematic layout pattern of the nonvolatile semiconductor memory according to the embodiments of the present invention. FIGS. 4A and 4B are depicted as corresponding to each other in which only a single bit line $BL_k$ is disposed for two NAND memory cell units since a single bit line contact CB is shared by two serially connected NAND memory cell units 57 and 58. The device cross-sectional structures cut along the lines I-I, II-II and III-III of FIG. 4B are as shown in FIGS. 5A, 5B, and 5C, respectively. Furthermore, the device cross-sectional structure cut along the line IV-IV is as schematically shown in FIG. 3B. As is apparent from FIGS. 5A and 5B, every other bit line contact CB is thinned out and/or alternately arranged for each bit line BL, thereby having a rhombic matrix shaped planar arrangement. Similarly, as is apparent from FIGS. 5A and 5B, since the source line contacts CS are arranged to be paired with the bit line contacts CB for two serially connected NAND memory cell units, the bit line contacts CB also have a rhombic matrix shaped planar arrangement.

Adopting a circuit format in which a single bit line is shared by two serially connected NAND memory cell units 57 and 58, and arranging the bit line contacts CB to be staggered at a pitch of a single contact reduces the number of bit line contacts CB, and as shown in FIG. 5A, provides sufficient spaces and process margins in order not to be short-circuited between bitline contacts CB. Particularly in a minute nonvolatile semiconductor memory, distances between contact holes are very small due to the arrangement of the bit line contacts CB. Adopting the circuitry of the nonvolatile semiconductor memory according to the first embodiment of the present invention, in which a single bit line is shared by two serially connected NAND memory cell units and staggering every other bit line contact CB, resolves the problem of leakage between bit line contacts CB, and improves yield.

The cross-sectional structure cut along the line II-II of FIG. 4B is a cross-sectional structure of part of floating gates (FG) 8, as is apparent from FIG. 5B. The floating gates (FG) 8 are arranged on the tunneling insulator film 30. Channel regions exist within the p-well 26; however, the channel regions are formed sandwiched between device isolation regions 28. A cap insulator film 32 is formed on the floating gates (FG) 8, and an interlayer insulator film 52 covers the entire surface of the device.

The cross-sectional structure cut along the line III-III of FIG. 4B is a cross-sectional structure of part of control gate lines CG 30, as is apparent from FIG. 5C. The control gates 2 are arranged on inter-gate insulator films 40. The n-type diffusion layers 18 are the source regions or the drain regions of the memory cell transistors; however, each of the source regions or the drain regions of the memory cell transistors is formed sandwiched between corresponding device isolation regions 28. A metallic silicide film 49 is formed on the control gates 2, and the interlayer insulating film 52 covers the entire surface of the device. Note that the inter-gate insulating films 40 formed on the sidewalls of the floating gates 8 in FIG. 5B are omitted for simplification of description. Furthermore, the source line contacts CS shown in FIG. 4B are electrically connected in common to the source line SL.

Figure 6:
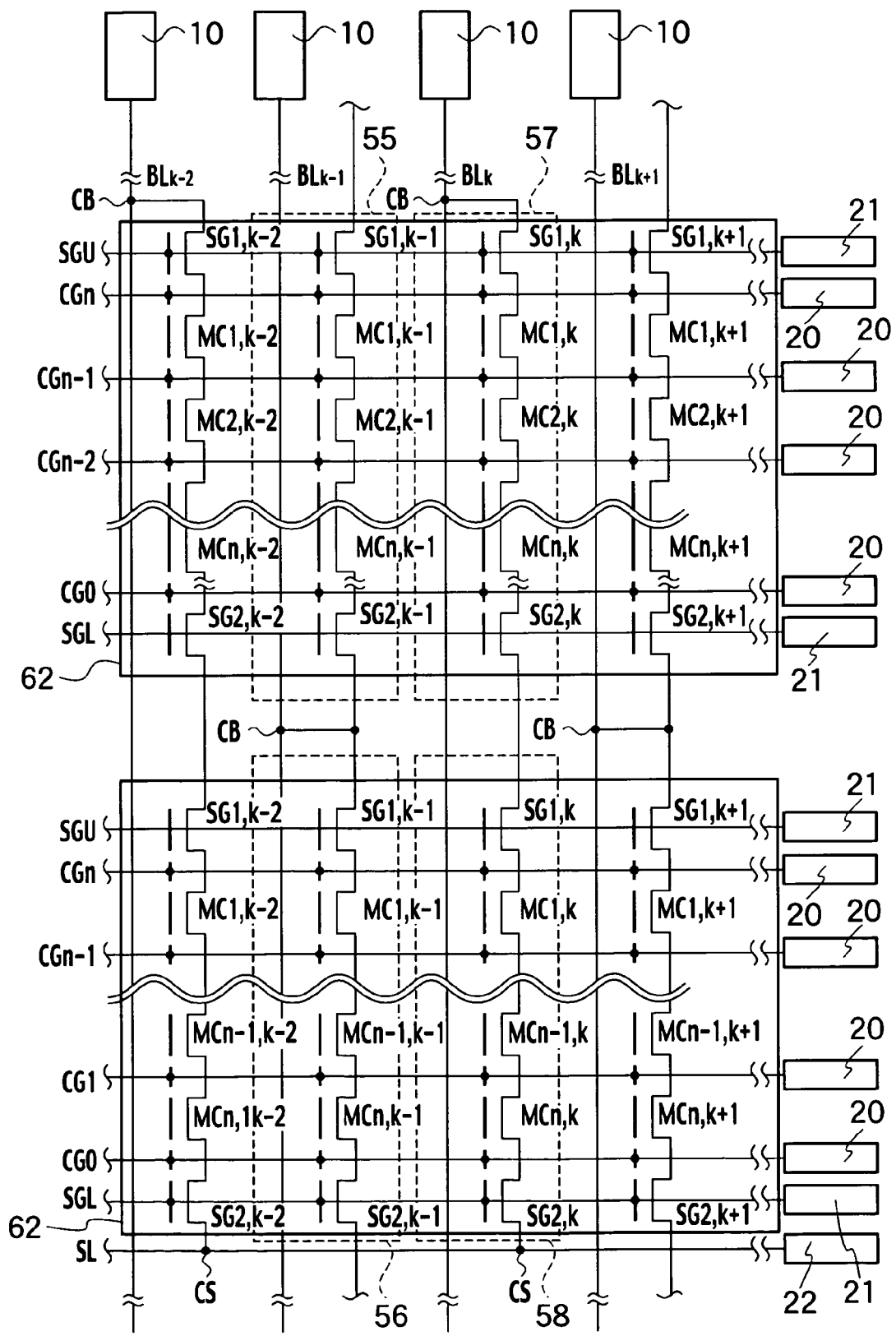
FIG. 6 is a schematic matrix circuit diagram of the nonvolatile semiconductor memory according to the first embodiment of the present invention in the case of memory cell transistors having a sidewall control gate basic structure.

A matrix circuitry of the nonvolatile semiconductor memory according to the first embodiment of the present invention in the case where the basic structure of the memory cell transistor is a sidewall control gate structure as shown in FIG. 6, is configured with a memory cell block region 62 in which NAND memory cell units 55 and 57 or 56 and 58 are arranged in parallel, a plurality of NAND memory cell units 55 and 56 or 57 and 58 arranged in a row direction, control gate lines CG0 to CGn, select gate lines SGU and SGL, bit lines $BL_{k-2}$, $BL_{k-1}$, $BL_k$, and $BL_{k+1}$, a source line SL, bit line drive circuits 10, control gate line drive circuits 20, select gate line drive circuits 21, and a source line drive circuit 22. Each of the NAND memory cell units in the example of FIG. 6 includes an arbitrary number of serially connected memory cell transistors, a single bit line side select gate transistor SG1 that includes the select gate line SGU located adjacent to the control gate line CGn, and a single source line side select gate transistor SG2 that includes the select gate line SGL adjacent to the control gate line CG0, and is connected to the bit line BL and the source line SL via the above select gate transistors.

A characteristic of FIG. 6 is the arrangement of the bit line contacts CB. The two serially connected NAND memory cell units 57 and 58 include a bit line contact CB connected to the bit line $BL_k$ and a source line contact CS connected to the source line SL. The same inter-unit diffusion layer 80 as in FIG. 3B, as well as a bit line contact CB connected to the bit line $BL_{k-1}$. are disposed between the NAND memory cell units 55 and 56

An n number of memory cell transistors MC1.k through MCn.k are serially connected. A bit line side select gate transistor SG1.k is connected to the end of a memory cell unit on the bit line $BL_k$ side, and a source line side select gate transistor SG2.k is connected on the source line side, so as to configure a single NAND memory cell unit 57. Similarly, an n number of memory cell transistors MC1.k through MCn.k are serially connected. A bit line side select gate transistor SG1.k is connected to the end of a memory cell unit on the bit line $BL_k$ side, and a source line side select gate transistor SG2.k is connected on the source line side, so as to configure a single NAND memory cell unit 58. The NAND memory cell units 57 and 58 are serially connected. The drain region of the bit line side select gate transistor SG1.k of the NAND memory cell unit 57 is connected to the bit line $BL_k$ via the bit line contact CB. The source region of the source line side select gate transistor SG2.k of the NAND memory cell unit 58 is connected to the source line SL via the source line contact CS.

An n number of memory cell transistors MC1.k−1 through MCn.k−1 are serially connected. A bit line side select gate transistor SG1.k−1 is connected to the end of a memory cell unit on the bit line $BL_{k-1}$ side, and a source line side select gate transistor SG2.k−1 is connected thereto on the source line side, so as to configure a single NAND memory cell unit 55. Similarly, an n number of memory cell transistors MC1.k−1 through MCn.k−1 are serially connected. A bit line side select gate transistor SG1.k−1 is connected to the end of a memory cell unit on the bit line $BL_{k-1}$ side, and a source line side select gate transistor SG2.k−1 is connected thereto on the source line side, so as to configure a single NAND memory cell unit 56. The NAND memory cell units 55 and 56 are serially connected. A bit line contact CB for connection to the bit line $BL_{k-1}$ is arranged at the junction of the serially connected NAND memory cell units 55 and 56. In other words, the drain region of the source line side select gate transistor SG2.k−1 of the NAND memory cell unit 55 is connected to the bit line $BL_{k-1}$ via the bit line contact CB. Furthermore, the drain region of the bit line side select gate transistor SG1.k−1 of the NAND memory cell unit 56 is connected to the bit line $BL_{k-1}$ via the bit line contact CB. A similar configuration is implemented for every other bit line BL, and as is apparent from FIG. 6, every other bit line contact CB is also disposed. Similarly, every other source line contact CS is also disposed. In the memory cell block region 62, as shown in FIG. 6, a plurality of NAND memory cell units are arranged in parallel along the length of the control gate lines CG.

The gates of the source line select gate transistors SG2.k−2, SG2.k−1, SG2.k, SG2.k+1 are connected to a select gate line SGL, and the gates of the bit line select gate transistors SG1.k−2, SG1.k−1, SG1.k, SG1.k+1 are connected in common to a select gate line SGU. A NAND memory cell unit is selected by the select gate lines SGU and SGL. A control gate 2 is arranged on the sidewalls of respective floating gates 8 of an n number of memory cell transistors MC1.k−2 through MCn.k−2, n number of memory cell transistors MC1.k−1 through MCn.k−1, n number of memory cell transistors MC1.k through MCn.k, and n number of memory cell transistors MC1.k+1 through MCn.k+1. Each of control gate lines CGn, CGn−1, . . . , CGn-k+1, CGn-k, CGn-k−1, . . . , CG1 and CG0 is connected in common to corresponding control gates 2. Furthermore, a bit line drive circuit 10 is connected to each of the bit lines $BL_{k-2}$, $BL_{k-1}$, $BL_k$, and $BL_{k+1}$, a control gate line drive circuit 20 is connected to each of the control gate lines CGn, CGn−1, . . . , CGn-k+1, CGn-k, CGn-k−1, . . . , CG1 and CG0, a select gate line drive circuit 21 is connected to each of the select gate lines SGU and SGL, and the source line drive circuit 22 is connected to the source line SL. FIG. 6 shows eight NAND memory cell units; however, a plurality of memory cell units may be further aligned along the bit line length and the control gate line length.

A structure with two NAND memory cell units serially connected is given as the basic unit, and this basic unit is arranged and alternately shifted in the column (bit line) direction at a distance of one length of a single NAND memory cell unit. The distance of the basic unit alternately shifted in the column (bit line) direction is an equivalent value of one length of a single NAND memory cell unit. As a result, the bit line contacts CB and the source line contacts CS are alternatively arranged along the control gate line CG length, and the contacts CB and CS are arranged in a rhombic matrix shape when viewed as a top plan view pattern.

The source line select gate transistors arranged at the ends of respective memory cell units and connected to the select gate line SGL in the above description are represented as SG2.k−2, SG2.k−1, SG2.k, SG2.k+1, or are described as being distinguished from the bit line select gate transistors connected to the select gate line SGU represented as SG1.$k$–2, SG1.$k$–1, SG1.$k$, SG1.$k$+1. However, structurally, the source line select gate transistors and the bit line select gate transistors are configured from transistors with the same structure. Moreover, the expressions 'bit line side' or 'source line side' refer to opposition relationships between adjacent memory cell units. In other words, using the example of FIG. 6, the drain regions of the source line side select gate transistors SG2.$k$–1 and SG2.$k$+1 are connected to the bit line contacts CB, respectively, and not connected to the source line contacts CS. This is because the two serially connected memory cell units have a replicated structure along the bit line BL length centered around the bit line contact CB.

(System Block Structure)

Figure 8:
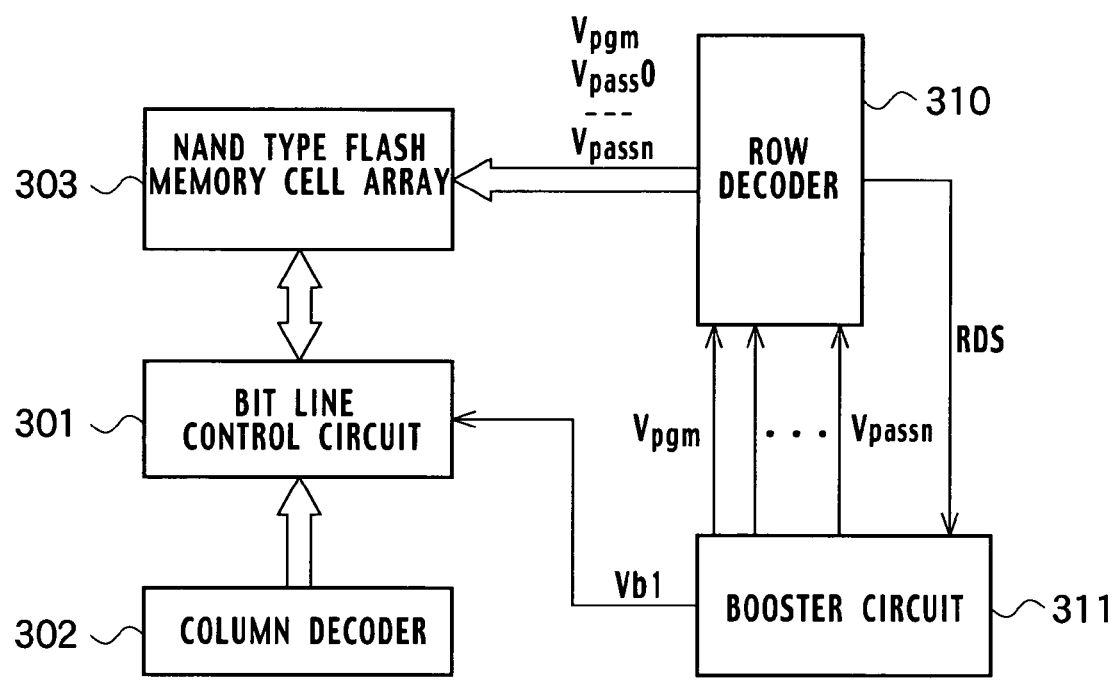
FIG. 8 is a schematic block diagram of the nonvolatile semiconductor memory according to the first embodiment of the present invention.

The system block structure of the nonvolatile semiconductor memory according to the first embodiment of the present invention as shown in FIG. 8, is configured with a NAND flash memory cell array 303, a bit line control circuit 301, a row decoder 310, a column decoder 302, and a booster circuit 311. The nonvolatile semiconductor memory described in FIG. 6 may be applied to the NAND flash memory cell array 303 having either the memory cell array structure shown either in FIG. 1 or FIG. 2 as a basic structural unit. The bit line control circuit 301 and the row decoder 310 are connected to the NAND flash memory cell array 303. The bit line control circuit 301 latches write-in data and then performs a sensing operation or related operations during read-out. The column decoder 302, which decodes a column address signal so as to select a NAND memory cell unit column, is connected to this bit line control circuit 301. The booster circuit 311 generates a write-in voltage $V_{pgm}$, a plurality of intermediate voltages $V_{pass0}$ to $V_{passn}$, and a bit line voltage $V_{bl}$ and the like from a power supply voltage. The row decoder 310 supplies a control signal RDS to the booster circuit 311, and receives the write-in voltage $V_{pgm}$ and the intermediate voltages $V_{pass0}$ to $V_{passn}$. Note that a plurality of intermediate voltages $V_{pass0}$ to $V_{passn}$ are used for the write-in, read-out and erase operations for the nonvolatile semiconductor memory according to the first embodiment of the present invention, and are mainly applied to the control gate lines CG0 to CGn or the word lines WL1 to WLn, respectively. This row decoder 310 decodes a row address signal, and based on the voltage supplied from the booster circuit 311, outputs the resulting decoded signals, such as the write-in voltage $V_{pgm}$, which is used to select a memory cell transistor in the NAND flash memory cell array 303, the intermediate voltages $V_{pass0}$ to $V_{passn}$, voltage $V_{sgs}$ to be applied to the select gate line SGL, the voltage $V_{sgd}$ to be applied to the select gate line SGU, and the voltage $V_{sl}$ to be applied to the source line SL. Accordingly, control gate lines CG0 to CGn or word lines WL1 to WLn and select gate lines SGL and SGU in the NAND flash memory cell array 303 are selected. Furthermore, the bit line control circuit 301 receives the bit line voltage $V_{bl}$ from the booster circuit 311, supplying the bit line voltage $V_{bl}$ to a NAND memory cell unit column selected by the column decoder 302. Note that only the minimum circuit configuration is shown in FIG. 8, and in addition to this configuration, an address buffer, a data input/output buffer, and a timing generation circuit and the like are also employed, however, descriptions thereof are omitted.

Also note that the operating method of the nonvolatile semiconductor memory according to a second embodiment of the present invention may have a stacked gate memory cell structure to be described hereafter, and is the same as that of the nonvolatile semiconductor memory according to the first embodiment.

Second Embodiment

Figure 2:
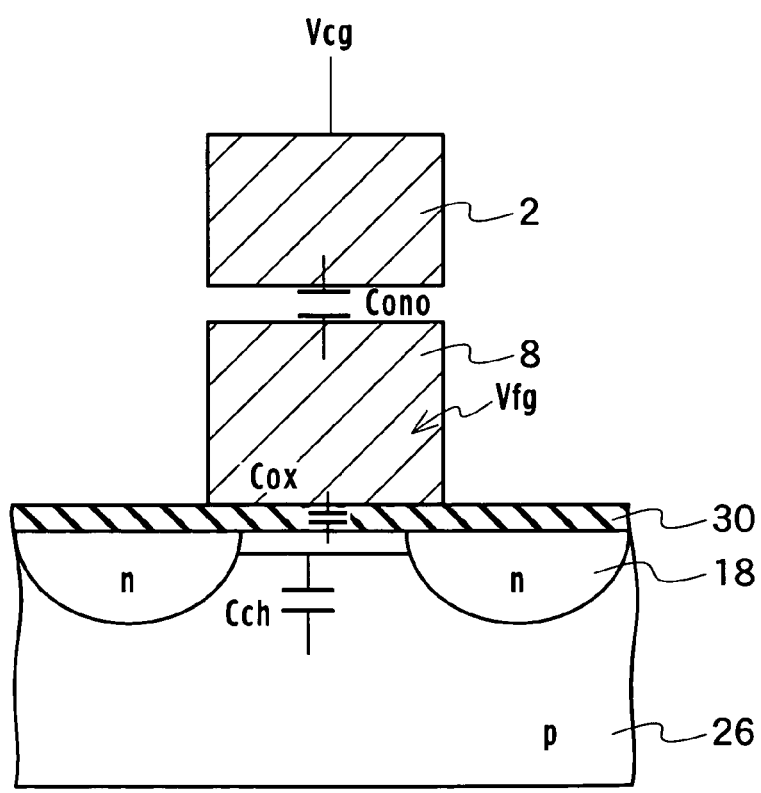
FIG. 2 is a schematic cross-sectional diagram of a basic stacked gate structure of a memory cell transistor applied to nonvolatile semiconductor memory according to a second embodiment of the present invention.

The basic structure of a memory cell transistor of a nonvolatile semiconductor memory according to the second embodiment of the present invention is, as shown in FIG. 2, a stacked structure including: diffusion layers 18 formed in a semiconductor substrate 26 to be a source region or a drain region; a tunneling insulator film 30 formed on the semiconductor substrate 26; a floating gate 8 formed upon a channel region sandwiched between the diffusion layers 18 via the tunneling insulator film 30; and a control gate 2 formed on the floating gate 8 via an interlayer insulator film.

According to the sidewall control gate structure, the parasitic capacitance around the floating gate 8 can be reduced, and increasing the value of the capacitance between the control gate 2 and the floating gate 8 allows a decrease in the write-in voltage $V_{pgm}$ and provides a nonvolatile semiconductor memory capable of dense integration and high-speed performance. On the other hand, two control gate lines must be provided for the 'sidewall control gate structure', while only one is necessary for the 'stacked gate structure'; thus the memory cell array with the 'stacked gate structure' has a simpler circuitry. However, as is apparent by comparing FIG. 6 and FIG. 7, the number of control gate lines in the 'sidewall control gate structure' is actually only one more than in the 'stacked gate structure'. This is because two memory cells may be controlled by a single control gate.

Figure 7:
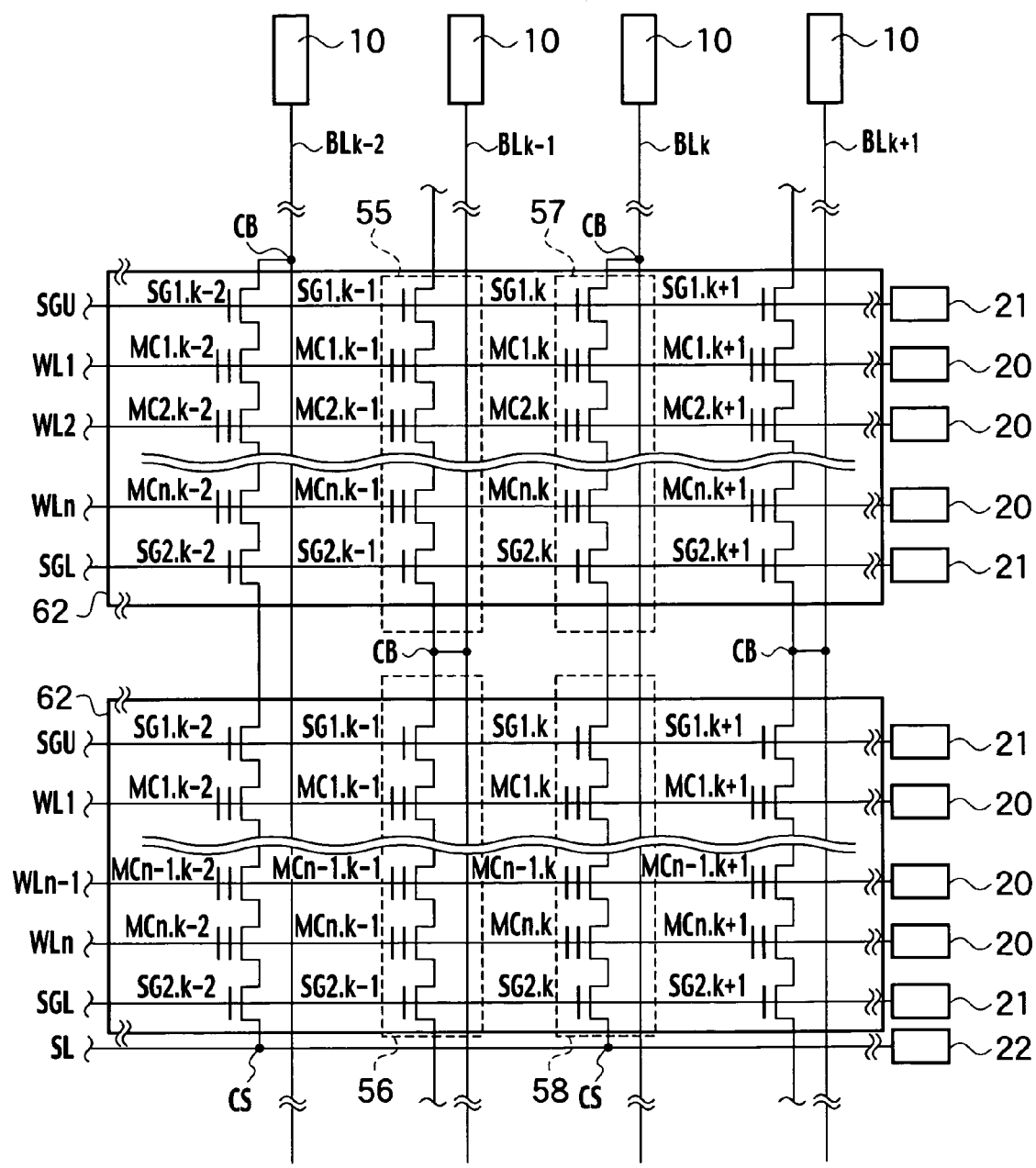
FIG. 7 is a schematic matrix circuit diagram of the nonvolatile semiconductor memory according to the second embodiment of the present invention in the case of memory cell transistors having a stacked gate basic structure.

A matrix circuitry of the nonvolatile semiconductor memory according to the second embodiment of the present invention in the case where the basic structure of the memory cell transistor is the stacked gate structure as shown in FIG. 2 is as shown in FIG. 7. The structure is configured with memory cell block regions 62 in which NAND memory cell units 55 and 57 or 56 and 58 are arranged in parallel, a plurality of NAND memory cell units 55 and 56 or 57 and 58 aligned in a row direction, word lines WL1 to WLn, select gate lines SGU and SGL, bit lines $BL_{k-2}$ to $BL_{k+1}$, a source line SL, bit line drive circuits 10, control gate (word) line drive circuits 20, select gate line drive circuits 21, and a source line drive circuit 22. Each of the NAND memory cell units in the example of FIG. 7 includes: an n number of serially connected memory cell transistors; a single bit line side select gate transistor SG1, which includes the select gate line SGU located adjacent to the word line WL1; and a single source line side select gate transistor SG2, which includes the select gate line SGL adjacent to the word line WLn. Each NAND memory cell unit is connected to the bit line BL and the source line SL via the above select gate transistors.

A characteristic of FIG. 7 is the arrangement of bit line contacts CB. The two serially connected NAND memory cell units 57 and 58 include a bit line contact CB connected to the bit line $BL_k$ and a source line contact CS connected to the source line SL. The same inter-unit diffusion layer 80 as in FIG. 3B is disposed in the NAND memory cell units 55 and 56, as well as a bit line contact CB connected to the bit line $BL_{k-1}$.

The circuitry of the memory matrix array shown in FIG. 7 of the nonvolatile semiconductor memory, according to the second embodiment of the present invention, is basically the same as that of the memory matrix of the nonvolatile semiconductor memory according to the first embodiment shown in FIG. 6, except for the basic structure of the memory cell transistor. A characteristic of the nonvolatile semiconductor memory according to the second embodiment of the present invention is the arrangement of bit line contacts CB and source line contacts CS. Even the memory matrix array with the stacked gate structure shown in FIG. 7, as the basic unit for the memory cell transistor, has the same structure as in FIG. 6, and has the following characteristics.

A structure with two NAND memory cell units serially connected is given as the basic unit, and this basic unit is arranged and alternately shifted in the column (bit line) direction at a distance of one length of a single NAND memory cell unit. The distance of the basic unit alternately shifted in the column (bit line) direction is an equivalent value of one length of a single NAND memory cell unit. As a result, the bit line contacts CB and the source line contacts CS are alternatively arranged along the control gate line CG length, and the contacts CB and CS are arranged in a rhombic matrix shape when viewed as a top plan view pattern.

The drains of the source side select gate transistors SG2.$k$−1 and SG2.$k$+1 are connected to a bit line contact CB but not connected to the source line contact CS, where the two serially connected memory cell units have a replicated structure along the bit line BL length centered around the bit line contact CB. This structure is the same as in FIG. 6.

(Planar Block Structure)

The planar block structure of the nonvolatile semiconductor memory according to the second embodiment of the present invention includes: as shown in the schematic block diagram of FIG. 9, memory cell block regions 62; active areas 60; device isolation regions 59; bit line contacts 64 and source line contacts 65 arranged on the active areas 60; bit lines BL connected to the bit line contacts 64; and source lines 63 connected to the source line contacts 65 and extending along the word line WL length orthogonal to the bit lines BL. The NAND memory cell units 55 through 58 formed in the active areas 60 are arranged in parallel along the word line WL length within the memory cell block regions 62. Description of select gate lines SGU and SGL and word lines WL is omitted. A characteristic of the nonvolatile semiconductor memory according to the second embodiment of the present invention is that the bit line contacts 64 and the source line contacts 65 are arranged at a double pitch along the word line WL length at staggered positions from each other. A further characteristic is that the memory cell unit arranged between a single bit line contact 64 and a single source line contact 65 is structured to extend over two memory cell block regions 62, as shown in FIG. 9. As shown in FIG. 9, pairs of bit line contacts 64 and source line contacts 65 are arranged on every other active area 60 along the word line length. For example, in FIG. 9, assuming that sixty-four pages are allocated, the physical word lines WL in a single memory cell block region 62 may be allocated to pages 0 through 31, while physical word lines WL in another memory cell block region 62 may be allocated to pages 32 through 63. In other words, in FIG. 9, pages 32 through 63 corresponding to a single memory cell block region 62 may be allocated to region A of the NAND memory cell units, and pages 0 through 31 corresponding to another memory cell block region 62 may be allocated to region B of the NAND memory cell units.

(Operation Mode)

(Read-Out Mode)

Figure 10:
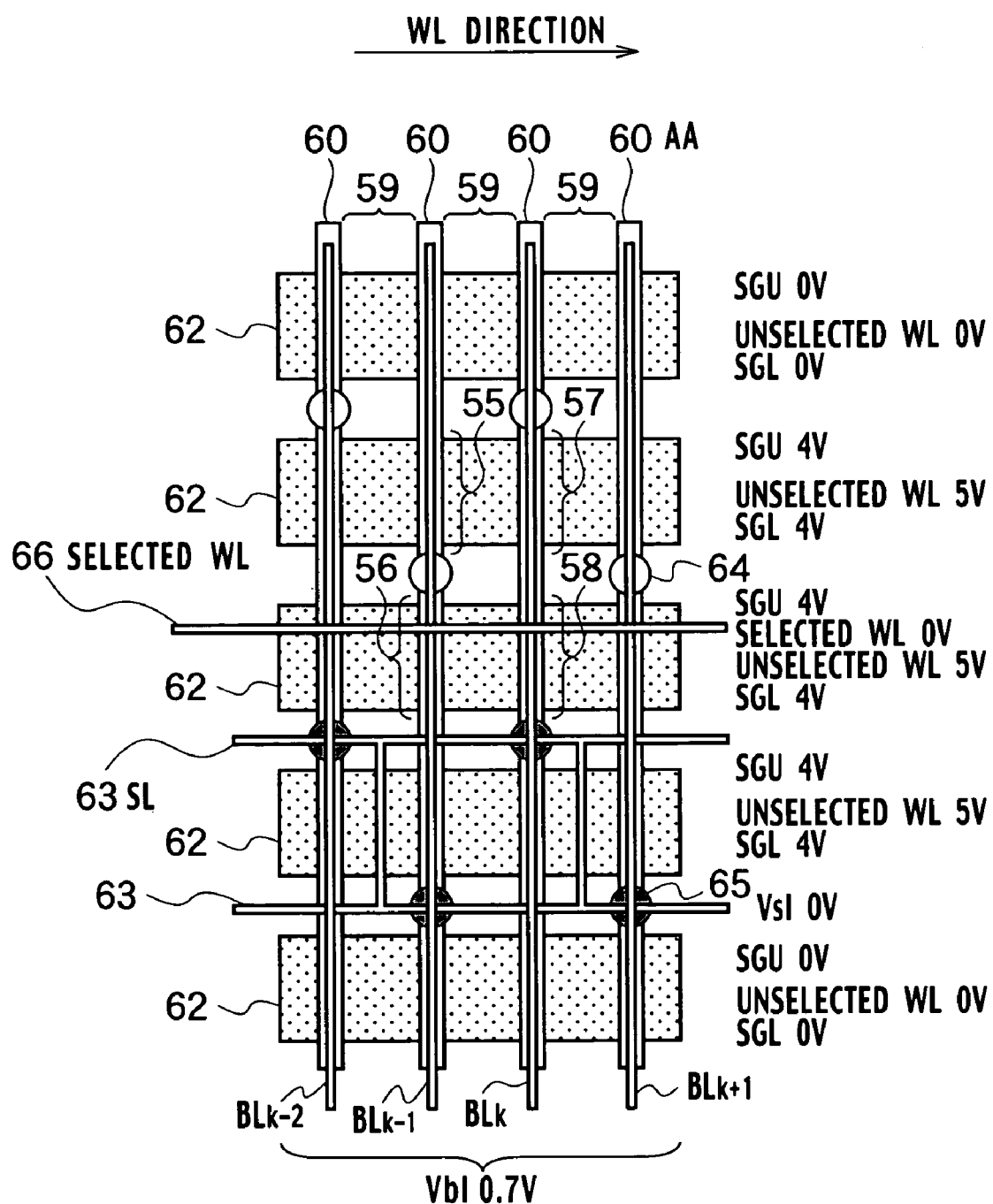
FIG. 10 is a schematic block diagram of an aerial pattern of the nonvolatile semiconductor memory according to the second embodiment of the present invention given in FIG. 9, describing a read-out mode in the case of selecting pages 0 through 31.
Figure 11:
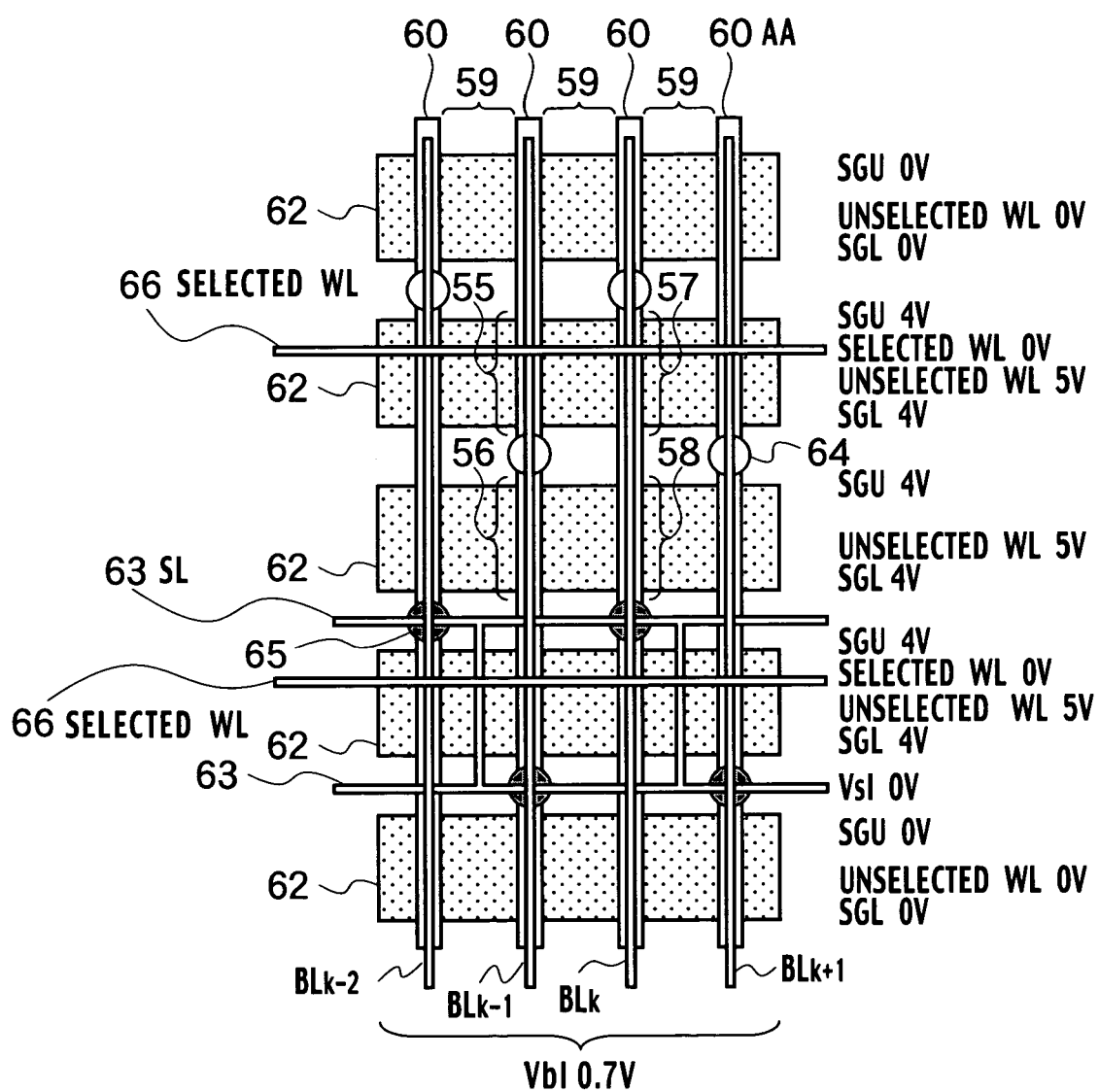
FIG. 11 is a schematic block diagram of an aerial pattern of the nonvolatile semiconductor memory according to the second embodiment of the present invention given in FIG. 9, describing a read-out mode in the case of selecting pages 32 through 63.

The read-out mode for the case of selecting pages 0 through 31 is given in FIG. 10, and the read-out mode for the case of selecting pages 32 through 63 is given in FIG. 11. When reading out pages 0 through 31, a single word line 66 should be selected as shown in FIG. 10. When reading out pages 32 through 63, these pages can be read out at the same time if two word lines 66 are selected as shown in FIG. 11. In FIGS. 10 and 11, SGU denotes a bit line side (drain side) select gate line, and SGL denotes a source line side select gate line. The bit line side select gate and the source line side select gate respectively receive a predetermined voltage of 0V or 4V. In addition, 0V or an approximately 5V voltage is also applied to the unselected and the selected word lines WL. The voltage Vsl to be applied to source lines SL is 0V, and the voltage Vbl to be applied to bit lines BL is approximately 0.7V, for example.

(Write-in Mode)

Figure 12:
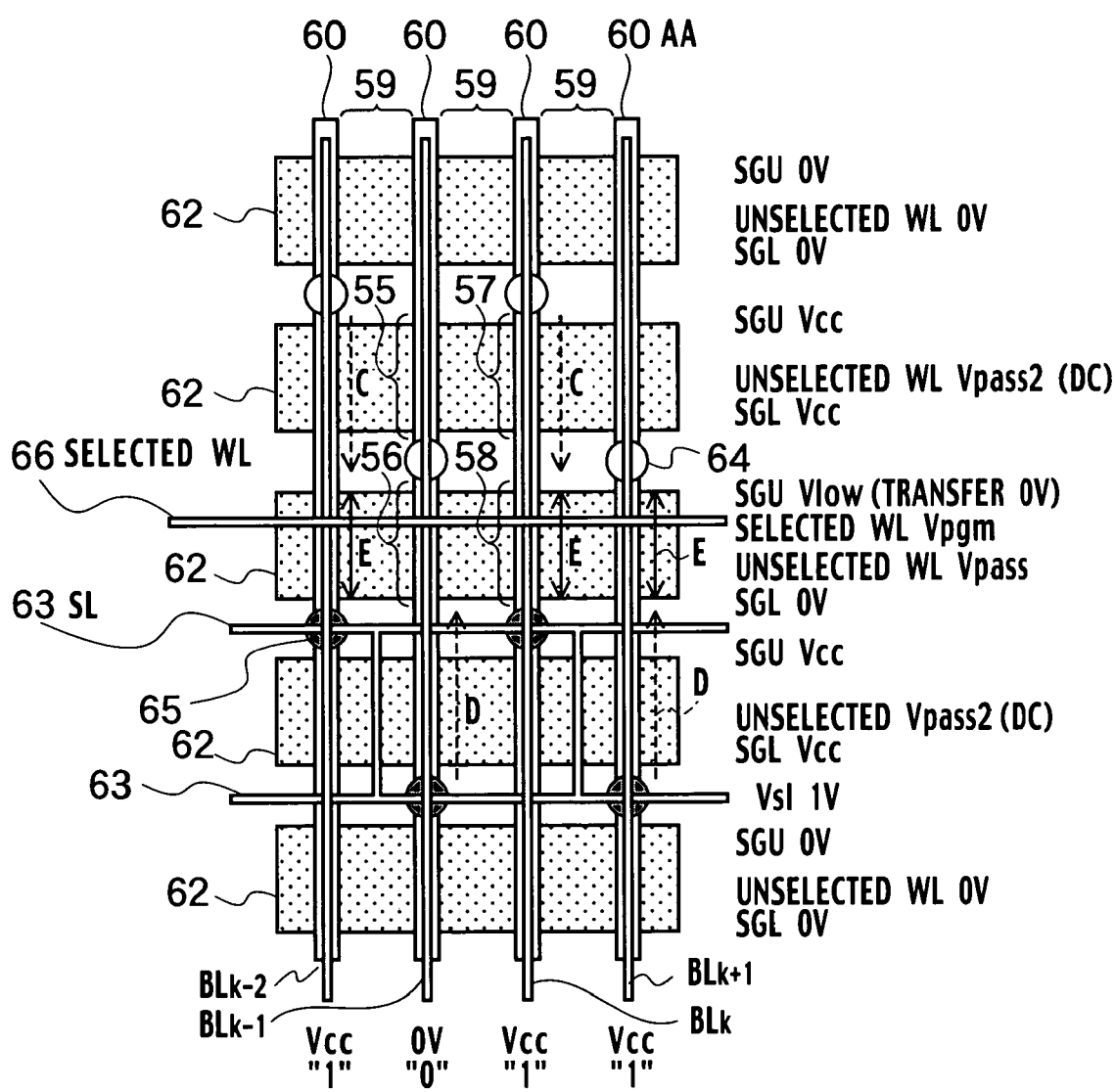
FIG. 12 is a schematic block diagram of an aerial pattern of the nonvolatile semiconductor memory according to the second embodiment of the present invention given in FIG. 9, describing a write-in mode in the case of selecting pages 0 through 31.
Figure 13:
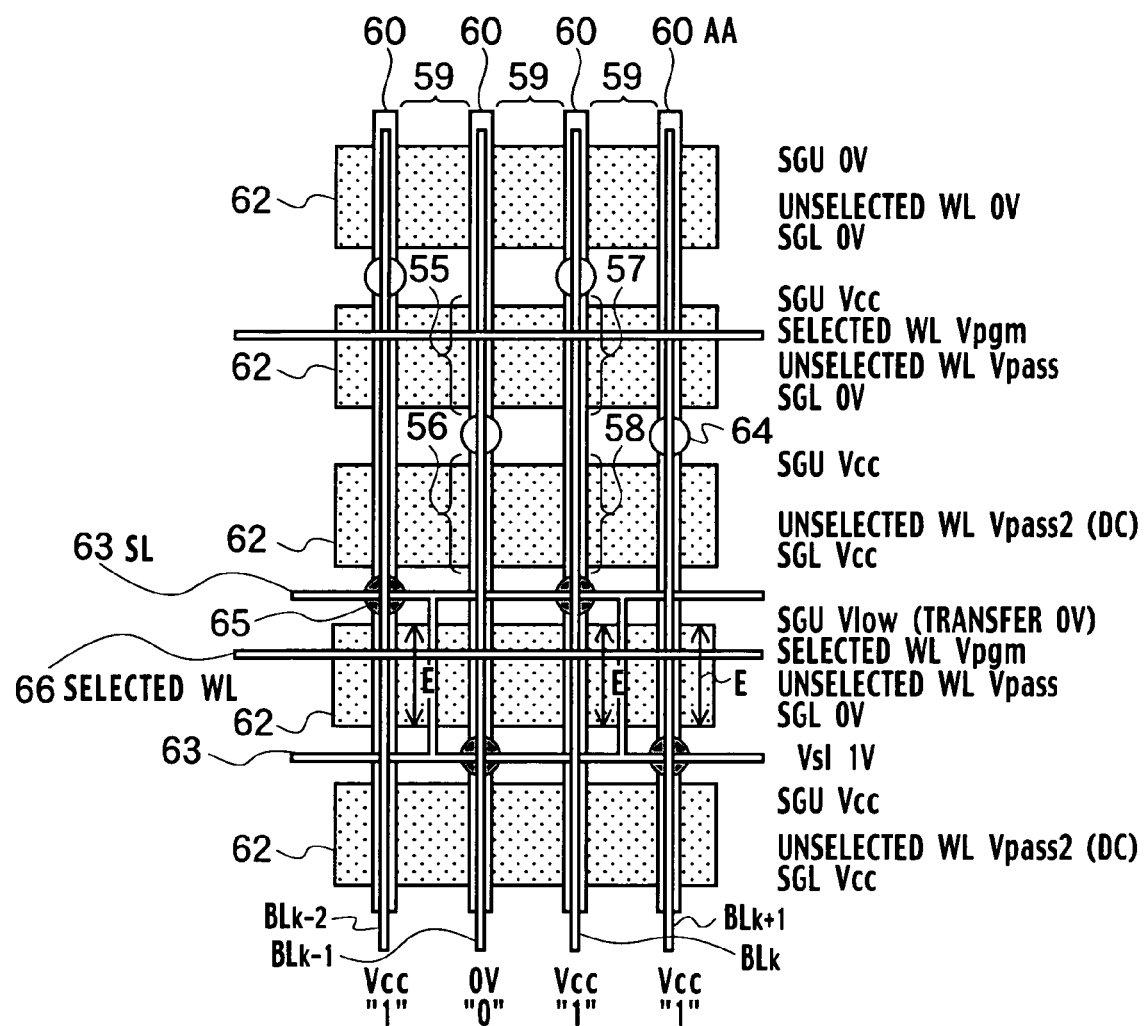
FIG. 13 is a schematic block diagram of an aerial pattern of the nonvolatile semiconductor memory according to the second embodiment of the present invention given in FIG. 9, describing a write-in mode in the case of selecting pages 32 through 63.

The write-in mode in the case of selecting pages 0 through 31 is given in FIG. 12, and the write-in mode in the case of selecting pages 32 through 63 is given in FIG. 13. Executing a self-boost operation across a plurality of memory cell block regions 62 may be considered; however, it is anticipated that a load is added to the diffusion layer between the select gate transistors SG1 and SG2 positioned at the junction of adjacent memory cell blocks. Thus favorable write-in characteristics without erroneous write-in characteristics, such as the read disturb characteristics, can not be obtained. Therefore, instead of an operation of transferring the initial potential from the bit lines BL, a method of cutting off the select gate transistors SG1 and SG2 on both sides of the NAND memory cell unit, so as to boost by only the capacitance coupling, is the easiest method. In this case, the voltage applied to the bit line side select gate line SGU is set to a sufficiently low voltage Vlow (>0V) allowing transfer of 0V. The voltage applied to the source line side select gate line SGL is set to 0V. The method of cutting off the select gate transistors SG1 and SG2 connected to the two select gate lines SGU and SGL, respectively, is important in order to obtain favorable write-in characteristics without erroneous write-in characteristics, such as the read disturb characteristics.

(First Modified Example of Write-in Mode)

In order to cut off the select gate transistors SG1 and SG2, a back bias voltage is transferred to the inter-unit diffusion layer 80 via neighboring memory cell block regions 62. At this time, pass voltages (DC) are applied to the word lines WL for the neighboring memory cell block regions 62. However, read disturb may be worsened.

(Second Modified Example of Write-in Mode)

In order to alleviate read disturb, the inter-unit diffusion layer 80 is charged by applying the pass voltage in pulses.

(Third Modified Example of Write-in Mode)

Alternatively, there is a cut-off method of setting all the select gate lines SGU and SGL and the word lines WL for the unselected memory cell block regions 62 adjacent to the selected memory cell block regions 62 to 0V.

The select gate transistor SG1, which is connected to the bit line side select gate line SGU so as to have a sufficiently low voltage Vlow (>0V) applied allowing transfer of 0V, is insufficiently cut off and leakage current can easily pass through; however, the inter-unit diffusion layer 80 automatically cuts off when it is being charged. However, write-in characteristics may degrade since electrons in the inter-unit diffusion layer 80 enter the channel regions of the select gate transistors SG1 and SG2.

(Detailed Planar Pattern Structure)

Figure 14:
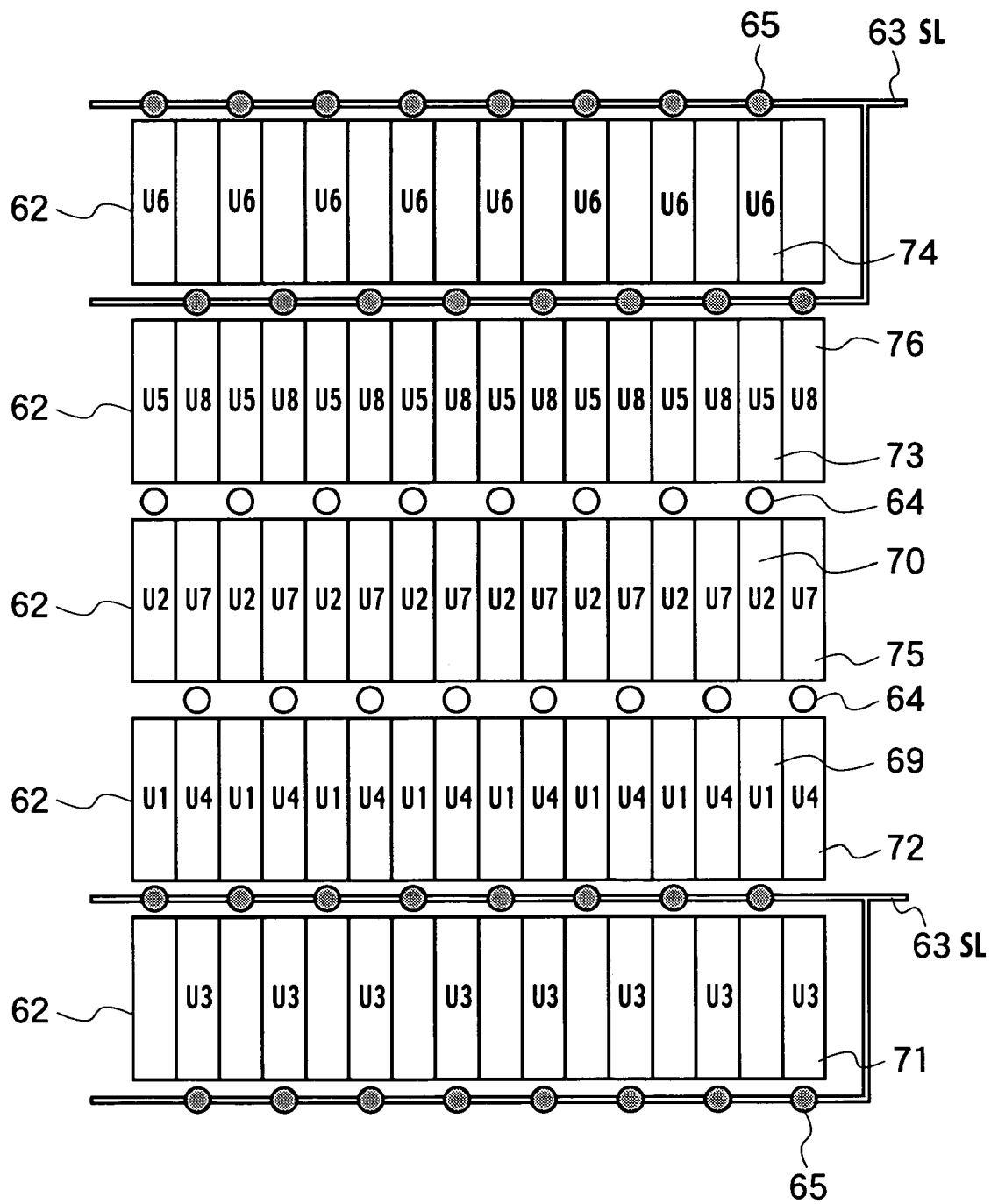
FIG. 14 is a further detailed aerial pattern block diagram of the nonvolatile semiconductor memory according to the second embodiment of the present invention.

A further detailed planar pattern structure of the nonvolatile semiconductor memory according to the second embodiment of the present invention includes, as shown in FIG. 14, memory cell block regions 62, memory cell units (U1) 69, memory cell units (U2) 70, memory cell units (U3) 71, memory cell units (U4) 72, memory cell units (U5) 73, memory cell units (U6) 74, memory cell units (U7) 75, source lines 63, bit line contacts 64, and source line contacts 65. Description of bit lines BL, word lines WL or control gate lines CG in FIG. 14 is omitted.

As shown with NAND memory cell units 55 through 58 of FIG. 7, for example, a single memory cell unit is configured by serially connecting an n number of memory cell transistors (MC1 to MCn) in a form where adjacent memory cell transistors share either their source or drain diffusion layer, and further arranging select gate transistor SG1 and SG2 at both ends thereof, respectively. A memory cell array has the above memory cell units aligned in a matrix. Memory cell units in the same row make up a memory cell block region 62. The control gates of a plurality of memory cell transistors MC and select gate transistors SG1 and SG2 arranged in the row direction in the memory cell array are connected in common to control gate line WL or CG and the select gate lines SGU and SGL, respectively. In the case where there are an n number of memory cell transistors in the memory cell unit, there are n number of control gate lines in the memory cell block region 62. A plurality of memory cell transistors connected to a single control gate line WL or CG configure an example of the range of pages in which writing-in or reading-out data can be collectively performed. This write-in or read-out unit is normally defined as one page; however recently, there are cases where a plurality of pages is allotted to a single control gate line.

With the second embodiment of the present invention, a single bit line contact 64 and a single source line contact 65 are shared by both ends of two memory cell units in series in the column direction. Accordingly, the active area contact pitch in the row direction is alleviated to twice the active area 60 pitch in the row direction. As a result, processing difficulty may be significantly reduced compared to the conventional technology.

Two fabrication methods for formation of a contact hole are described forthwith.

(Fabrication Method 1)

Figure 15A:
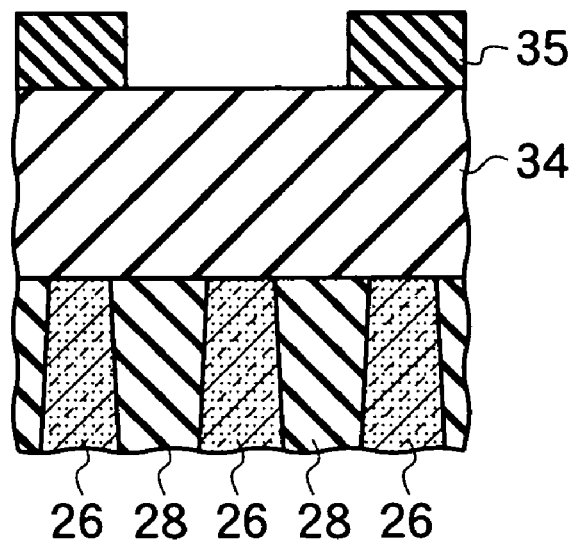
FIG. 15A is a diagram illustrating an exemplary fabrication method for formation of a contact hole in the nonvolatile semiconductor memory according to the second embodiment of the present invention, and particularly showing the steps of forming device isolation regions 28 in a semiconductor substrate 26, forming a thick interlayer insulator film 34, and then forming a large opening in a mask material 35 in the lithography stage.

As shown in FIG. 15, device isolation regions 28 are formed in a semiconductor substrate 26, a thick interlayer insulator film 34 is formed, and a large opening is then formed in mask material 35 in the lithography stage (FIG. 15A).

Figure 15B:
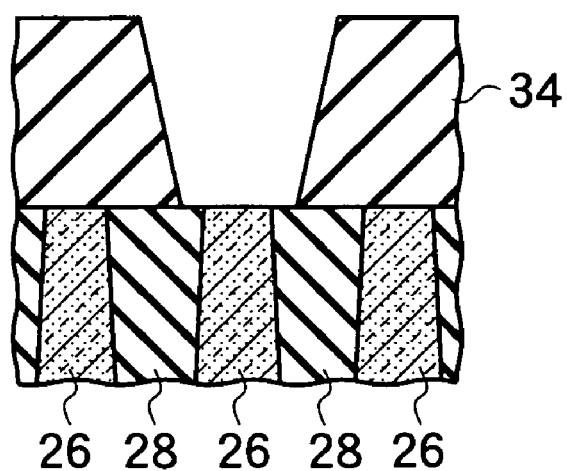
FIG. 15B is a diagram illustrating an exemplary fabrication method for formation of a contact hole in the nonvolatile semiconductor memory according to the second embodiment of the present invention, and particularly showing the step of forming a contact hole in the interlayer insulator film 34 under certain gas supply conditions for formation of a forward-tapered shaped contact hole.

In a to-be-opened region, a contact hole is formed in the interlayer insulator film 34 under certain gas supply conditions for formation of a forward-tapered shaped contact hole (FIG. 15B).

(Fabrication Method 2)

Figure 16A:
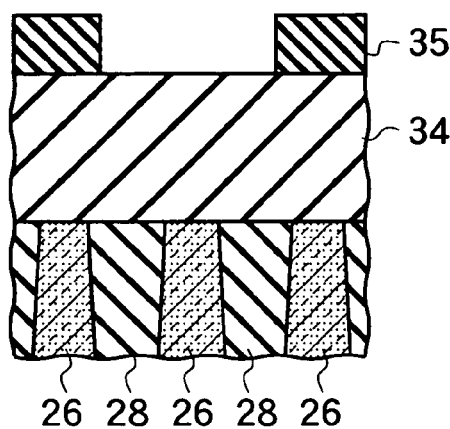
FIG. 16A is a diagram illustrating an exemplary fabrication method for formation of a contact hole in the nonvolatile semiconductor memory according to the second embodiment of the present invention, and particularly showing the steps of forming device isolation regions 28 in a semiconductor substrate 26, forming a thick interlayer insulator film 34, and then forming a large opening in a mask material 35 in the lithography stage.

As shown in FIG. 16, device isolation regions 28 are formed in a semiconductor substrate 26, a thick interlayer insulator film 34 is formed, and a large opening is then formed in mask material 35 in the lithography stage as in FIG. 15A (FIG. 16A).

Figure 16B:
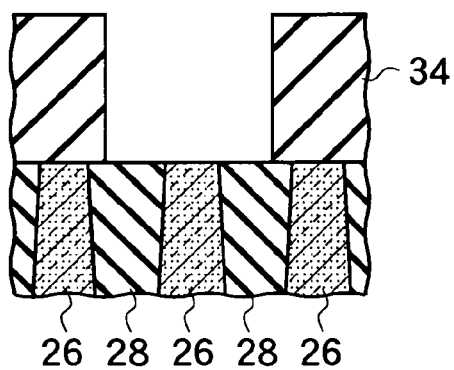
FIG. 16B is a diagram illustrating an exemplary fabrication method for formation of a contact hole in the nonvolatile semiconductor memory according to the second embodiment of the present invention, and particularly showing the step of forming a contact hole in the interlayer insulator film 34.

Subsequently, in the to-be-opened region, a contact hole is formed in the interlayer insulator film 34 (FIG. 16B).

Figure 16C:
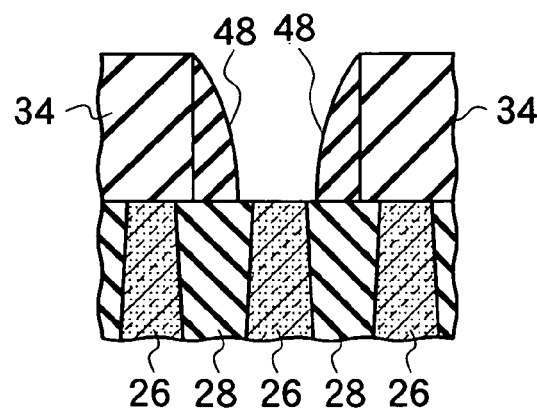
FIG. 16C is a diagram illustrating an exemplary fabrication method for formation of a contact hole in the nonvolatile semiconductor memory according to the second embodiment of the present invention, and particularly showing the step of forming sidewall insulator films 48 by processing the sidewalls so as to narrow the contact hole diameter.

Sidewall insulator films 48 are then formed by processing the sidewalls so as to narrow the contact diameter (FIG. 16C).

According to the above fabrication method 1 or fabrication method 2, since lithography conditions are not so strict, and thicker interlayer films separating adjacent bit line contacts CB are possible, the risk of leakage between bit lines is reduced.

(Operation Method)

The operation method of the nonvolatile semiconductor memory according to the second embodiment of the present invention, which has the arrangement of bit line contacts (CB) 64 and source line contacts (CS) 65 shown in FIG. 14, is described.

(Read-Out Method)

Figure 17:
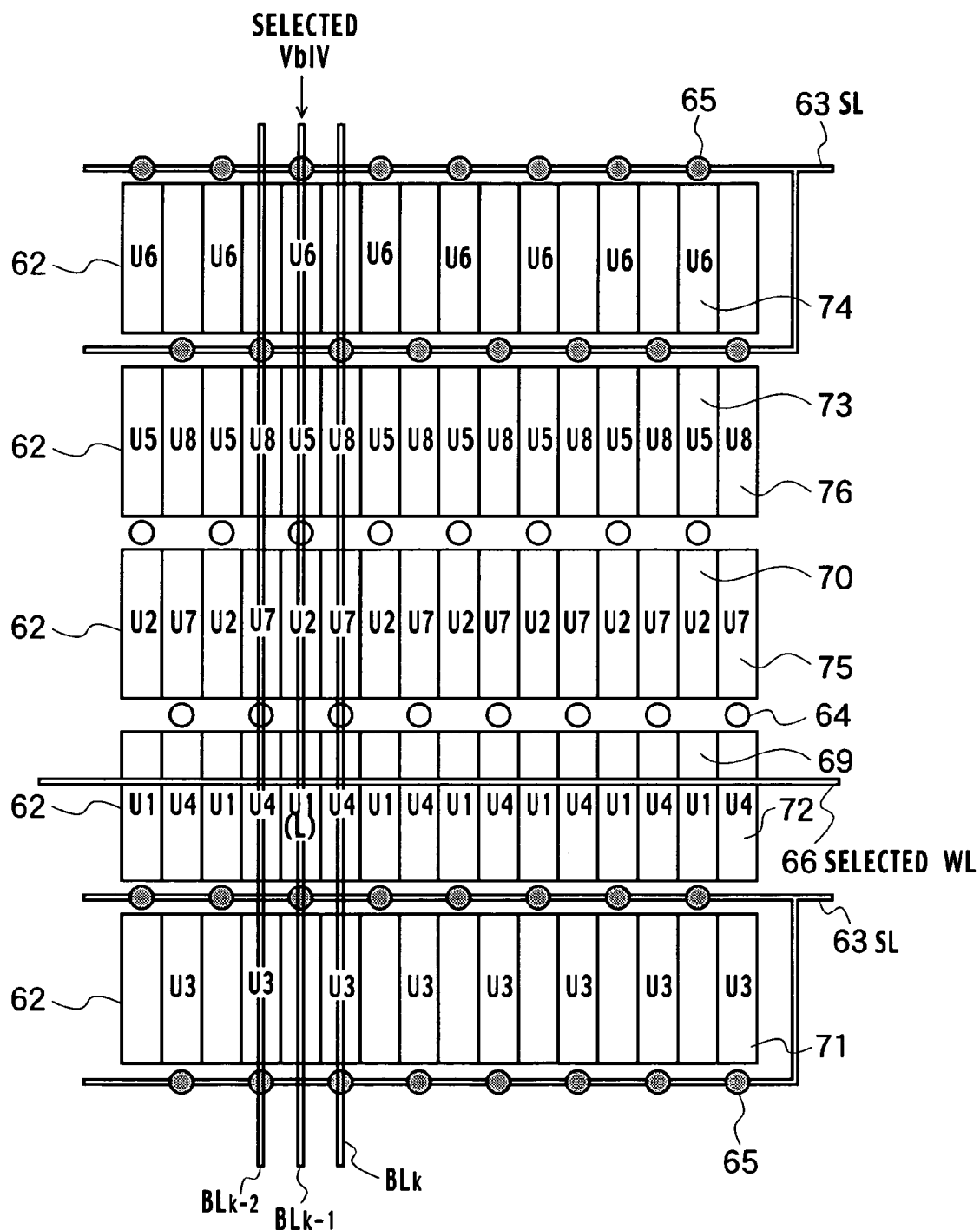
FIG. 17 is a detailed aerial pattern block diagram of the nonvolatile semiconductor memory according to the second embodiment of the present invention, describing a read-out method.
Figure 18:
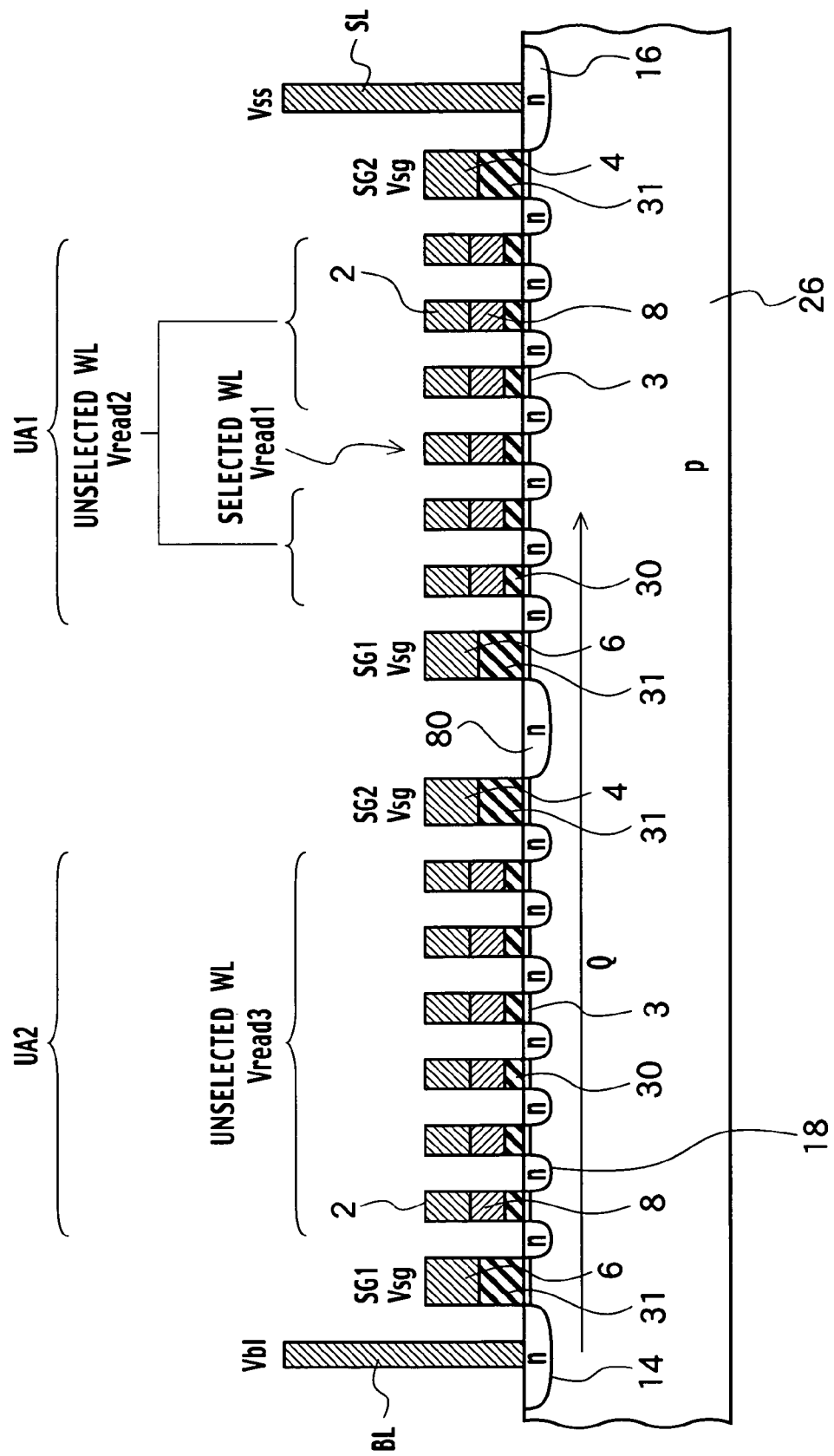
FIG. 18 is a diagram describing bias conditions for a read-out operation for a memory cell unit UA1 denoted by (L) in FIG. 17, and is a schematic device cross-sectional diagram describing read-out operating voltages for memory cell units UA1 and UA2, which share bit line contacts (CB) 64 and source line contacts (CS) 65.

A memory cell unit U1 denoted by (L) in FIG. 17 in the cell array shown in the drawing is considered. FIG. 18 is a device cross-sectional schematic diagram showing a diagram of memory cell units UA1 and UA2, which share bit line contacts 64 and source line contacts 65 disposed on the memory cell unit U1 and an active area AA. In other words, two serially connected memory cell units made up of U1 (L) and U2 in FIG. 17 are represented as UA1 and UA2 in FIG. 18.

A voltage Vb1 (V) is applied to the bit line contacts 64 shared by the selected memory cell unit UA1 (L). Furthermore, a sufficiently low potential Vss, for example as small as 0V, is applied to the shared source line contacts 65. Furthermore, a voltage Vsg is applied to the gates of the select gate transistors SG1 and SG2. Note that the thickness of gate insulator films 31 of the select gate transistors SG1 and SG2 is thicker than that of tunnel insulator films 30 configuring the memory cell transistors. Favorable conduction and/or cut off characteristics of the select gate transistors SG1 and SG2 are desired.

A voltage Vread1, which brings a selected memory cell transistor either into or out of conduction depending on stored data, is applied to the control gates 2 of the selected memory cell transistors in the selected memory cell unit UA1. On the other hand, a voltage Vread2, which is greater than Vread1 and can bring an unselected memory cell transistor into conduction without depending on stored data, is applied to the control gates of the unselected memory cell transistors in the selected memory cell unit UA1.

In order to pass a cell current $I_{cell}$, all unselected memory cell transistors in the memory cell units UA1 and UA2, which share the contacts on the active areas, must be brought into conduction. Therefore, an important characteristic is that a voltage Vread3 greater than Vread1 is applied to all unselected word lines WL in the memory cell unit UA2. The direction indicated by arrow Q in FIG. 18 represents the direction in which the cell current $I_{cell}$ flows.

(Write-in Method)

Figure 19:
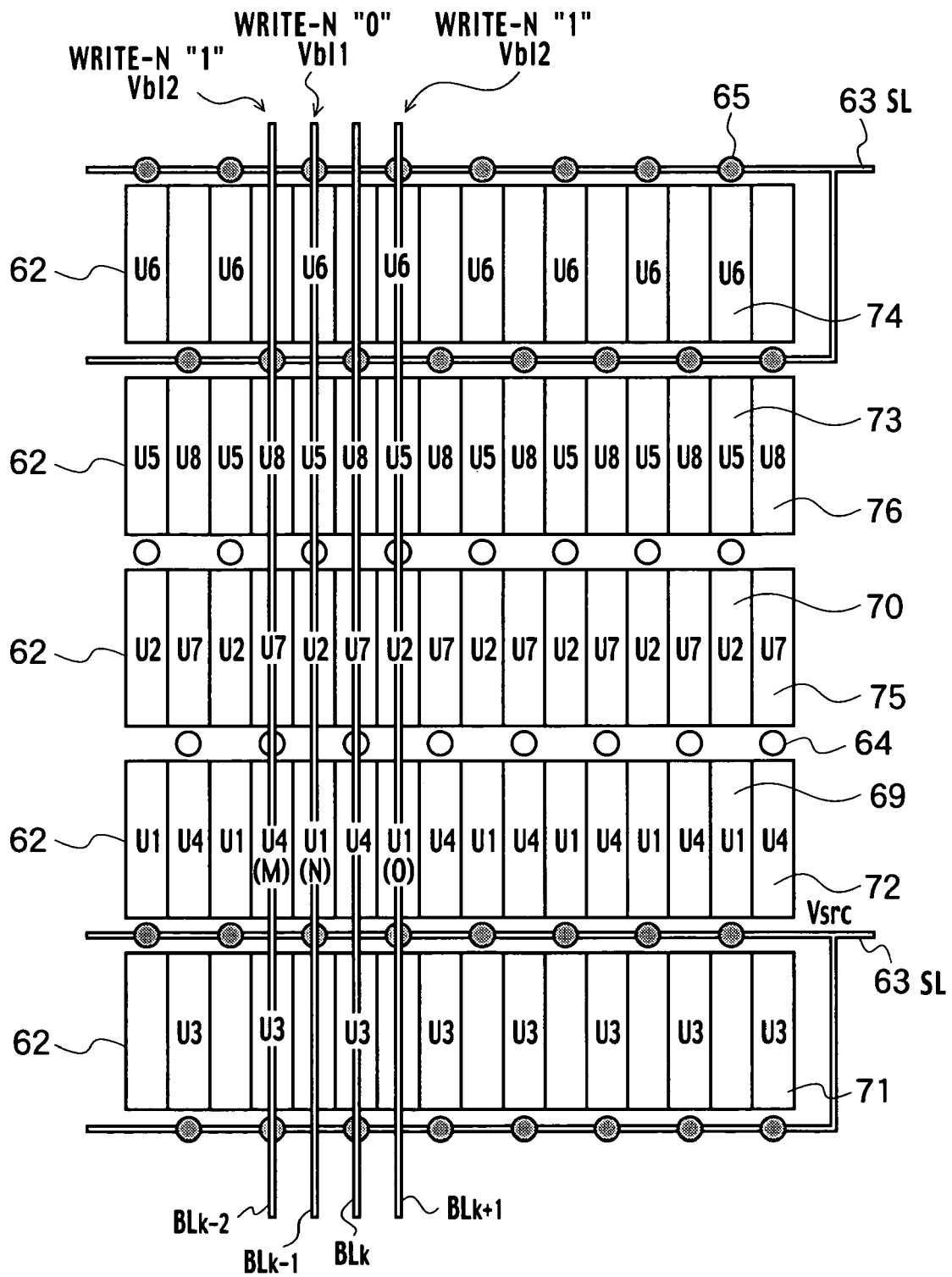
FIG. 19 is a detailed aerial pattern block diagram of the nonvolatile semiconductor memory according to the second embodiment of the present invention, describing a write-in method.
Figure 20:
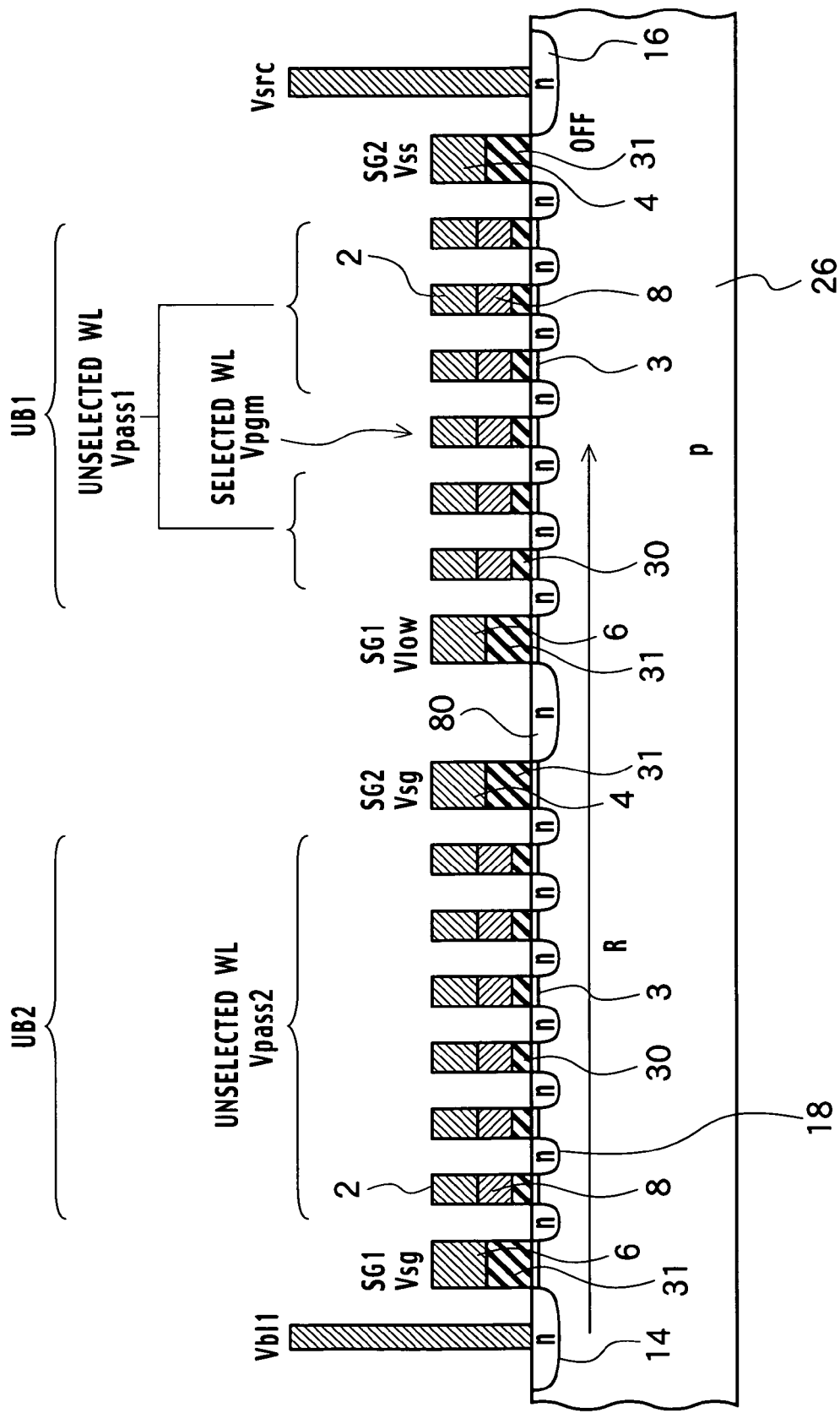
FIG. 20 is a diagram describing bias conditions for a write-in operation for a memory cell unit U1 denoted by (N) in FIG. 19 with '0', and is a schematic device cross-sectional diagram describing write-in operating voltages for memory cell units UB1 and UB2, which share bit line contacts (CB) 64 and source line contacts (CS) 65.

Next, the case of write-in is described. There are several situations that may be considered in the case of write-in. To begin with, in the case of '0' write-in in the memory cell unit U1 denoted as (N) in FIG. 19 may be considered. FIG. 20 is a device cross-sectional schematic diagram showing the bias relationship at the time of '0' write-in to the memory cell unit U1 (N). In other words, two serially connected memory cell units made up of U1 (N) and U2 in FIG. 19 are represented as UB1 and UB2 in FIG. 20.

A sufficiently low voltage Vbl1 (e.g., 0V) is applied to the bit line contacts 64 shared by the memory cell units UB1 and UB2. In order to transfer the voltage Vbl1 to the memory cell unit UB1, a voltage Vpass2 is applied to the control gates of the unselected memory cell transistors in the memory cell unit UB2, and a voltage Vsg is applied to the gates of the select gate transistors SG1 and SG2. A voltage Vlow is applied to a select gate 6 of the select gate transistor SG1 on the bit line contact 64 side in the memory cell unit UB1. The direction indicated by arrow R in FIG. 20 represents the direction in which the voltage Vbl1 is transferred.

Here, conditions satisfying $$Vlow > Vbl1 + Vth\_sg1(Vbl1) \quad (1)$$

are necessary in order to transfer Vbl1 to the channel. In Expression (1), Vth_sg1 (Vbl1) denotes a threshold for the select gate transistor SG1 when having a back bias of Vbl1 applied. Furthermore, a cut-off voltage Vss is applied to the select gate transistor SG2 on the bit line contact 65 side in the memory cell unit (UB1). By applying Vpgm to the control gates 2 of the selected memory cell transistors in the memory cell unit (UB1) and applying Vpass1 to the control gates 2 of the unselected memory cell transistors therein in this state, a large electric field is applied to the tunnel insulator film 30 directly below the selected memory cell transistors so as to perform '0' write-in.

Next, for '1' write-in bias, two types of a memory cell unit U4 denoted as (M) in FIG. 19 and a memory cell unit U1 denoted as (O) are considered. To begin with, in the first case of '1' write-in, a bias condition for the memory cell unit U1 denoted as (O) in FIG. 19 is given in FIG. 21. In other words, two serially connected memory cell units made up of U1 (O) and U2 in FIG. 19 are represented as UC1 and UC2 in FIG. 21.

Figure 21:
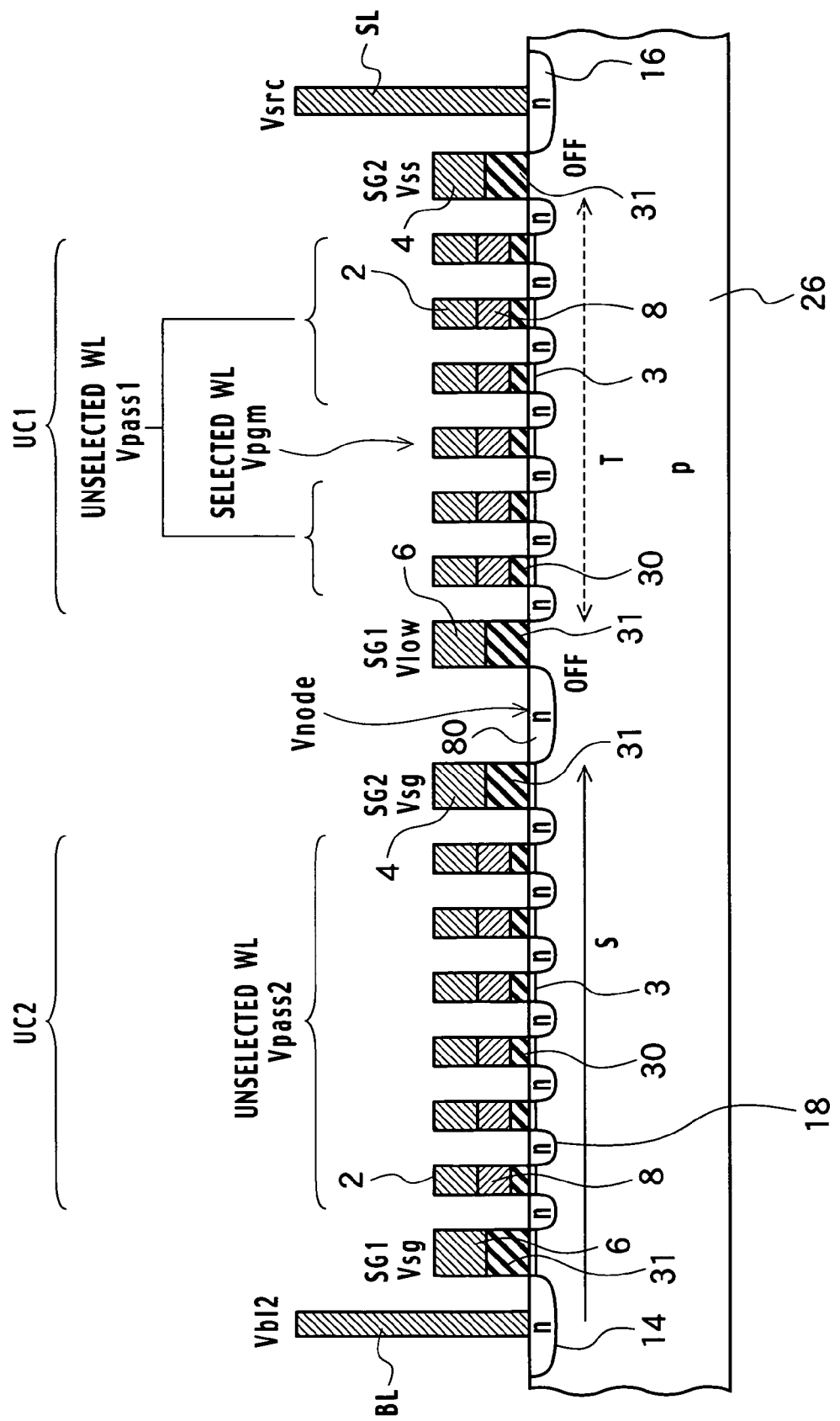
FIG. 21 is a diagram describing bias conditions for a write-in operation for a memory cell unit U1 denoted by (O) in FIG. 19 with '1' bias, and is a schematic device cross-sectional diagram describing write-in operating voltages for memory cell units UC1 and UC2, which share bit line contacts (CB) 64 and source line contacts (CS) 65.

The memory cell units UC1 and UC2 share control gate lines with the memory cell units UB1 and UB2, respectively, and therefore all gate voltages are the same. The difference with the bias conditions is that a voltage Vbl2 larger than Vbl1 of the bit line $BL_{k-1}$ is applied to bit lines $BL_{k-2}$ and $BL_{k+1}$. At this time, a positive voltage Vnode is transferred to the inter-unit diffusion layer 80 between the memory cell units UC1 and UC2. The direction indicated by arrow S in FIG. 21 represents the direction in which the back bias voltages for the select gate transistors SG1 and SG2 are transferred.

When Vpgm is applied to the selected control gate lines (word lines) WL in the memory cell unit UC1 and Vpass1 is applied to the unselected word lines WL, in order to satisfy the relationship $$Vlow < Vnode + Vth\_sg1 (Vnode) \quad (2)$$

the select gate transistor SG1 in the memory cell unit (UC1) is automatically cut off and is boosted due to the capacitive coupling with the combined channel and diffusion layer. With this resulting boosted voltage, the electric field, which is applied to the tunnel insulator film 30 directly below the memory cell transistor to which Vpgm is applied, is decreased, performing '1' write-in. A range of memory cell transistors denoted by region T in the memory cell unit UC1 in FIG. 21 indicates that the region T is a boosted region.

Furthermore, while channel boosting during '1' write-in, a positive voltage Vsrc is applied to the source line SL so that leakage does not occur via the select gate transistor SG2 in the memory cell unit (UC1).

Figure 22:
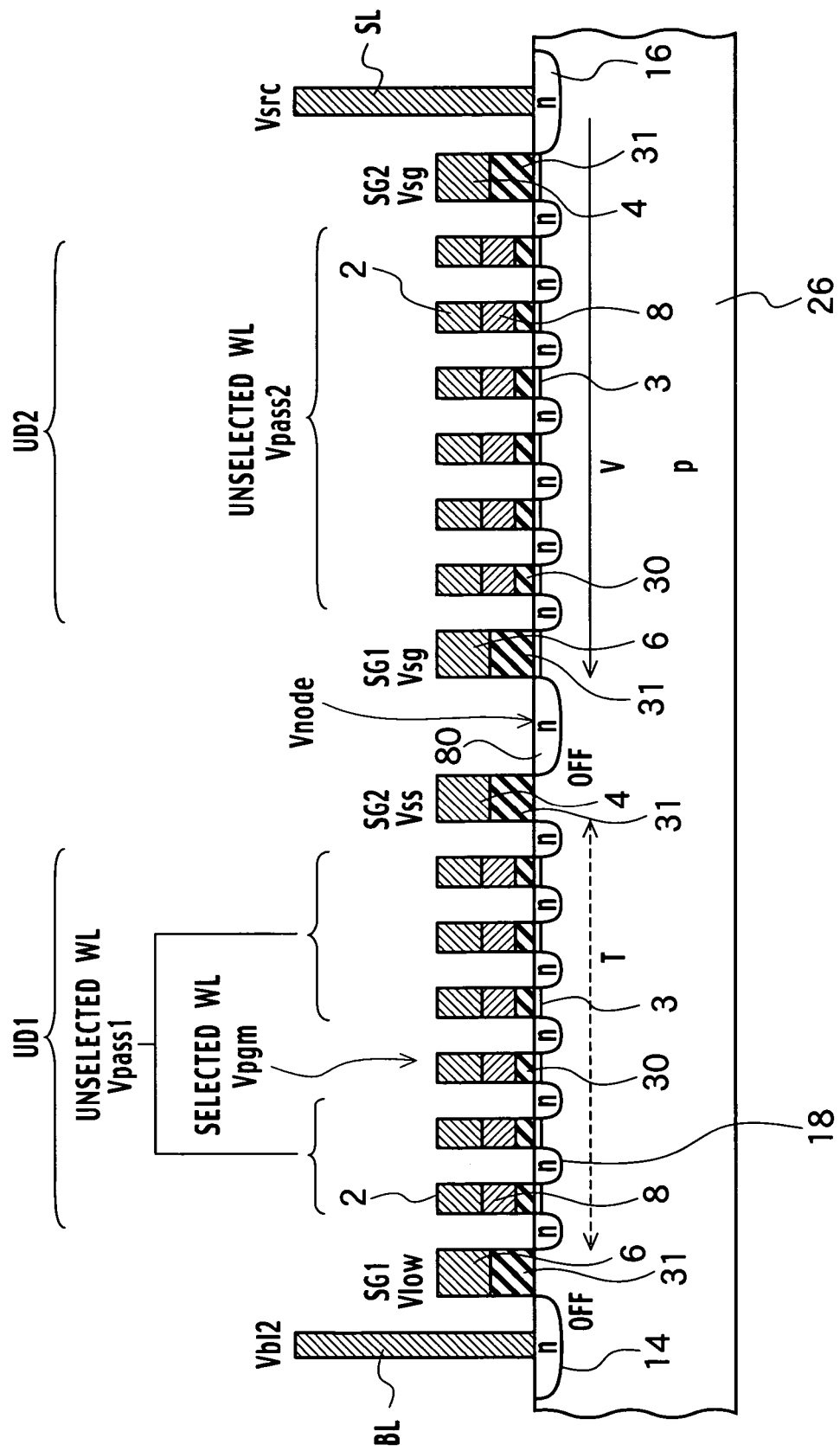
FIG. 22 is a diagram describing bias conditions for a '1' write-in operation for a memory cell unit U4 denoted by (M) in FIG. 19, and is a schematic device cross-sectional diagram describing write-in operating voltages for memory cell units UD1 and UD2, which share bit line contacts (CB) 64 and source line contacts (CS) 65.

Next, in the other case of '1' write-in, a bias condition for the memory cell unit U4 denoted as (M) in FIG. 19 is given in FIG. 22. In other words, two serially connected memory cell units made up of U4 (M) and U3 in FIG. 19 are represented as UD1 and UD2 in FIG. 22.

In order to implement '1' write-in, both the select gate transistors SG1 and SG2 in the memory cell unit UD1 need to be cut off. To begin with, if conditions for Expression (2) are satisfied, the select gate transistor SG1 is consequently cut off.

Regarding the select gate transistor SG2, assuming a part of source line voltage Vsrc is transferred via the memory cell unit UD2, and the voltage of the inter-unit diffusion layer 80 between the memory cell units UD1 and UD2 reaches Vnode, if $$Vss < Vnode + Vth\_sg2(Vnode) \quad (3)$$

is satisfied, the select gate transistor SG2 is cut off.

Accordingly, in order to implement '0' write-in and '1' write-in, the values of Vlow, Vbl1, Vbl2, Vpass2, Vsg, Vss, and Vsrc must be set so as to satisfy the conditions for Expressions (1) through (3). The range of memory cell transistors denoted by region T in the memory cell unit UD1 in FIG. 22 indicates that it is a boosted region, and the direction indicated by arrow V represents the direction in which the back bias voltages for the select gate transistors SG1 and SG2 are transferred.

Third Embodiment

Figure 23:
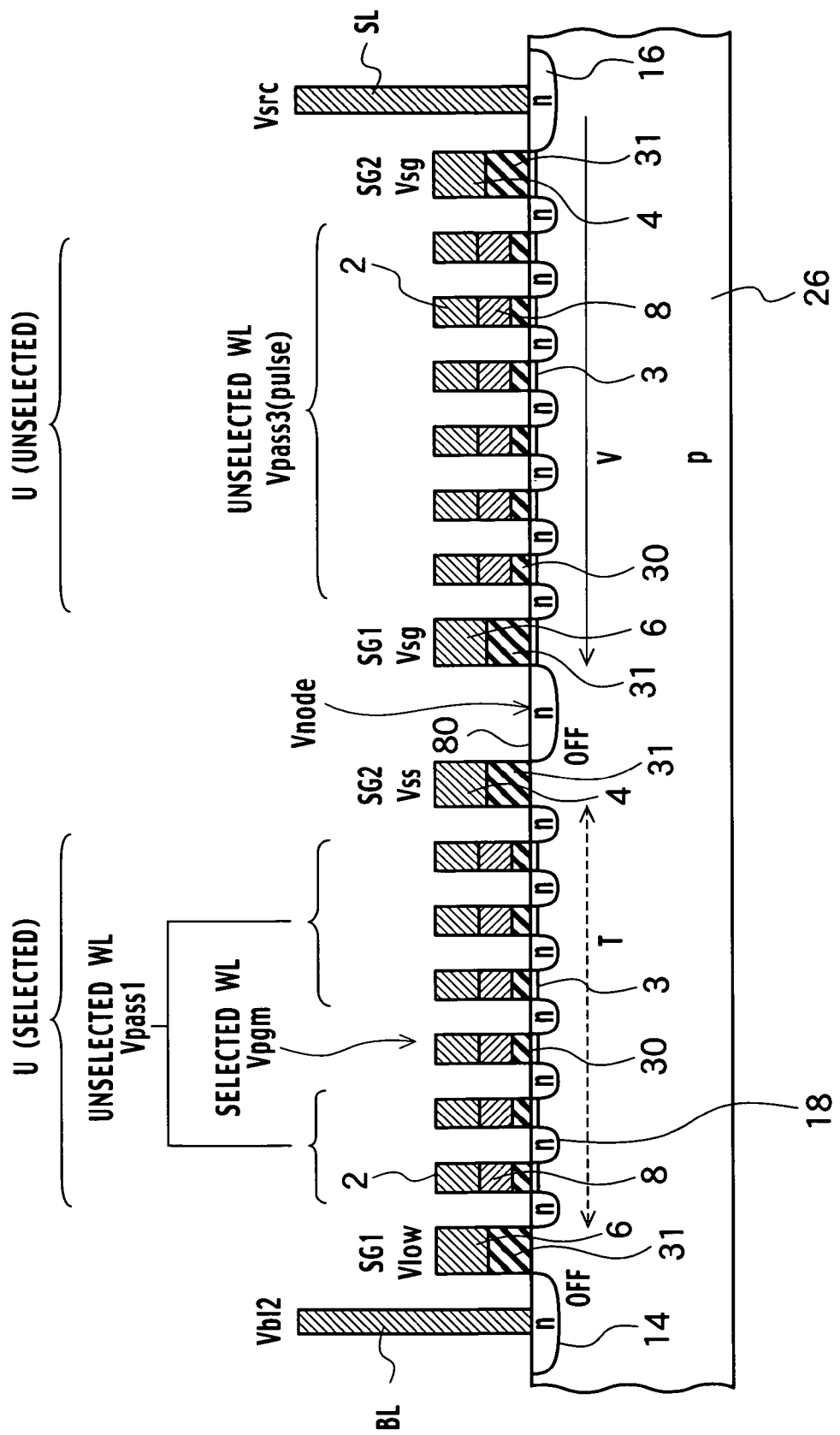
FIG. 23 is a schematic device cross-sectional diagram describing write-in operating voltages for unselected and selected memory cell units U, which share bit line contacts (CB) 64 and source line contacts (CS) 65, in nonvolatile semiconductor memory according to a third embodiment of the present invention.

With the nonvolatile semiconductor memory according to the second embodiment of the present invention, as shown in FIG. 20, while pulse voltages Vpgm and Vpass1 are applied to the word lines for the selected memory cell unit UB1 during write-in, Vpass2 is applied to all control gate (word) lines in the adjacent unselected memory cell unit UB2. However, in this case, a typical read disturb problem due to Vpass2 application may occur. With the nonvolatile semiconductor memory according to a third embodiment of the present invention, in the case where unselected memory cell units U are located on the source side, as shown in FIG. 23, Vpass3 is applied in pulses to all control gate (word) lines before applying Vpgm and Vpass1, subsequently performing an operation of making the value of applied pulses fall to 0V. As a result, a potential for Vnode is charged in the inter-unit diffusion layer 80, and the value of this charged Vnode acts as a back bias voltage for the select gate transistor SG2 in the selected memory cell unit U. The range of memory cell transistors denoted by region T in FIG. 23 indicates that it is a boosted region, and the direction indicated by arrow V represents the direction in which the back bias voltages for the select gate transistors SG1 and SG2 are transferred.

Fourth Embodiment

Figure 24:
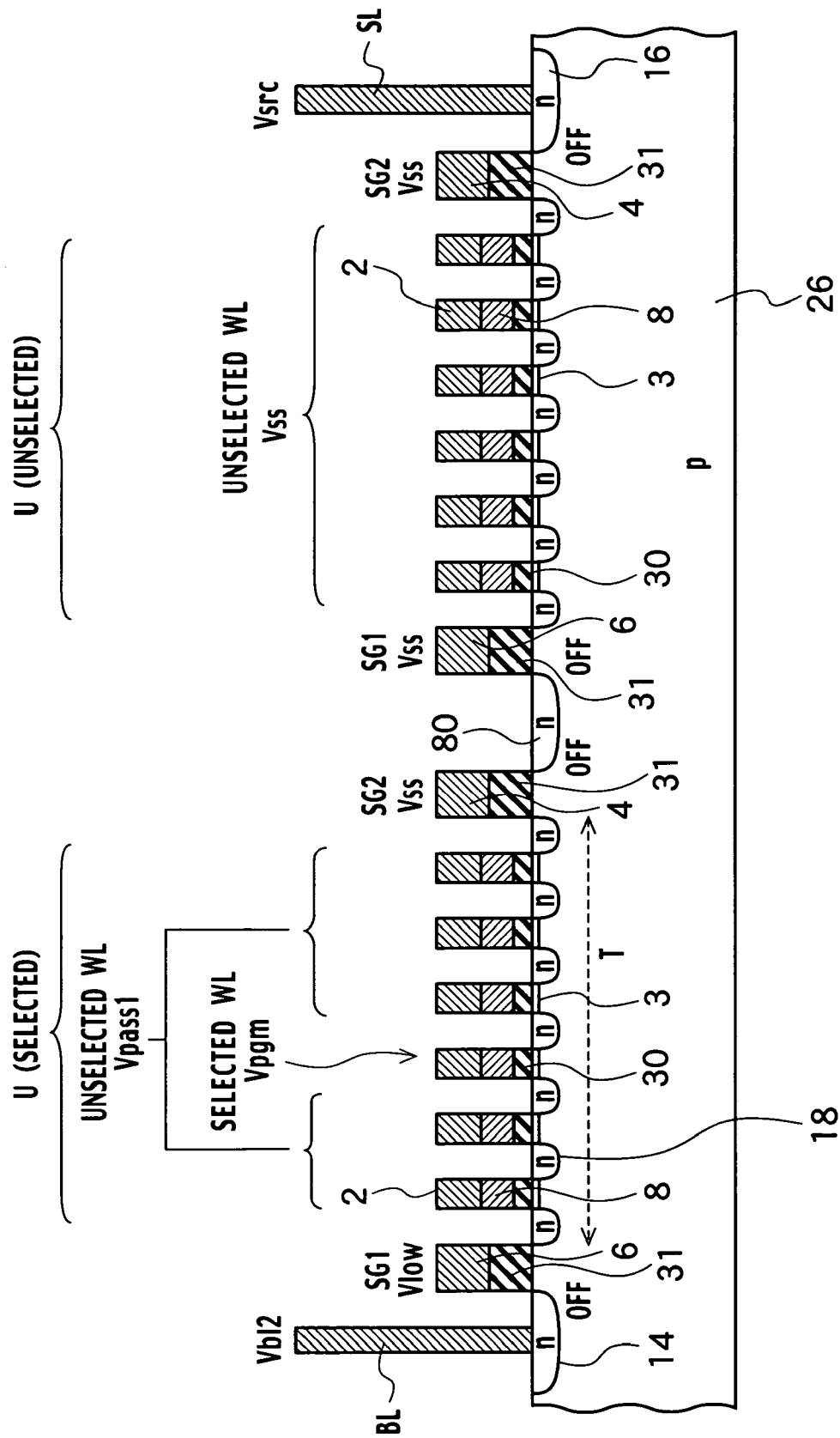
FIG. 24 is a schematic device cross-sectional diagram describing write-in operating voltages for unselected and selected memory cell units U, which share bit line contacts (CB) 64 and source line contacts (CS) 65, in nonvolatile semiconductor memory according to a fourth embodiment of the present invention.

With the nonvolatile semiconductor memory according to the second embodiment of the present invention, as shown in FIG. 20, while pulse voltages Vpgm and Vpass1 are applied to the word lines for the selected memory cell unit UB1 during write-in, Vpass2 is applied to all control gate (word) lines in the adjacent unselected memory cell unit UB2. However, in this case, a typical read disturb problem due to Vpass2 application may occur. Therefore, with the nonvolatile semiconductor memory according to a fourth embodiment of the present invention, in the case where unselected memory cell units U are located on the source side, as shown in FIG. 24, Vss is applied to all control gate lines (word lines) in the unselected memory cell unit U and the select gate lines for the select gate transistors SG1 and SG2. With the nonvolatile semiconductor memory according to the fourth embodiment of the present invention, as shown in FIG. 24, both the select gate transistor SG2 in the selected memory cell unit U and the select gate transistor SG1 in the unselected memory cell unit U can be cut off. A range of memory cell transistors denoted by region T in FIG. 24 indicates that it is a boosted region.

Fifth Embodiment

Figure 25:
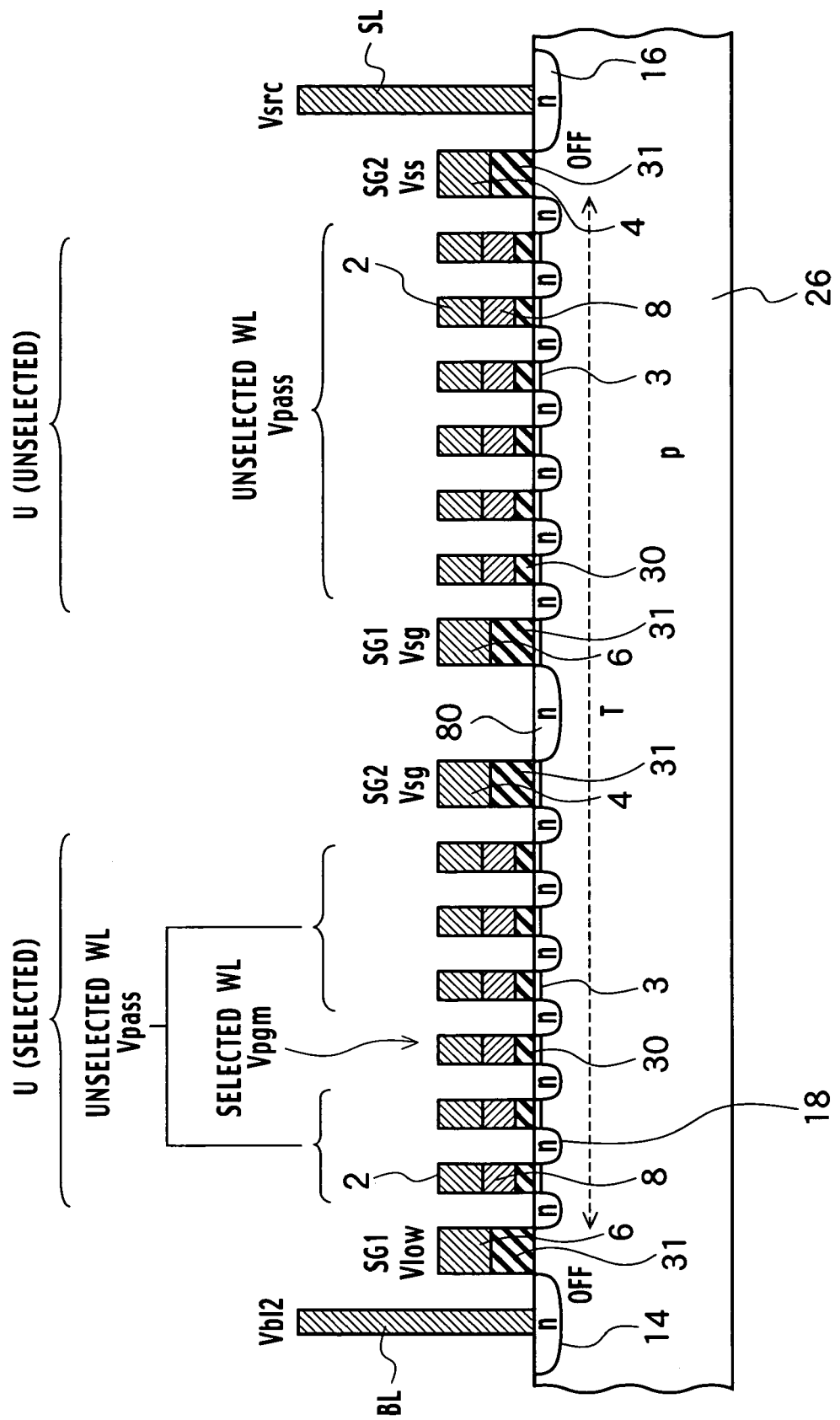
FIG. 25 is a schematic device cross-sectional diagram describing write-in operating voltages for unselected and selected memory cell units U, which share bit line contacts (CB) 64 and source line contacts (CS) 65, in nonvolatile semiconductor memory according to a fifth embodiment of the present invention.

With the nonvolatile semiconductor memory according to the second embodiment of the present invention, the boosted region T is limited within the selected memory cell unit UC1, as shown in FIG. 21. The nonvolatile semiconductor memory according to a fifth embodiment of the present invention, as shown in FIG. 25, is characteristic of boosting both the selected memory cell unit U and the unselected memory cell unit U by bringing the two select gate transistors SG2 and SG1 into conduction. Region T in FIG. 25 indicates that it is a boosted region Sixth Embodiment The nonvolatile semiconductor memory according to the fifth embodiment of the present invention, as shown in FIG. 26, is characteristic of the bit line contacts 64 and the source line contacts 65 on the active areas 60 being shared by three serially connected NAND memory cell units 82 through 84.

Figure 26:
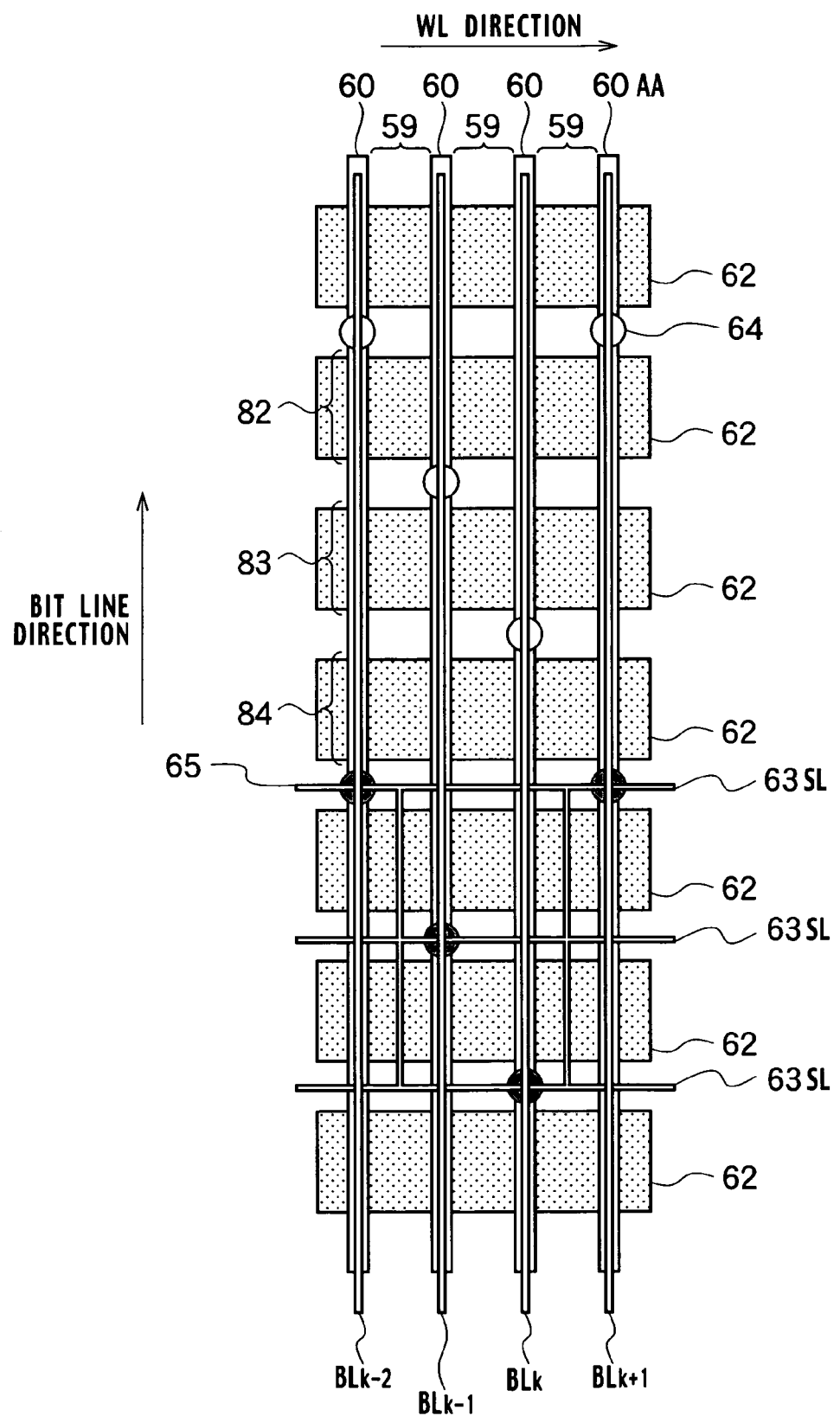
FIG. 26 is a schematic block diagram of an aerial pattern of nonvolatile semiconductor memory according to a sixth embodiment of the present invention.

A planar pattern of the nonvolatile semiconductor memory according to a sixth embodiment of the present invention includes, as shown in the schematic block diagram of FIG. 26, memory cell block regions 62, active areas 60, device isolation regions 59, bit line contacts 64 and source line contacts 65 arranged on the active areas 60, bit lines BL connected to the bit line contacts 64, and source lines 63 connected to the source line contacts 65 and extending along the word line WL length orthogonal to the bit lines BL.

Memory cell units represented by the NAND memory cell units 82 through 84 formed in the active areas 60, for example, are arranged in parallel along the word line WL length within the memory cell block regions 62, as shown in FIG. 14 or FIG. 17. Descriptions of the select gate lines SGU and SGL and the word lines WL are omitted.

Characteristics of the nonvolatile semiconductor memory according to the sixth embodiment of the present invention are that the bit line contacts 64 and the source line contacts 65 are arranged at a triple pitch along the word line WL length at staggered positions from each other. The sixth embodiment is further characteristic in that the memory cell unit arranged between a single bit line contact 64 and a single source line contact 65 is structured to extend over three memory cell block regions 62, as shown in FIG. 26.

As shown in FIG. 26, pairs of bit line contacts 64 and source line contacts 65, which sandwich three memory cell units 82 through 84, are arranged on every third active area 60 along the word line length. For example, in FIG. 26, assuming that 96 pages are allocated, the physical word lines WL in a single memory cell block region 62 may be allocated to pages 0 through 31, while physical word lines WL in another memory cell block region 62 may be allocated to pages 32 through 63, and physical word lines WL in another memory cell block region 62 may be allocated to pages 64 through 95.

Note that as is apparent from FIG. 26, a structure with the three memory cell units 82, 83 and 84 serially connected and sandwiched between a bit line contact 64 and a source line contact 65 have a replicated structure along the bit line length centered around the source line contacts 65. Alternatively, a replicated structure along the bit line BL length centered around the bit line contacts CB may be considered. The structure of the three serially connected memory cell units 82, 83 and 84 uses an arrangement of being positioned at a triple pitch along the word line length and replicated along the bit line length, thereby increasing the scale of integration, and provides sufficient spaces in order not to be short-circuited between the bit line contacts 64 or the source line contacts 65 and provides sufficient process margins in the arrangement of the bit line contacts 64 and the source line contacts 65.

Seventh Embodiment

Figure 27:
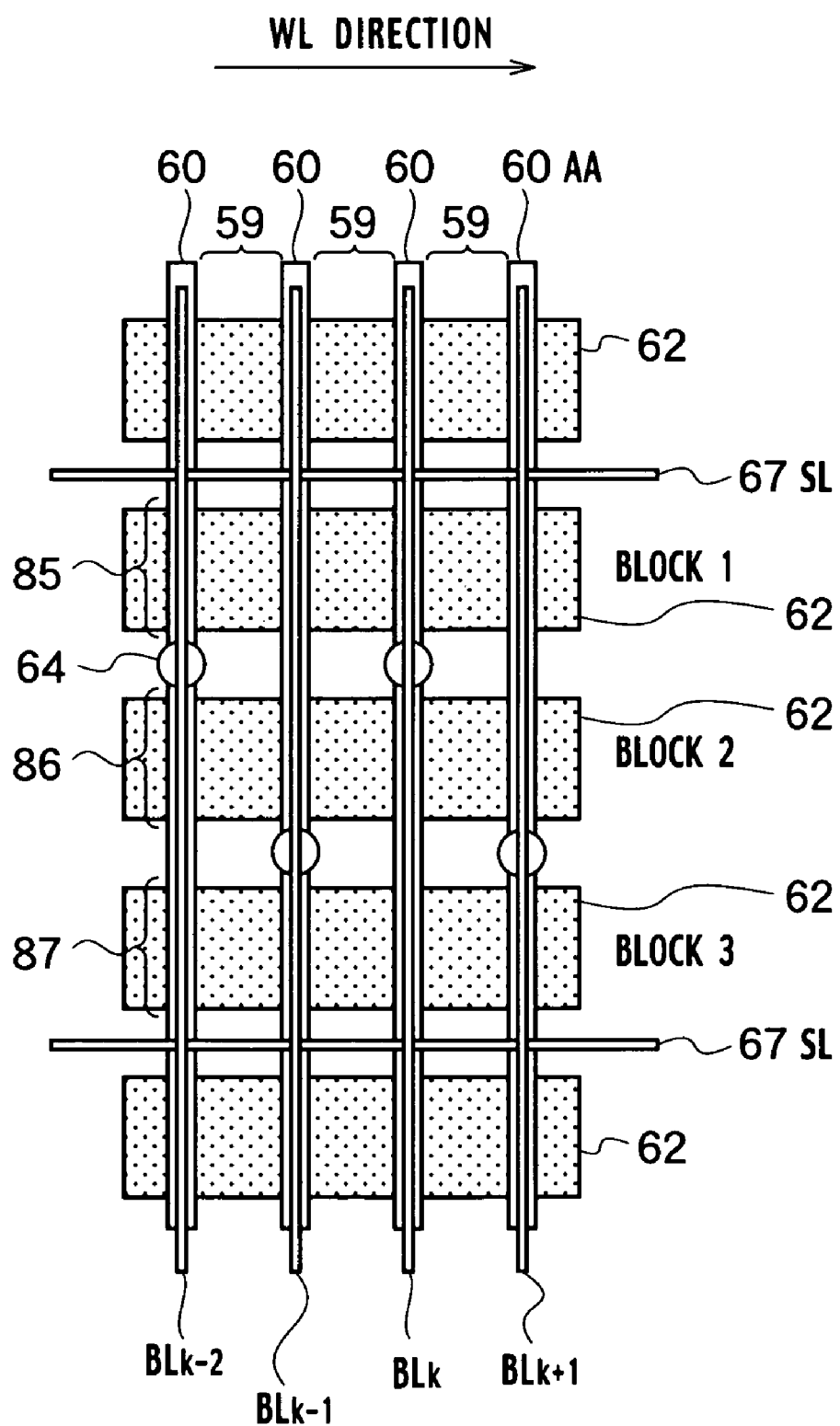
FIG. 27 is a schematic block diagram of an aerial pattern of nonvolatile semiconductor memory according to a seventh embodiment of the present invention.

A nonvolatile semiconductor memory according to a seventh embodiment of the present invention, as shown in FIG. 27, is characteristic of a structure with a bit line contact 64 arranged on an active area 60 at one end of a single NAND memory cell unit 85, and a bit line structure contact 64 on an active area 60 shared at one end of two NAND memory cell units 86 and 87. The memory cell units 86 and 87 extend in the column direction are alternately arranged in the row direction. As a result, the pitch in the row direction between bit line contacts 64 on adjacent active areas 60 is set to twice the pitch in the row direction between active areas.

The planar pattern of the nonvolatile semiconductor memory according to the seventh embodiment of the present invention includes, as shown in the schematic block diagram of FIG. 27, the memory cell block regions 62, the active areas 60, the device isolation regions 59, the bit line contacts 64 arranged on the active areas 60, bit lines $BL_{k-1}$, $BL_k$, and $BL_{k+1}$ connected to the bit line contacts 64, and source lines 67 extending along the word line WL length orthogonal to the bit lines $BL_{k-1}$, $BL_k$, and $BL_{k+1}$.

Memory cell units represented by the NAND memory cell units 85 and 86 formed in the active areas 60, for example, are arranged in parallel along the word line WL length within the memory cell block regions 62, as shown in FIG. 14 or FIG. 17. Description of select gate lines SGU and SGL and word lines WL is omitted.

A characteristic of the nonvolatile semiconductor memory according to the seventh embodiment of the present invention is that a structure with bit line contacts 64 arranged at a double pitch along the word line WL length as well as a bit line contact 64 arranged on an active area 60 at one end of a single NAND memory cell unit 85, and a structure of a bit line contact 64 on an active area 60 shared at one end of two NAND memory cell units 86 and 87 continuous in the column direction are alternately arranged in the row direction.

Furthermore, the source lines 67 are not structured to make contact with the source line contact region 16 via the source line contacts CS, but are formed of a salicide structure on the diffusion layer, embedded polysilicon or a stacked structure of polysilicon and silicide, or metallic electrodes. Such source lines 67 may each be made of a metallic interconnect having a 'strung CS' structure, which is formed by stringing the source line contacts CS, for example. Alternatively, source lines 67 may each be made of an 'interpoly film removed gate line (LI)', which is formed entirely as a metallic interconnect by forming a structure equivalent to the stacked gate structure given in FIG. 2 on source line contact regions 16 and removing the interpoly insulator film.

(Read-Out Mode)

Figure 28:
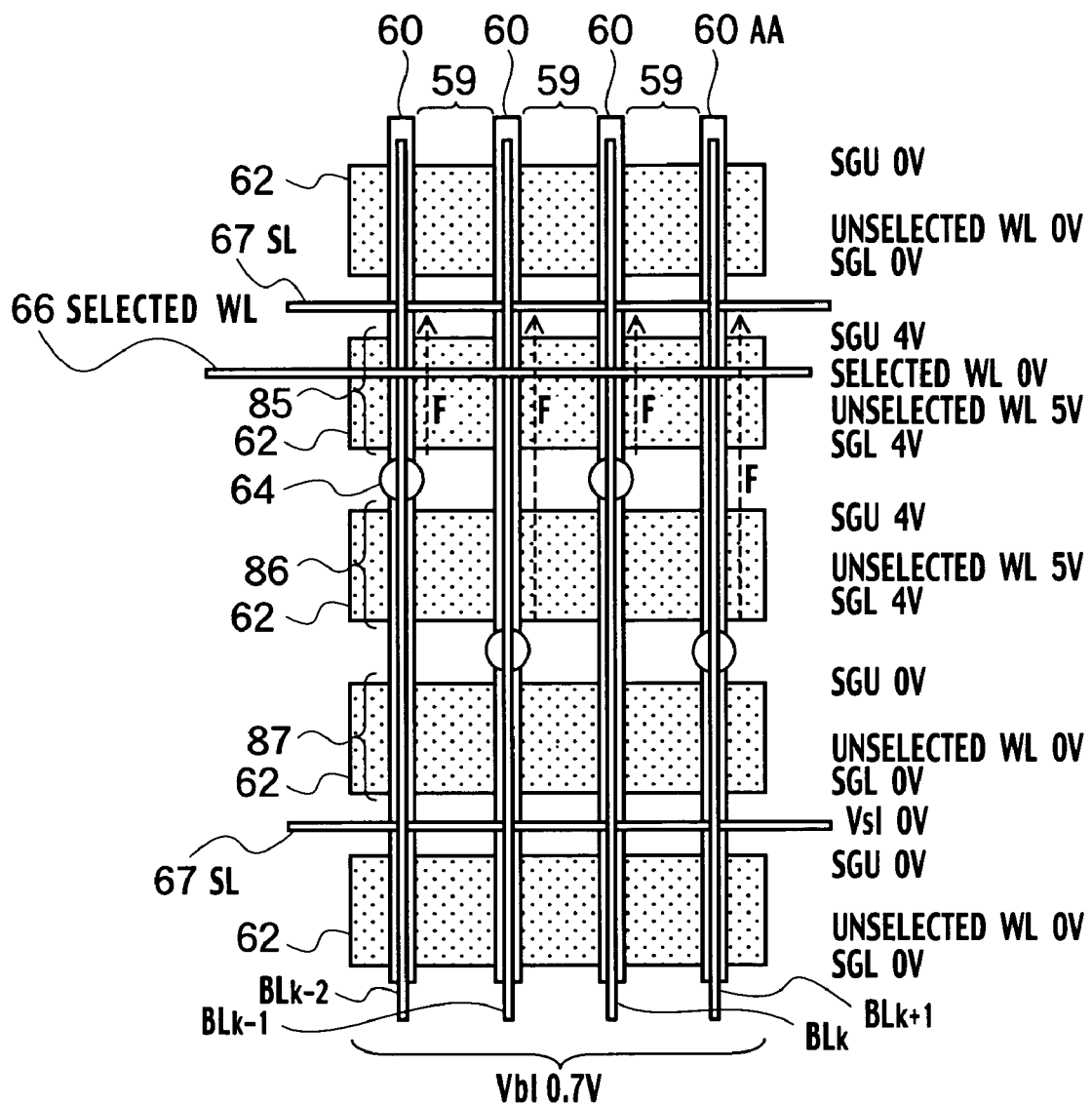
FIG. 28 is a schematic block diagram of an aerial pattern describing a read-out mode in the case of selecting Block 1 in FIG. 27.
Figure 29:
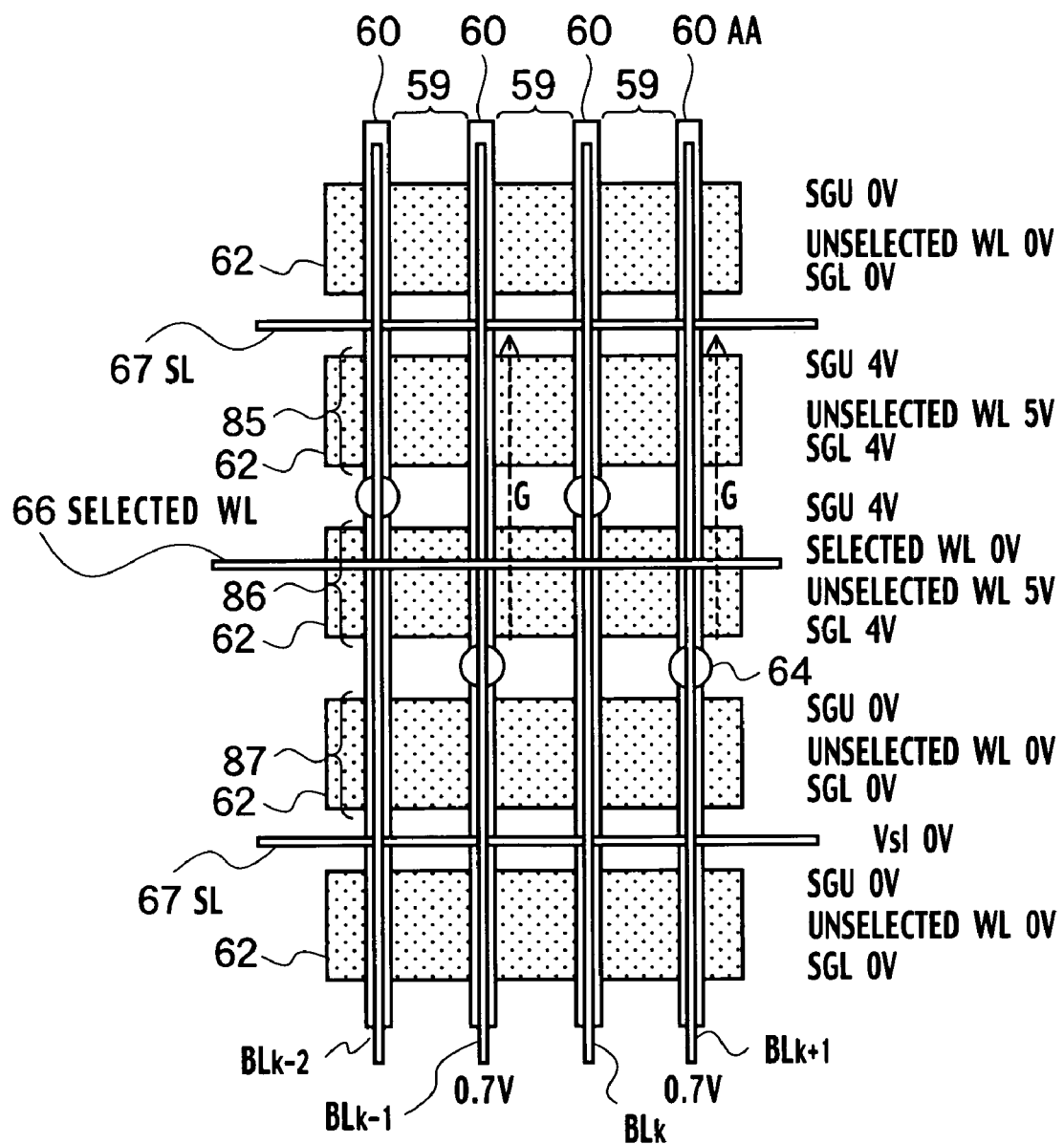
FIG. 29 is a schematic block diagram of an aerial pattern describing the read-out mode in the case of selecting Block 2 in FIG. 27.

With the nonvolatile semiconductor memory according to the seventh embodiment of the present invention, a read-out mode in the case of selecting Block 1 given in FIG. 27 is shown in FIG. 28, and a read-out mode in the case of selecting Block 2 is shown in FIG. 29. With the nonvolatile semiconductor memory according to the seventh embodiment of the present invention, as shown in FIG. 27, since a structure with a bit line contact 64 arranged on an active area 60 at one end of a single NAND memory cell unit 85, and a structure of a bit line contact 64 on an active area 60 shared at one end of two NAND memory cell units 86 and 87, continuous in the column direction, are alternately arranged in the row direction, when reading out Block 1 through Block 3, adjacent blocks must also be turned on. Furthermore, when reading out Block 2, the current flow direction is reverse depending on the position of the bit line contact 64.

In the case of reading out Block 1, as shown in FIG. 28, Block 1 and Block 2 must be turned on. Four volts, for example, is applied to the select gate lines SGU and SGL in Block 1, 0V is applied to a selected word line 66, and 5V is applied to the unselected word lines WL. Four volts is also applied to the select gate lines SGU and SGL in Block 2, and 5V is also applied to the unselected word lines WL. Due to application of such voltage pulses, read-out currents flow between the bit line contacts 64 and the source lines 67 in the direction indicated by arrows F.

During read-out, the voltage Vsl to be applied to the source lines 67 is 0V, and the voltage Vbl to be applied to bit lines $BL_{k-2}$, $BL_{k-1}$, $BL_k$, and $BL_{k+1}$ is approximately 0.7V, for example.

In the case of reading out Block 2, as shown in FIG. 29, Block 1 and Block 2 or Block 3 and Block 2 must be turned on. Four volts for example, is applied to the select gate lines SGU and SGL in Block 2, 0V is applied to a selected word line 66, and 5V is applied to the unselected word lines WL. Four volts is also applied to the select gate lines SGU and SGL in Block 1, and 5V is also applied to the unselected word lines WL. Due to application of such voltage pulses, read-out currents flow between the bit line contacts 64 and the source lines 67 in the direction indicated by arrows G.

During read-out, the voltage Vsl to be applied to the source lines 67 is 0V, and the voltage Vbl to be applied to bit lines $BL_{k-1}$ and $BL_{k+1}$ through which the read-out currents flow is approximately 0.7V, for example. When reading out adjacent bit lines $BL_{k-2}$ and $BL_k$, since Block 2 and Block 3 are selected, the read-out currents flow in the reverse direction to G.

(Write-in Mode)

Figure 30:
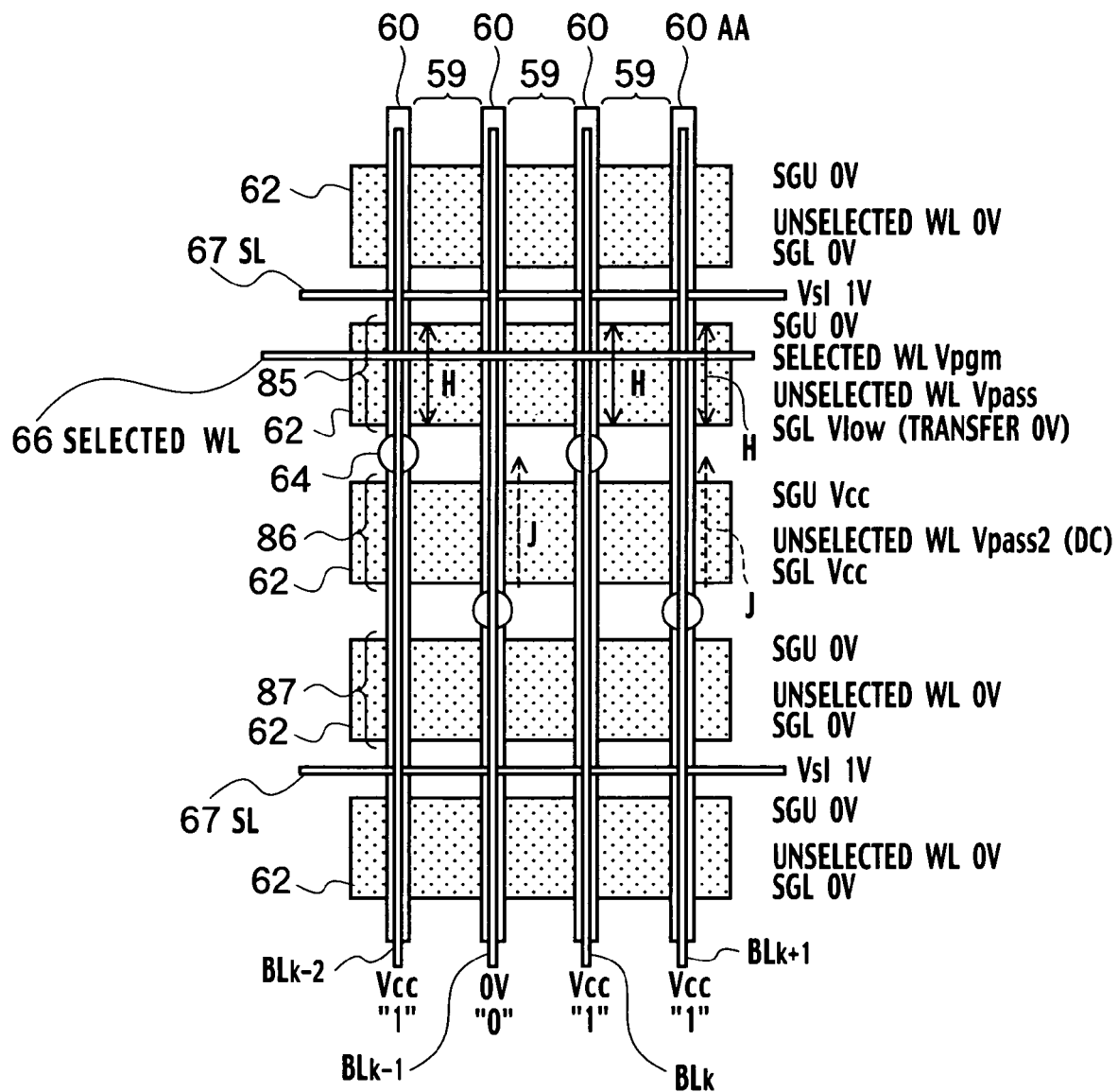
FIG. 30 is a schematic block diagram of an aerial pattern describing a write-in mode in the case of selecting Block 1 in FIG. 27.
Figure 31:
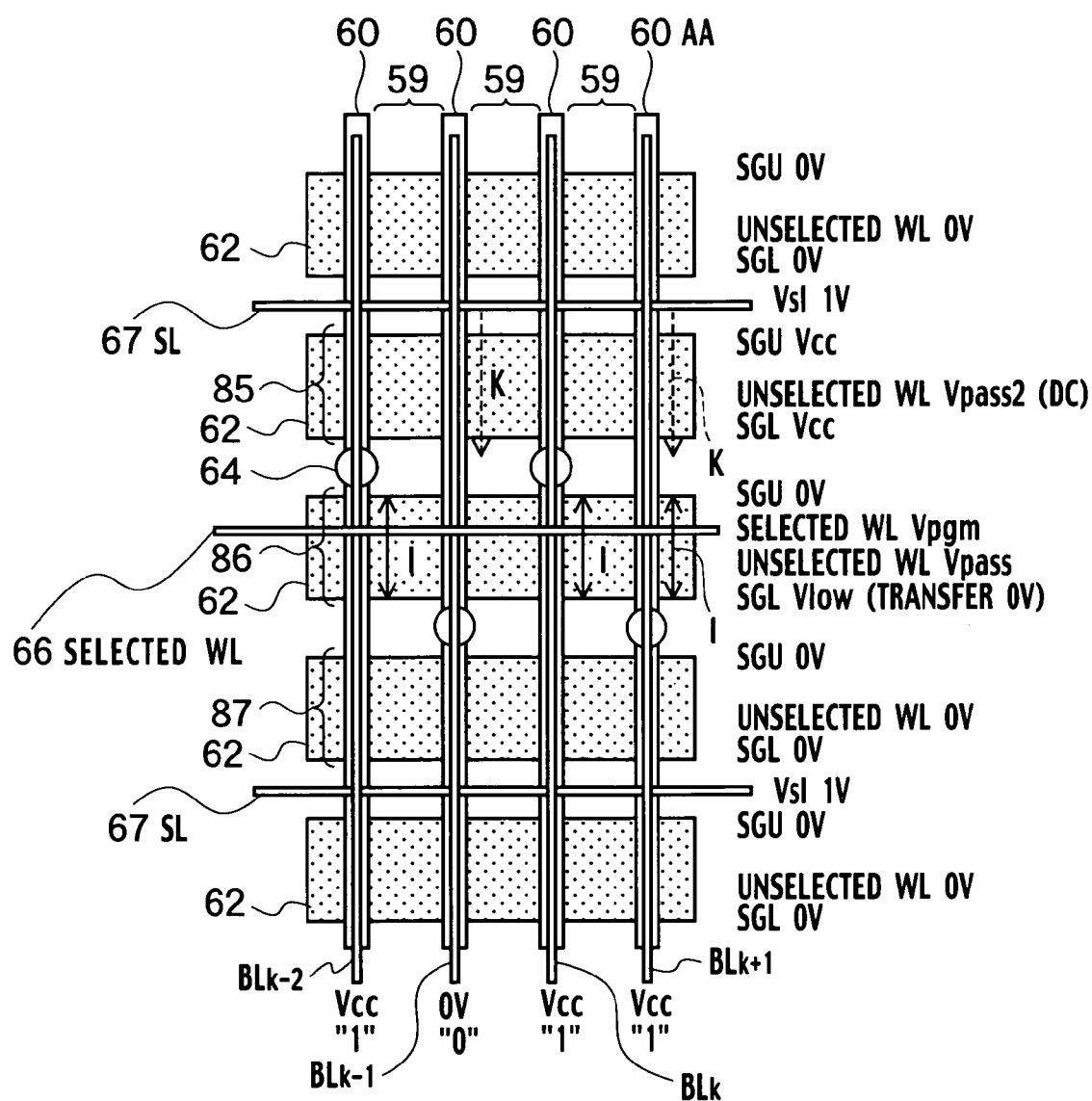
FIG. 31 is a schematic block diagram of an aerial pattern describing a write-in mode in the case of selecting Block 2 in FIG. 27.

With the nonvolatile semiconductor memory according to the seventh embodiment of the present invention, a write-in mode in the case of selecting Block 1 given in FIG. 27 is shown in FIG. 30, and a write-in mode in the case of selecting Block 2 is shown in FIG. 31.

Executing a self-boost operation across a plurality of memory cell block regions 62 may be considered; however, it is anticipated that a load is added to the inter-unit diffusion layer 80 between the select gate transistors SG1 and SG2 positioned at the junction of adjacent memory cell blocks 62, and erroneous write-in occurs.

Therefore, instead of an operation of transferring the initial potential from the bit lines $BL_{k-2}$, $BL_{k-1}$, $BL_k$, and $BL_{k+1}$, a method of cutting off the select gate transistors SG1 and SG2 on both sides of the NAND memory cell unit, so as to boost by only the capacitance coupling, is an easier method.

In this case, the voltage applied to the source line side select gate line SGL is set to a sufficiently low voltage Vlow (>0V) allowing transfer of 0V. The voltage applied to the bit line side select gate line SGL is set to 0V. The method of cutting off the two select gate lines SGU and SGL, respectively, provides favorable write-in characteristics without erroneous write-in characteristics, such as the read disturb characteristics.

(Write-in Mode Modified Example 1)

In order to cut off the select gate transistors SG1 and SG2, a back bias voltage is transferred to the inter-unit diffusion layer 80 via adjacent memory cell block regions 62. At this time, pass voltages (DC) are applied to the word lines WL of the adjacent memory cell block regions 62.

(Write-in Mode Modified Example 2)

The above pass voltage is applied in pulses so as to charge the inter-unit diffusion layer 80 between the select gate transistors SG1 and SG2. Accordingly, read disturb characteristics may be improved more than in the case of Modified Example 1.

(Write-in Mode Modified Example 3)

Alternatively, there is a cut-off method of setting all the select gate lines SGU and SGL and the word lines WL for the unselected memory cell block regions 62 adjacent to the selected memory cell block regions 62 to 0V.

The select gate transistor SG1, which is connected to the bit line side select gate line SGU to receive a sufficiently low voltage Vlow (>0V) allowing transfer of 0V, is insufficiently cut off and leakage current can easily flow; however, the inter-unit diffusion layer 80 automatically cuts off when it is being charged. However, write-in characteristics may degrade since electrons in the inter-unit diffusion layer 80 enter the channel regions of the select gate transistors SG1 and SG2.

In the case of selecting and writing in Block 1, as shown in FIG. 30, Block 1 and Block 2 must be turned on. Zero voltage is applied to the select gate line SGU in Block 1, and a sufficiently low voltage Vlow(>0V) allowing transfer of 0V is applied to SGL. Vpgm is applied to the selected word line 66 in Block 1, and Vpass is applied to the unselected word lines WL.

Vcc, for example, is applied to the select gate lines SGU and SGL in Block 2, and Vpass2 (DC) is applied to the unselected word lines WL. Due to application of such voltage pulses, write-in currents flow between the bit line contacts 64 and the source lines 67 in the direction indicated by arrows J.

During write-in, voltage Vsl to be applied to the source lines 67 is 1V, and voltage Vbl to be applied to bit lines BL is, for example, Vcc for the bit lines $BL_{k-2}$, $BL_k$, and $BL_{k+1}$ during '1' write-in, and 0V for the bit line $BL_{k-1}$ during '0' write-in. The range denoted by region H in FIG. 30 indicates that it is a boosted region.

In the case of selecting and writing in Block 2, as shown in FIG. 31, either Block 1 and Block 2 or Block 3 and Block 2 must be turned on. Zero voltage is applied to the select gate line SGU in Block 2, and a sufficiently low voltage Vlow (>0V) allowing transfer of 0V is applied to select gate lines SGL.

Vpgm is applied to the selected word line 66 in Block 2, and Vpass is applied to the unselected word lines WL. Vcc, for example, is applied to the select gate lines SGU and SGL in Block 1, and Vpass2 (DC) is applied to the unselected word lines WL. Due to application of such voltage pulses, write-in currents flow between the bit line contacts 64 and the source lines 67 in the direction indicated by arrows K.

During write-in, voltage Vsl to be applied to the source lines 67 is 1V, and voltage Vbl to be applied to bit lines BL is, for example, Vcc for the bit lines $BL_{k-2}$, $BL_k$, and $BL_{k+1}$ during '1' write-in, and 0V for the bit line $BL_{k-1}$ during '0' write-in.

The range denoted by region I in FIG. 31 indicates that it is a boosted region. When performing a write-in operation using adjacent bit lines BL, since Block 2 and Block 3 are selected, the write-in currents flow in the reverse direction to K.

Eighth Embodiment

Figure 32:
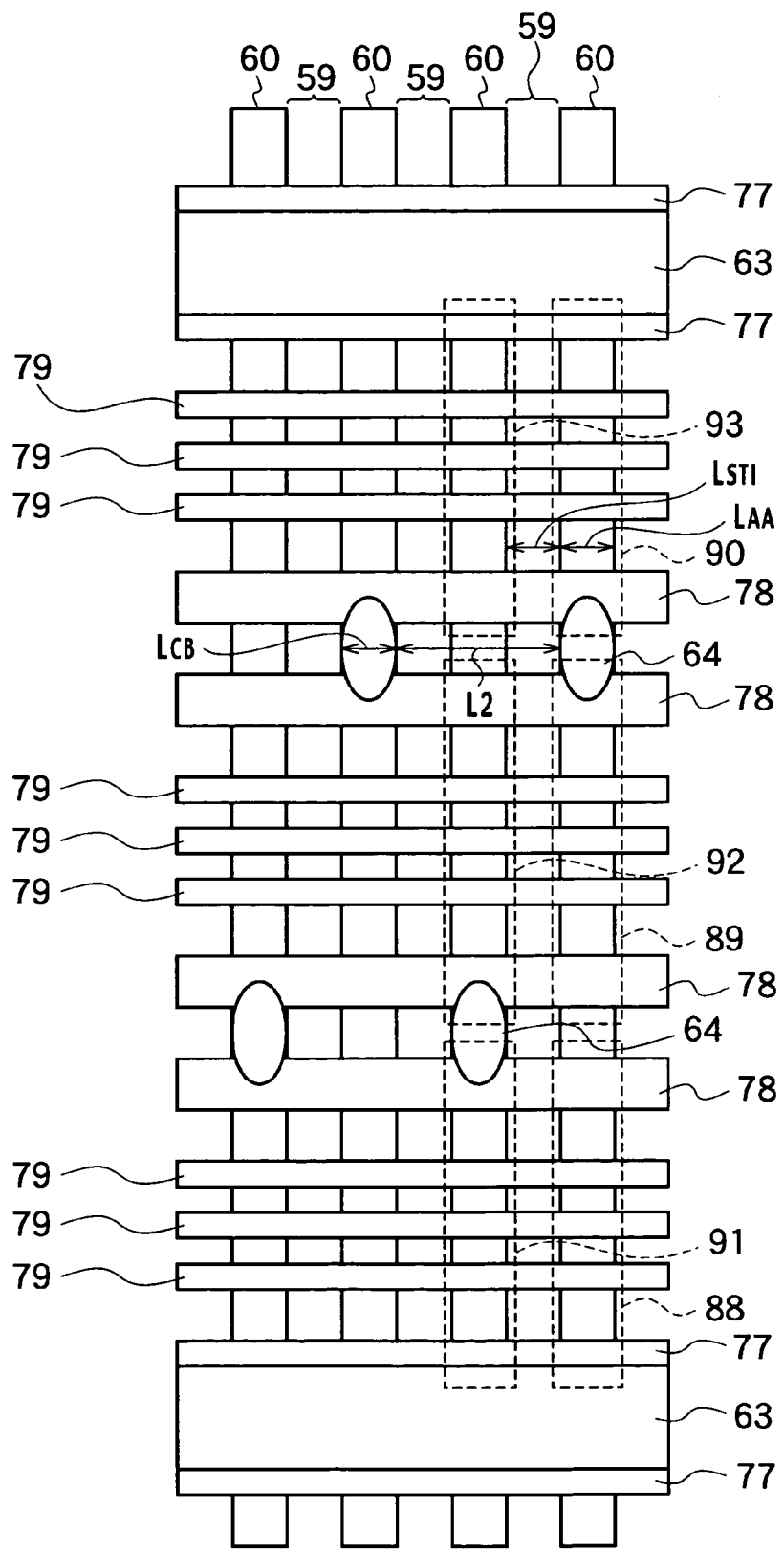
FIG. 32 is a schematic aerial pattern diagram of nonvolatile semiconductor memory according to an eighth embodiment of the present invention.

A planar pattern of a nonvolatile semiconductor memory according to an eighth embodiment of the present invention, as shown in FIG. 32, is configured with active areas 60, device isolation regions 59, select gate lines 77 and 78, source lines 63, word lines 79, and bit line contacts 64. In FIG. 32, reference numerals 88 through 93 enclosed by dotted lines indicate patterns each corresponding to a single NAND memory cell unit.

By arranging the bit line contacts 64 alternately with the active areas 60 in a staggered lattice shape, sufficient spaces in order not to short-circuited between the adjacent bit line contacts 64 and sufficient process margins in the arrangement of the bit line contacts 64 between the adjacent bit line contacts 64 may be provided. An example of three word lines 79 is given in FIG. 32, but naturally there may be eight, sixteen or thirty-two lines.

Figure 40:
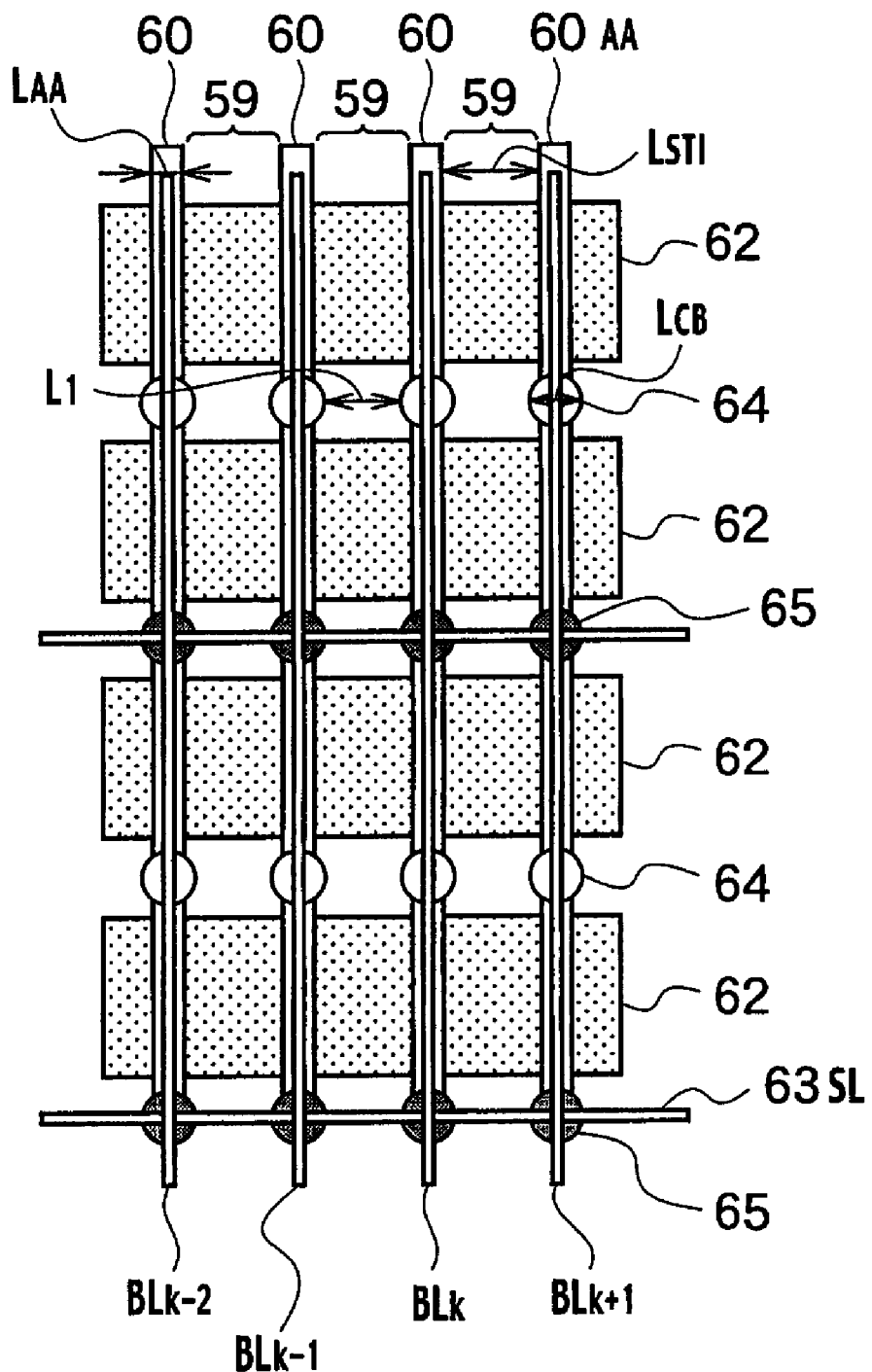
FIG. 40 is a schematic diagram of conventional nonvolatile semiconductor memory including bit line contacts CB aligned in a horizontal row.
Figure 41:
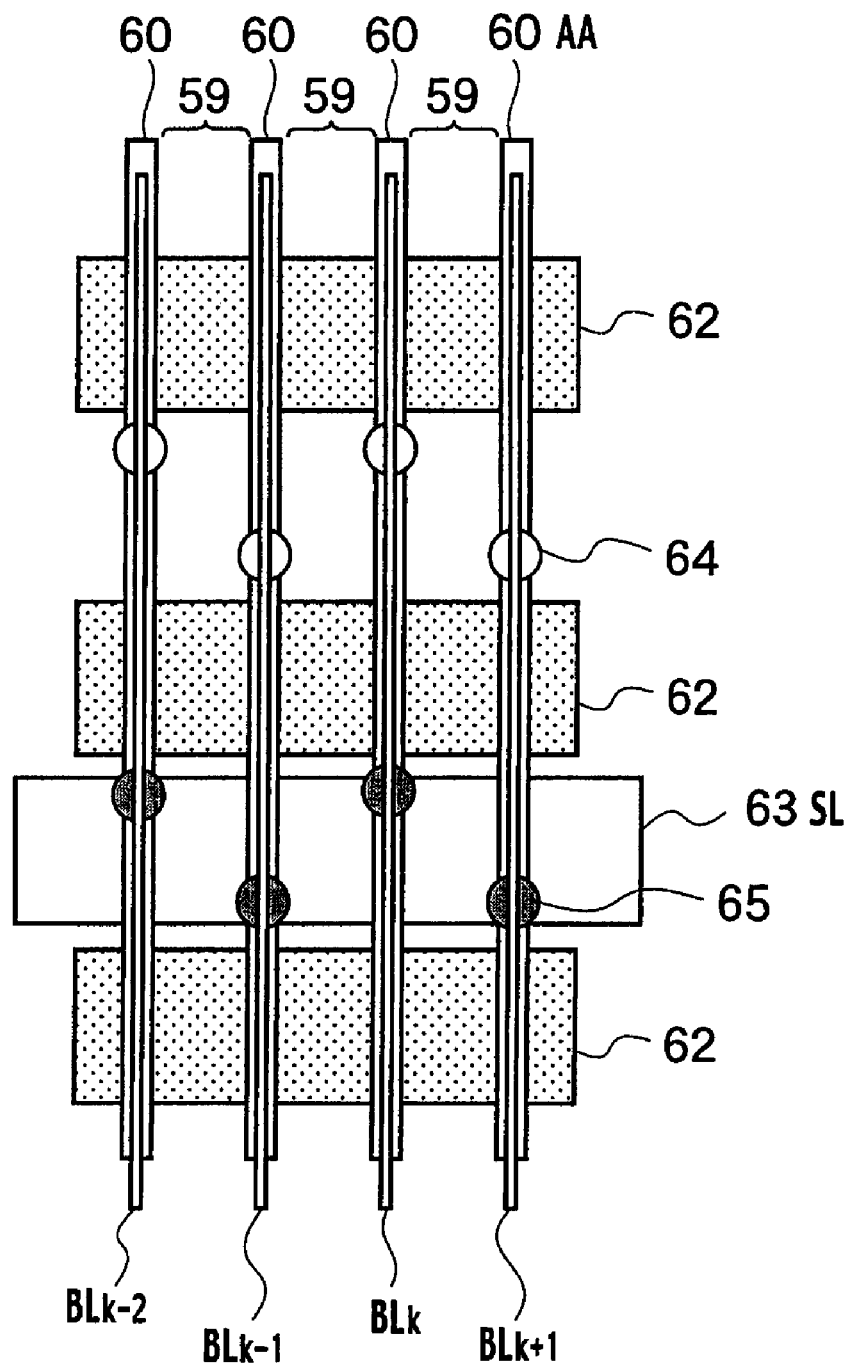
FIG. 41 is a schematic diagram of conventional nonvolatile semiconductor memory including staggered bit line contacts CB.

Here, given that $L_{STI}$ denotes the width of each device isolation region 59, $L_{AA}$ denotes the width of each active area 60, and $L_{CB}$ denotes the diameter of each bit line contact 64 in FIG. 32 as defined with FIG. 40, and the distance $L_2$ between the bit line contacts 64 can be represented by $$L_2 = 2 \times (L_{AA} + L_{STI}) - L_{CB} \quad (4)$$

As shown in FIG. 32, by alternately arranging the bit line contacts 64 in a staggered lattice shape, the CB-CB distance ($L_2$) can be increased and CB contact resistance can be maintained. Along with miniaturization, the distance between bit line contacts 64 also decreases; however, the CB-CB distance ($L_2$) may be increased if the same design rules apply by arranging the bit line contacts 64 in a staggered lattice shape.

Figure 33:
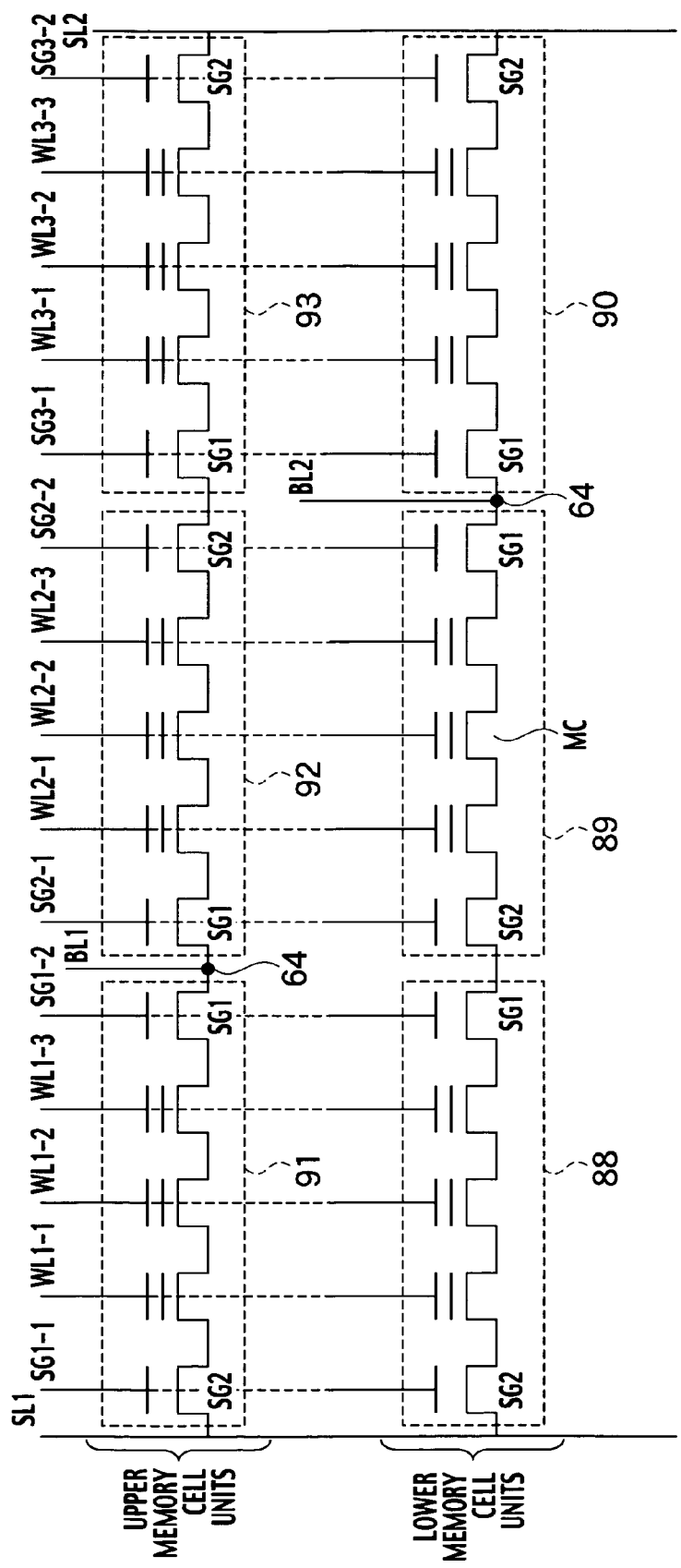
FIG. 33 is a schematic circuit diagram of the nonvolatile semiconductor memory according to the eighth embodiment of the present invention.

A circuitry corresponding to the planar pattern shown in FIG. 32, as shown in FIG. 33, is configured with source lines SL1 and SL2, bit lines BL1 and BL2, select gate lines SG1-1, SG1-2, SG2-1, SG2-2, SG3-1, and SG3-2, select gate transistors SG1 and SG2, and a memory cell transistor MC, which has a stacked gate structure with the select gate transistors SG1 and SG2 serially connected.

FIG. 33 corresponds to two columns of the active areas 60 in FIG. 32, and the regions enclosed by dotted lines correspond to the circuitry of respective NAND memory cell units 88 through 93. Three serially connected memory cell transistors MC are shown in the example of FIG. 32, but may be eight, sixteen, thirty-two or sixty-four. The NAND memory cell units 88 through 93 are configured by the select gate transistors SG1 and SG2 and the memory cell transistor serially connected therebetween.

In the example of FIG. 33, three NAND memory cell units 88 through 90 and 91 through 93 are respectively serially connected between the source lines SL1 and SL2. The three NAND memory cell units 88 through 90, as shown in FIG. 33, have a bit line contact 64 arranged between select gate transistors SG1 that are between the NAND memory cell unit 90 and the two serially connected NAND memory cell units 88 and 89, and are connected to the bit line BL2 via the bit line contact 64.

Similarly, the NAND memory cell units 91 through 93 have a bit line contact 64 arranged between select gate transistors SG1 that are between the NAND memory cell unit 91 and the two serially connected NAND memory cell units 92 and 93, and are connected to the bit line BL1 via the bit line contact 64.

Two serially connected NAND memory cell units 88 and 89 or 92 and 93 are connected via an inter-unit diffusion layer 80. As is apparent from FIGS. 32 and 33, the structures of two serially connected NAND memory cell units and a single NAND memory cell unit are in a staggered configuration for every corresponding active area 60. The direction in which the active areas 60 extend is the direction in which the bit lines BL extend. Due to a single bit line BL being connected to a single active area 60 via a bit line contact 64, the structures of two serially connected NAND memory cell units and a single NAND memory cell unit are in a staggered configuration for every corresponding active area 60.

(Operation Mode)

An erase operation mode is shown in FIG. 34; a write-in operation mode is shown in FIG. 35; '1' write-in operation mode of memory cell transistors connected to the same word line WL when in '0' write-in mode is shown in FIG. 36; and a read-out mode is shown in FIGS. 37A through 37D. The operating voltages for respective operation modes are given in FIGS. 34 through 37. Notations of 'upper memory cell units' and 'lower memory cell units' in FIGS. 34 through 37 correspond to an upper and a lower section of the circuit diagram of FIG. 33.

(A) Erase Operation Mode

With the circuitry shown in FIG. 33, during the erase operation in the upper section configured by the NAND memory cell units 91 through 93, as shown in FIG. 34, the source lines SL1 and SL2, the select gate lines SG1-1, SG1-2, SG2-1, SG2-2, SG3-1, and SG3-2, and the bit line BL1 are all opened, 0V is applied to all word lines WL1-1, WL1-2, WL1-3, WL2-1, WL2-2, WL2-3, WL3-1, WL3-2, and WL3-3, and an erase voltage Verase is applied to the p-well or semiconductor substrate (26). Applying voltages in this manner removes electrons from the floating gates 8 of the memory cell transistors, thereby providing an erase operation. The value of erase voltage Verase may be approximately 17V, for example.

(B) Write-in Operation Mode ('0' Write-in Mode)

The operating voltages for '0' write-in are given in FIG. 35. In addition, operating voltages for '1' write-in of memory cell transistors connected to the same word line WL at that time are given in FIG. 36.

During '0' write-in, as is apparent from FIG. 35, Vpgm is applied to a write-in target memory cell transistor. With the circuitry shown in FIG. 33, during the '0' write-in operation to the memory cell transistors connected to the word line WL1-1 in the upper section configured by the NAND memory cell units 91 through 93, as shown in FIG. 35, Vpgm is applied to the word line WL1-1 and Vpass is applied to WL1-2 and WL1-3, Vcc is applied to the select gate line SG1-2, and 0V is applied to all of the source lines SL1 and SL2, the select gate lines SG1-1, SG2-1, SG2-2, SG3-1, and SG3-2, the bit line BL1, and the word lines WL2-1, WL2-2, WL2-3, WL3-1, WL3-2, and WL3-3.

Applying voltages in this manner permits of '0' write-in to the memory cell transistors connected to the word line WL1-1. The value of write-in voltage Vpgm may be approximately 20V, for example. The value of intermediate voltage Vpass may be approximately 10V, for example, and the value of power-supply voltage Vcc may be approximately 1.5V to 3.3V, for example. Even with a '0' write-in operation to the memory cell transistors connected to the other word lines WL1-2 through WL3-3, the voltage to be applied to respective lines should be set as shown in FIG. 35.

('1' Write-in Mode)

With the circuitry shown in FIG. 33, during the '0' write-in operation to the memory cell transistors connected to the word line WL1-1 in the upper section configured by the NAND memory cell units 91 through 93, since write-in voltage Vpgm is applied to the same word line WL1-1, protection of memory cell transistors for the erroneous write in is necessary when the memory cell transistors connected to the word line WL1-1 in the lower section configured by the NAND memory cell units 88 through 90 have a stored value of '1'. Write-in at that time is called '1' write-in.

During the '1' write-in operation to the memory cell transistors connected to the word line WL1-1, as shown in FIG. 36, Vpgm is applied to the word line WL1-1 and Vpass is applied to WL1-2 and WL1-3, Vcc is applied to the select gate line SG1-2, and 0V is applied to all of the source lines SL1 and SL2, the select gate lines SG1-1, SG2-1, SG2-2, SG3-1, and SG3-2, the bit line BL2, and the word lines WL2-1, WL2-2, WL2-3, WL3-1, WL3-2, and WL3-3.

Alternatively, during the '1' write-in operation to the memory cell transistors connected to the word line WL3-1, Vpgm is applied to the word line WL3-1 and Vpass is applied to WL2-1 through WL2-3, WL3-2 and WL3-3, Vcc is applied to the select gate line SG2-1, SG2-2 and SG3-1 and 0V is applied to all of the source lines SL1 and SL2, the select gate lines SG1-1, SG1-2, and SG3-2, and the word lines WL1-1 through WL1-3.

Applying voltages in this manner permits '1' write-in to the memory cell transistors connected to the word line WL3-1. The value of write-in voltage Vpgm may be approximately 20V, for example. The value of intermediate voltage Vpass may be approximately 10V, for example, and the value of power-supply voltage Vcc may be approximately 1.5V to 3.3V, for example. Even with a '1' write-in operation to the memory cell transistors connected to the other word lines WL1-2 through WL2-3, WL3-2 and WL3-3, the voltage to be applied to respective lines should be set as shown in FIG. 36.

(C) Read-out Operation Mode

With the circuitry shown in FIG. 33, a read-out operation in the upper section configured by the NAND memory cell units 91 through 93 is described.

('1' Read-out Mode)

In the case where '1' has been written into the memory cell transistors connected to the word line WL1-1, 0V is applied to the word line WL1-1 to which a read-out target memory cell transistor is connected, as shown in FIG. 37A; however, this memory cell transistor is in a cut-off state, and thus a current does not flow even if read-out voltage Vread is applied to the other memory cell transistors, i.e., turning on the other memory cell transistors.

(i) In the case where the read-out target memory cell transistor is on the left side of the bit line BL1, as shown in FIG. 37A, when applying 0V to the word line WL1-1 and reading out data '1' from the memory cell transistor connected to the word line WL1-1, Vread is applied to the word lines WL1-2 and WL1-3, Vcc is applied to the select gate lines SG1-1 and SG1-2, Vbl is applied to the bit line BL1, and 0V is applied to all of the source lines SL1 and SL2, the select gate lines SG2-1 through SG3-2, and the word lines WL2-1 through WL3-3. Note that the value of the read-out voltage Vread may be approximately 4.5V, for example, and the value of Vbl may be approximately 0.7V, for example.

(ii) In the case where the read-out target memory cell transistor is on the right side of the bit line BL1, as shown in FIG. 37B, when applying 0V to the word line WL2-2 and reading out data '1' from the memory cell transistor connected to the word line WL2-2, Vread is applied to the word lines WL2-1, WL2-3 and WL3-1 through WL3-3, Vcc is applied to the select gate lines SG2-1, SG3-1 and SG3-2, Vbl is applied to the bit line BL1, and 0V is applied to all of the source lines SL1 and SL2, the select gate lines SG1-1 and SG1-2, and the word lines WL1-1 through WL1-3.

('0' Read-Out Mode)

In the case where '0' has been written into the memory cell transistors connected to the word line WL1-1, 0V is applied to the word line WL1-1 to which a read-out target memory cell transistor is connected, as shown in FIG. 37C; however, this memory cell transistor is in a cut-off state, and thus a current does not flow even if Vread is applied to the other memory cell transistors, i.e., turning on the other memory cell transistors.

(iii) In the case where the read-out target memory cell transistor is on the left side of the bit line BL1, as shown in FIG. 37C, when applying 0V to the word line WL1-1 and reading out data '0' from the memory cell transistor connected to the word line WL1-1, Vread is applied to the word lines WL1-2 and WL1-3, Vcc is applied to the select gate lines SG1-1 and SG1-2, Vbl is applied to the bit line BL1, and 0V is applied to all of the source lines SL1 and SL2, the select gate lines SG2-1 through SG3-2, and the word lines WL2-1 through WL3-3.

(iv) In the case where the read-out target memory cell transistor is on the right side of the bit line BL1, as shown in FIG. 37D, when applying 0V to the word line WL2-2 and reading out data '0' from the memory cell transistor connected to the word line WL2-2, Vread is applied to the word lines WL2-1, WL2-3 and WL3-1 through WL3-3, Vcc is applied to the select gate lines SG2-1, SG3-1 and SG3-2, Vbl is applied to the bit line BL1, and 0V is applied to all of the source lines SL1 and SL2, the select gate lines SG1-1, SG1-2 and SG2-1, and the word lines WL1-1 through WL1-3.

Ninth Embodiment

Figure 38:
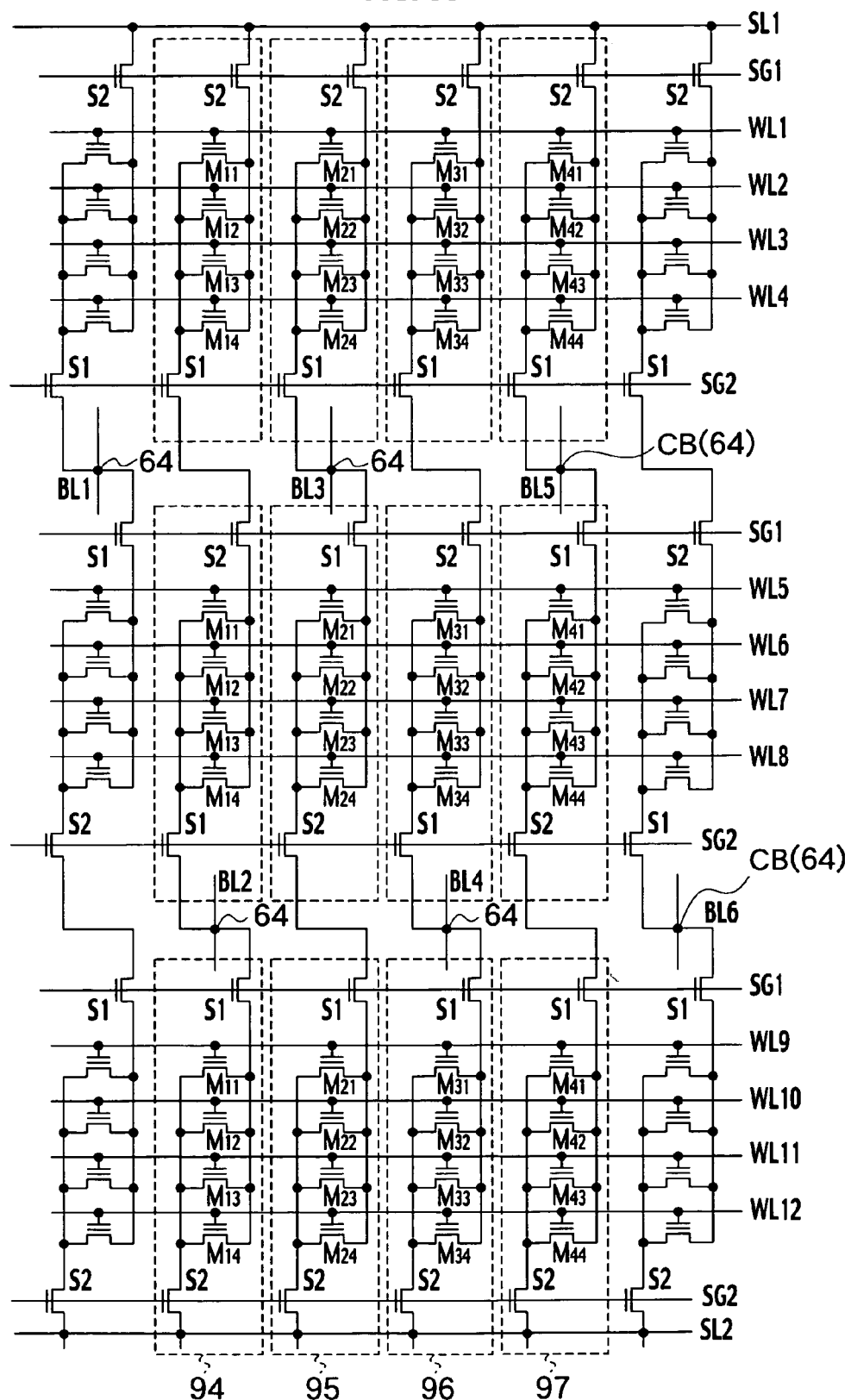
FIG. 38 is a schematic circuit diagram of nonvolatile semiconductor memory according to a ninth embodiment of the present invention, which configures the memory cell unit with an AND memory cell unit structure.

A nonvolatile semiconductor memory according to a ninth embodiment of the present invention is characteristic in that a memory cell unit is configured as an AND memory cell unit, and as shown in FIG. 38, is configured with memory cell transistors M11 through M44, select gate transistors S1 and S2, bit lines BL1 through BL6, source lines SL1 and SL2, word lines WL1 through WL12, AND memory cell units 94 through 97, and bit line contacts 64. The basic structure of the memory cell transistors M11 through M44 has a stacked structure as described with the second embodiment. It is evident that the same circuitry and arrangement of bit line contacts 64 can be implemented even if a sidewall control gate structure as described in the first embodiment is adopted.

The circuitry of FIG. 38 uses the same circuitry and arrangement of bit line contacts 64 as in FIG. 33, which represents the nonvolatile semiconductor memory according to the eighth embodiment of the present invention. In other words, while the NAND memory cell units 88 through 93 have the memory cell unit basic structure in the example of FIG. 33, AND memory cell units 94 through 97 have the memory cell unit basic structure in the example of FIG. 38. Bit line contacts are arranged in a staggered lattice shape, the same as in FIG. 33.

In the AND memory cell unit, the source and the drain of a memory cell transistor are respectively connected in common, and since it is formed symmetrical with respect to the source and the drain, the same circuit may be implemented even if the source and the drain are interchanged. Furthermore, regarding the select gate transistors S1 and S2, for simplicity, the select gate transistor on the side connected to the bit line contact 64 is referred to as S1, and the select gate transistor on the side connected to the source line SL is referred to as S2. Since substantially the same transistor is arranged even if the select gate transistors S1 and S2 are interchanged, an AND memory cell unit with the same circuitry is provided.

Accordingly, with the nonvolatile semiconductor memory having the AND memory cell units 94 through 97 shown in FIG. 38 as a basic structure, simply changing the arrangement of bit line contacts 64 and also changing the interconnects between each memory cell unit with the arrangement of AND memory cell units allows very easy implementation of an arrangement with sufficient spaces and process margins in order not to be short-circuited between bit line contacts CB. Note that as a modified example of the ninth embodiment, an imaginary ground (AND) memory cell unit may be used as the memory cell unit basic structure.

(Application Example)

Figure 39:
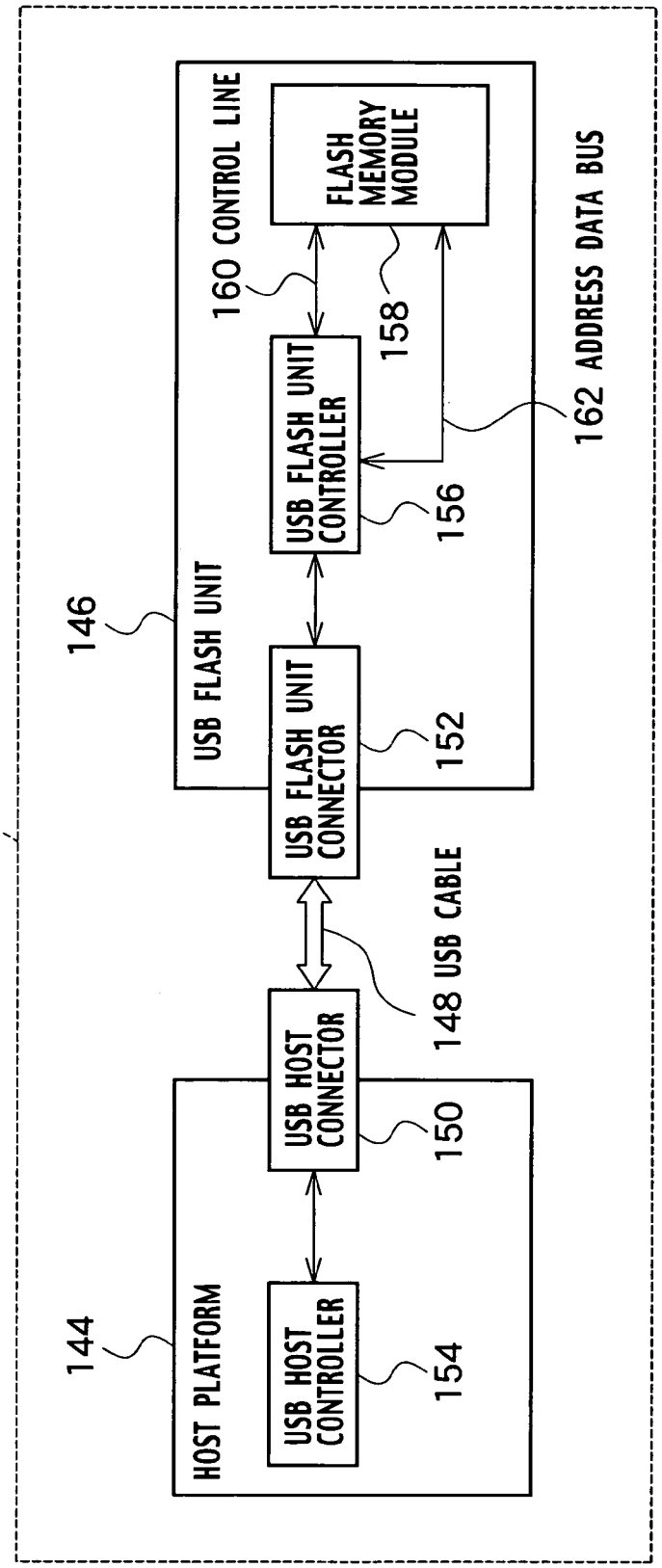
FIG. 39 is a schematic diagram of principal elements of a flash memory and system implemented by the nonvolatile semiconductor memory according to the embodiments of the present invention.

FIG. 39 shows an application example of the nonvolatile semiconductor memory according to the first through the ninth embodiment of the present invention. FIG. 39 is a schematic diagram of principal elements of a flash memory and system implemented by the nonvolatile semiconductor memory according to the embodiments of the present invention. As shown in the drawing, a flash memory system 142 is configured with a host platform 144 and a universal serial bus (USB) flash unit 146.

The host platform 144 is connected to the USB flash unit 146 according to the nonvolatile semiconductor memory of embodiments of the present invention via a USB cable 148. The host platform 144 is connected to the USB cable 148 via a USB host connector 150, and the USB flash unit 146 is connected to the USB cable 148 via a USB flash unit connector 152. The host platform 144 has a USB host controller 154, which controls packet transmission through a USB bus.

The USB flash unit 146 includes a USB flash unit controller 156, which controls other elements in the USB flash unit 146 as well as controls the interface to the USB bus of the USB flash unit 146; the USB flash unit connector 152; and at least one flash memory module 158 configured with the nonvolatile semiconductor memory according to the first through the ninth embodiment of the present invention.

When the USB flash unit 146 is connected to the host platform 144, standard USB enumeration processing begins. In this processing, the host platform 144 recognizes the USB flash unit 146, selects the mode for transmission therewith, and performs reception/transmission of data from/to the USB flash unit 146 via a FIFO buffer called an end point, which stores transfer data. The host platform 144 recognizes changes in the physical and electrical states such as removal/attachment of the USB flash unit 146 via another end point, and receives any existing to-be-received packets.

The host platform 144 requests services from the USB flash unit 146 by sending a request packet to the USB host controller 154. The USB host controller 154 transmits the packet to the USB cable 148. If the USB flash unit 146 is a unit including the end point that has received this request packet, this request will be accepted by the USB flash unit controller 156.

Next, the USB flash unit controller 156 performs various operations such as read-out, write-in or erasure of data from or to the flash memory module 158. In addition, it supports basic USB functions such as acquiring a USB address and the like. The USB flash unit controller 156 controls the flash memory module 158 via either a control line 160, which is used to control output from the flash memory module 158, or, for example, other various signals such as the inverted signal of CE described as /CE, a read-out signal or a write-in signal. Furthermore, the flash memory module 158 is also connected to the USB flash unit controller 156 via an address data bus 162. The address data bus 162 transfers a read-out, a write-in or an erasure command for the flash memory module 158, and the address and data for the flash memory module 158.

In order to notify the host platform 144 of the results and status of the various operations requested by the host platform 144, the USB flash unit 146 transmits a status packet using a status end point (end point 0). In this processing, the host platform 144 checks (polls) for the existence of a status packet, and the USB flash unit 146 returns an empty packet or a status packet when there is no packet for a new status message.

As described thusfar, various functions of the USB flash unit 146 may be implemented. Directly connecting the connectors is also possible by omitting the USB cable 148 described above.

Other Embodiments

The present invention is described according to embodiments, however, it should not be perceived that descriptions and drawings forming a part of this disclosure are intended to limit the spirit and scope of the present invention. Various alternative embodiments, working examples, and operational techniques will become apparent from this disclosure for those skills in the art. Accordingly, the technical scope of the present invention is determined only by specified features of the invention according to the following claims that can be regarded appropriate from the above-mentioned descriptions.

Various modifications will become possible for those skilled in the art after receiving the teachings of the present disclosure without departing from the scope thereof.

In this manner, the present invention naturally includes various embodiments not described herein. Accordingly, the technical range of the present invention is determined only by the following claims that can be regarded appropriate from the above-mentioned descriptions.

What is claimed is:

1. A nonvolatile semiconductor memory comprising:
a bit line;
a source line being perpendicular to the bit line;
a memory cell unit array including a first memory cell unit and a second memory cell unit connected to the first memory cell unit in series along to the bit line, the first memory cell unit including first and second select gate transistors and a plurality of memory cell transistors arranged between the first and second select gate transistors in series, the second memory cell unit including third and fourth select gate transistors and a plurality of memory cell transistors arranged between the third and fourth select gate transistors in series, the second select gate transistor of the first memory cell unit connected to the third select gate transistor of the second memory cell unit via an inter-unit diffusion layer, a length of the first memory cell unit being equal to a length of the second memory cell unit;
a bit line contact connecting the first select gate transistor of the first memory cell and the bit line; and
a source line contact connecting the fourth select gate transistor of the second memory cell unit and the source line;
wherein, the memory cell unit array is located having a shift length equal to the integral multiple length of the memory cell units aligned in a bit line direction so as to be staggered from each other as compared with adjacent memory cell unit arrays aligned in a source line direction.

2. The nonvolatile semiconductor memory of claim 1, wherein each memory cell transistor includes a charge storage portion and a control gate applying a voltage to the charge storage portion, when selecting one of the first and the second memory cell units a single memory cell transistor from the selected memory cell unit so as to perform read-out, a positive voltage is applied to control gates of memory cell transistors in unselected memory cell units other than the selected memory cell unit.

3. The nonvolatile semiconductor memory of claim 1, wherein each memory cell transistor includes a charge storage portion and a control gate applying a voltage to the charge storage portion, when selecting one of the first and the second memory cell units and a single memory cell transistor from the selected memory cell unit so as to perform write-in, a positive voltage is applied to control gates of memory cell transistors in unselected memory cell units other than the selected memory cell unit.

* * * * *